US011384167B2

(12) United States Patent
Bonardi et al.

(10) Patent No.: US 11,384,167 B2
(45) Date of Patent: Jul. 12, 2022

(54) THERMAL AMPLIFICATION OF FREE RADICAL POLYMERIZATION INDUCED BY RED TO NEAR-INFRARED IRRADIATION

(71) Applicants: Universite de Haute-Alsace, Mulhouse (FR); Universite d'Aix-Marseille, Marseilles (FR); Centre National de la Recherche Scientifique, Paris (FR)

(72) Inventors: Aude-Heloise Bonardi, Mulhouse (FR); Jacques Lalevee, Mulhouse (FR); Fabrice Morlet-Savary, Pfastatt (FR); Celine Dietlin, Mulhouse (FR); Didier Gigmes, Allauch (FR); Frederic Dumur, La Ferte-Bernard (FR)

(73) Assignees: UNIVERSITE DE HAUTE-ALSACE, Mulhouse (FR); UNIVERSITE D'AIX-MARSEILLE, Marseilles (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 16/770,342

(22) PCT Filed: Dec. 20, 2018

(86) PCT No.: PCT/EP2018/086412

§ 371 (c)(1),
(2) Date: Jun. 5, 2020

(87) PCT Pub. No.: WO2019/122249

PCT Pub. Date: Jun. 27, 2019

(65) Prior Publication Data

US 2020/0362061 A1 Nov. 19, 2020

(30) Foreign Application Priority Data

Dec. 21, 2017 (EP) .................................... 17306861
Jul. 6, 2018 (EP) .................................... 18182205

(51) Int. Cl.

| | |
|---|---|
| ***C08F 2/46*** | (2006.01) |
| ***C08F 222/10*** | (2006.01) |
| ***C08F 222/20*** | (2006.01) |
| ***C08F 222/22*** | (2006.01) |
| ***C08K 3/30*** | (2006.01) |
| ***C08K 5/14*** | (2006.01) |
| ***C08K 5/315*** | (2006.01) |
| ***C08K 5/5353*** | (2006.01) |
| ***C09B 23/04*** | (2006.01) |
| ***C09B 47/04*** | (2006.01) |
| ***C09B 57/00*** | (2006.01) |
| ***C09B 57/10*** | (2006.01) |
| *B41M 5/46* | (2006.01) |

(52) U.S. Cl.

CPC .......... *C08F 2/46* (2013.01); *C08F 222/1065* (2020.02); *C08F 222/20* (2013.01); *C08F 222/22* (2013.01); *C08K 3/30* (2013.01); *C08K 5/14* (2013.01); *C08K 5/315* (2013.01); *C08K 5/5353* (2013.01); *C09B 23/04* (2013.01); *C09B 47/04* (2013.01); *C09B 57/007* (2013.01); *C09B 57/10* (2013.01); *B41M 5/465* (2013.01); *C08F 2400/00* (2013.01); *C08K 2003/3054* (2013.01)

(58) Field of Classification Search

CPC ....... G03F 7/029; C09B 57/10; C09B 57/007; C09B 47/04; C09B 23/04; C08K 2003/3054; C08K 5/5353; C08K 5/315; C08K 5/14; C08K 3/30; C08F 2400/00; C08F 222/20; C08F 222/22; C08F 222/1065; C08F 2/46; B41M 5/465

See application file for complete search history.

(56) References Cited

U.S. PATENT DOCUMENTS

| | | | | |
|---|---|---|---|---|
| 4,959,297 A | 9/1990 | Palazzotto | | |
| 7,175,949 B1 * | 2/2007 | Tao | G03F 7/029 | 430/17 |
| 2003/0124455 A1 | 7/2003 | Nakamura et al. | | |
| 2010/0126386 A1 * | 5/2010 | Haremza | G03F 7/029 | 106/287.21 |
| 2011/0003123 A1 * | 1/2011 | Simpson | G03F 7/029 | 428/195.1 |
| 2015/0192852 A1 * | 7/2015 | Sato | B41C 1/1008 | 430/281.1 |
| 2015/0360498 A1 * | 12/2015 | Mizuno | C09B 23/086 | 252/600 |

FOREIGN PATENT DOCUMENTS

| | | |
|---|---|---|
| EP | 0008127 A1 | 2/1980 |
| EP | 0249201 A2 | 12/1987 |

(Continued)

OTHER PUBLICATIONS

Bondari et al. Photoinduced Thermal Polymerization Reactions. Macromolecules 2018, 51, 21, 8808-8820. (Year: 2018).*

Ajayaghosh, A.; "Chemistry of Squaraine-Derived Materials: Near-IR Dyes, Low Bond Gap Systems, and Cation Sensors"; Accounts of Chemical Research, vol. 38, Issue No. 6; 2005; pp. 449-459.

Bonardi, A.H. et al.; "High-Performance Near-Infrared (NIR) Photoinitiating Systems Operating under Low Light Intensity and in the Presence of Oxygen,"; Macromolecules, vol. 51, Issue No. 4; 2018; pp. 1314-1324.

Bures, F; "Fundamental aspects of property tuning in push-pull molecules"; RSC Advances, vol. 4; 2014; pp. 58826-58851.

Dahlen, M.A.; "The Phthalocyanines: A New Class of Synthetic Pigments and Dyes"; Industrial Engineering Chemistry, vol. 31, Issue No. 7; 1939; 839-847; DOI: 10.1021/ie50355a012.

(Continued)

*Primary Examiner* — Sanza L. McClendon

(74) *Attorney, Agent, or Firm* — Cantor Colburn LLP

(57) ABSTRACT

The present invention relates to compositions thermally curable on demand by red to near infrared irradiation, method of using same for thermal amplification of free radical polymerizations, and articles obtained by such method. The invention also relates to the use of a heat-generating dye in association with a thermal initiator for controlling the onset of thermal free radical polymerization.

23 Claims, 19 Drawing Sheets

(56) References Cited

FOREIGN PATENT DOCUMENTS

| | | | |
|---|---|---|---|
| EP | 0276501 | A2 | 8/1988 |
| EP | 0290133 | A2 | 11/1988 |
| EP | 0968459 | A1 | 1/2000 |
| EP | 0974078 | A1 | 1/2000 |
| EP | 1162078 | A2 | 12/2001 |
| EP | 1582346 | A2 | 10/2005 |
| EP | 1668038 | A1 | 6/2006 |
| EP | 2098367 | A1 | 9/2009 |
| JP | 2002062642 | A | 2/2002 |
| WO | 9422968 | A1 | 10/1994 |
| WO | 9712945 | A1 | 4/1997 |
| WO | 20100652472 | A2 | 6/2010 |
| WO | 2011129923 | A2 | 10/2011 |

OTHER PUBLICATIONS

Dumur, F. et al.; "Cationic Iridium Complex for the Design of Soft Salt-Based Phosphorescent OLEDs and Color-Tunable Light-Emitting Electrochemical Cells"; Organic Electronics, vol. 12; 2011; pp. 1683-1694; DOI: 10.1016/j.orgel.2011.06.014.

Garra, P. et al.; "Monitoring photopolymerization reactions through chemical imaging: A unique tool for the real-time follow-up of thick samples, 3D printing, and composites"; Journal of Polymer Science Part A: Polymer Chemistry, vol. 56, Issue No. 8; 2018; pp. 889-899.

Garreau De Bonneval, B. et al.; "Neutral d8 Metal Bis-Dithiolene Complexes: Synthesis, Electronic Properties and Applications"; Coordination Chemistry Reviews, vol. 254, Issue No. 13-14; 2010; pp. 1457-1467; DOI: 10.1016/i.ccr/2010.02.019.

International Search Report and Written Opinion for International Application PCT/EP2018/086410; International Filing Date: Dec. 20, 2018; dated Jan. 31, 2019; 10 pages.

International Search Report and Written Opinion for International Application PCT/EP2018/086412; International Filing Date: Dec. 20, 2018; dated Feb. 27, 2019; 16 pages.

Karatsu, T. et al.; "Evaluation of Sensitizing Ability of Barbiturate-Functionalized Non-Ionic Cyanine Dyes; Application for Photoinduced Radical Generation System Initiated by near IR Light"; J. Photochem. Photobio. A: Chemistry, vol. 170, Issue 2; 2005; pp. 123-129.

Lalevee, J. et al.; "A Novel Photopolymerization Initiating System Based on an Iridium Complex Photocatalyst"; Macromolecular Rapid Communications, vol. 32, Issue No. 12; 2011; pp. 917-920; DOI: 10.1002/marc.201100098.

Lalevee, J. et al.; "Efficient Dual Radical/Cationic Photoinitiator under Visible Light: A New Concept"; Polymer Chemistry, vol. 2, Issue No. 9; 2011; pp. 1986-1991; DOI: 10 1039/c1py00140j.

Lessard, B. et al.; "The Position and Frequency of Fluorine Atoms Changes the Electron Donor/Acceptor Properties of Fluorophenoxy Silicon Phthalocyanines within Organic Photovoltaic Devices"; J. Mat. Chem. A, vol. 3, Issue 48; 2015; pp. 24512-24524; DOI: 10.1039/C5TA07173A.

Marshall, K.L. et al.; "Transition Metal Dithiolene Near-IR Dyes and Their Applications in Liquid Crystal Devices," Molecular Crystals and Liquid Crystals, vol. 454, Issue No. 1; 2006; pp. 47-79 (449-481).

Melville, O.A. et al.; "Phthalocyanine-Based Organic Thin-Film Transistors: A Review of Recent Advances"; ACS Applied Materials & Interfaces, vol. 7, Issue No. 24; 2015; pp. 13105-13118; DOI: 10.1021/acsami.5b01718.

Miao, Q. et al.; "Syntheses and Characterization of Several Nickel Bis(dithiolene) Complexes with Strong and Broad Near-IR Absorption"; Inorganica Chemica Acta, vol. 376, Issue No. 1; 2011; pp. 619-627; DOI: 10.1016/j.ica.2011.07.046.

Schmitz, C. et al.; "NIR-Sensitized Photoinitiated Radical Polymerization and Proton Generation with Cyanines and LED Arrays"; Progress in Organic Coatings, vol. 100; 2016; pp. 32-46; DOI:10.1016/j.porgcoat.2016.02.022.

Tian, Y. et al.; "Structural Diversity and Properties of a Series of Dinuclear and Mononuclear copper(II) and copper(I) Carboxylato Complexes"; New Journal of Chemistry, vol. 26, Issue No. 10; 2002; pp. 1468-1473; DOI: 10.1039/B203334H.

Torre, G. de la et al.; "Old Dyes, New Materials: Putting Color in Nanotechnology"; Chemical Communications, vol. 2007, Issue No. 20; 2007; pp. 2000-2015; DOI: 10.1039/B614234F.

Treibs, A. et al.; "Difluorobyl-Komplexe von Di- und Tripyrrylmethenen"; Liebigs Annalen der Chemie , vol. 718, Issue No. 1; 1968; pp. 208-223; BODIPY Dye Series Archived Feb. 26, 2008 at the Wayback Machine.

* cited by examiner

S2425

Chemical Formula: $C_{32}H_{36}N_2O_2S_2$
Molecular Weight: 544,7720

SQ-1

Chemical Formula: $C_{22}H_{25}NO_3$
Molecular Weight: 351,4460

SQ-2

Chemical Formula: $C_{38}H_{48}N_2O_2$
Molecular Weight: 564,8140

SQ-3

Chemical Formula: $C_{29}H_{14}N_2O$
Molecular Weight: 406,44

PP-1

Chemical Formula: $C_{17}H_{19}N_3O_3$
Molecular Weight: 313,3570

PP-2

BODIPY-1

Chemical Formula: $C_{25}H_{15}BF_2N_2$
Molecular Weight: 392,2158

Ni 1

Ni 2

Chlorophyllin sodium copper salt (ClSC)

Cu3

Cu4

Manganese(II) Phthalocyanine
(Mn(II)-Ph)

THERMAL AMPLIFICATION OF FREE RADICAL POLYMERIZATION INDUCED BY RED TO NEAR-INFRARED IRRADIATION

CROSS REFERENCE TO RELATED APPLICATIONS

This application is a National Stage application of PCT/EP2018/086412, filed Dec. 20, 2018, which claims the benefit of European Application Nos. 17306861.0, filed Dec. 21, 2017 and European Application No. 18182205.7, filed Jul. 6, 2018, all of which are incorporated by reference in their entirety herein.

PRIORITY

This PCT Application claims priority to European Patent Application no EP 17306861.0 filed on 21 Dec. 2017 and European Patent Application no EP 18182205.7 filed on 6 Jul. 2018; the entire contents of each of which are hereby incorporated by reference.

FIELD OF THE INVENTION

The present invention relates to compositions thermally curable on demand by red to near infrared irradiation, method of using same for thermal amplification of free radical polymerizations, and articles obtained by such method. The invention also relates to the use of a heat-generating dye in association with a thermal initiator for controlling the onset of thermal free radical polymerization.

In what follows, the numbers between brackets ([ ]) refer to the List of References provided at the end of the document.

BACKGROUND OF THE INVENTION

Free radical polymerization (FRP) reactions are widely used for both academic and industrial production of polymers. They may be effected by different methods, notably through thermal initiation or photo initiation. Currently, a vast amount of commercial polymers are produced via thermal radical polymerization, with applications ranging from packaging, rubbers, adhesives, household plastics, electronics and more. This technique involves certain disadvantages, notably the need for outside energy/thermal source and poor temperature control at high conversion (thermal runaway). Light-induced free radical polymerization (or photopolymerization) is relatively more recent: it was developed in the late 1960s and immediately found wide application in areas such as coatings, printing industry, dentistry, medicine, paints and more. Most photopolymerization reactions are processed under radiation in the ultraviolet (UV) range of wavelengths. However, these short wavelengths are well-known to be noxious both for eyes and skin of the operator. Additional drawbacks of UV-induced or visible light-induced photopolymerization include limitations in the thickness of sample to be polymerized (polymerization of thin layers only), use of a high quantity if photoinitiator system, and/or necessity to conduct the photopolymerization under inert conditions ($CO_2$, $N_2$, . . . ). The development of systems which polymerize at longer wavelength has therefore drawn much interest and research efforts. However, the use of greater wavelengths results in less energetic photons and therefore, the reaction is much more difficult to perform efficiently.

Therefore, there remains a need for the development of new systems and methods for more efficient thermal FRP, which overcome the aforementioned disadvantages of thermal- and photo-initiated FRP, and that allow FRP reactions to be efficiently carried out in depth through thick samples/materials.

BRIEF DESCRIPTION OF THE DRAWINGS

In all the associated legends below, as well as the Examples, "$Ar_2I^+/PF_6^-$" refers to the following iodonium salt, also referred to as "SpeedCure 938":

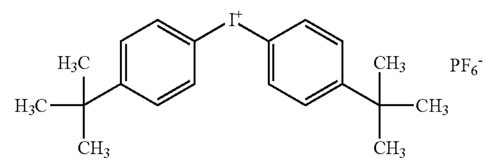

$Ar_2I^+/PF_6^-$

Figure 1:
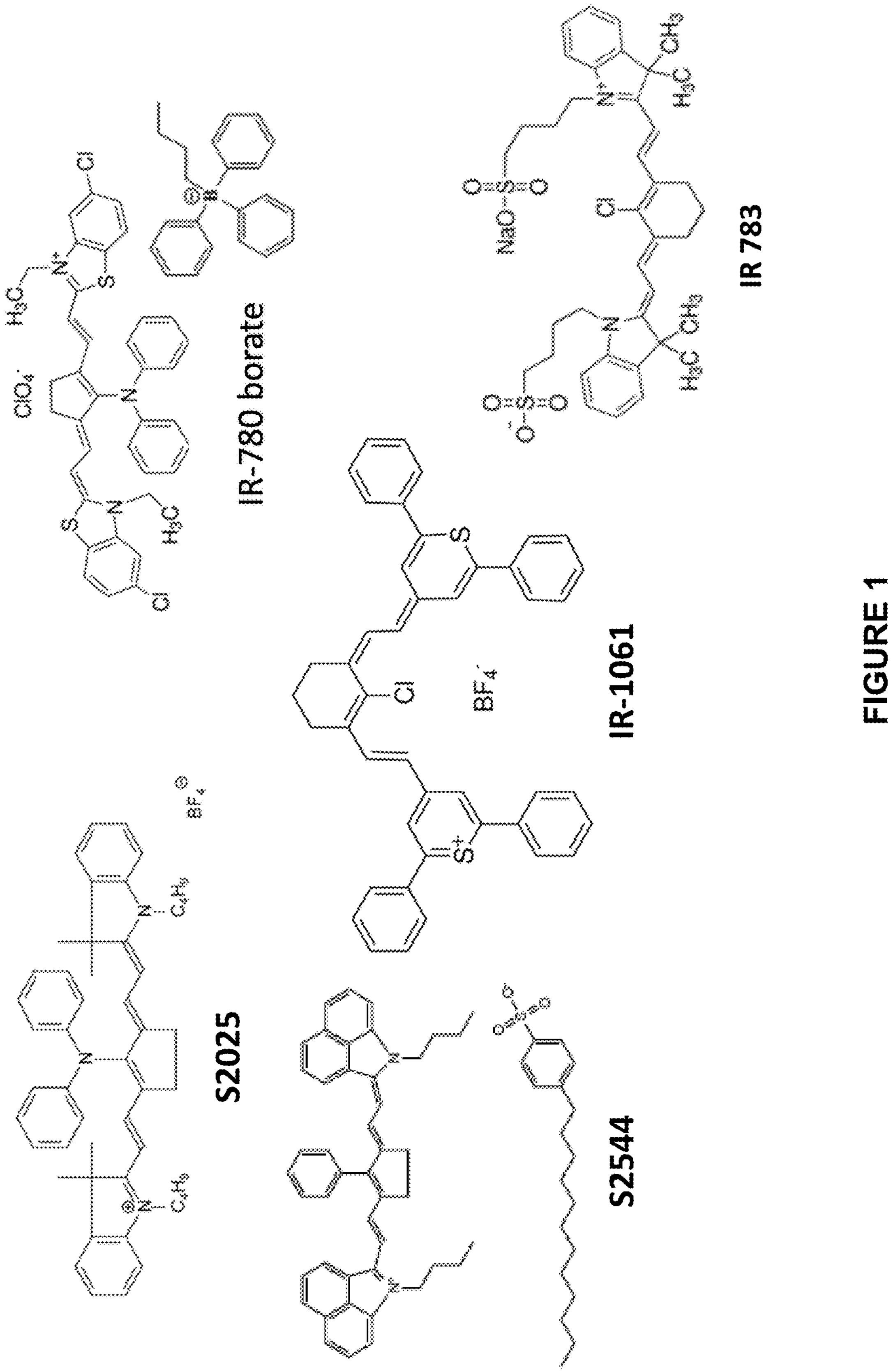

FIG. 1. Examples of cyanine dyes useable in the context of the present invention.

Figure 2:
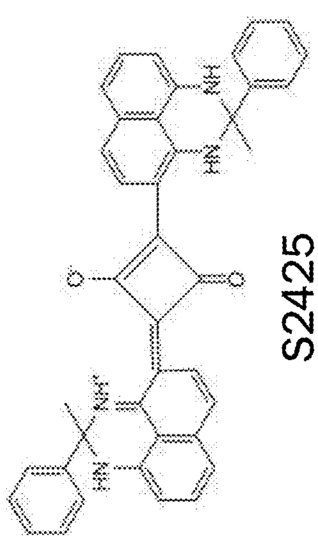
Figure 2:
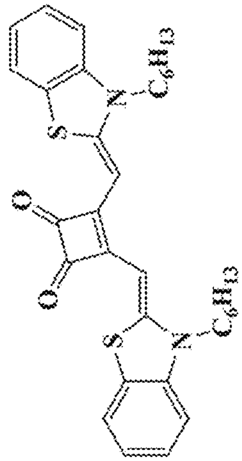
Figure 2:
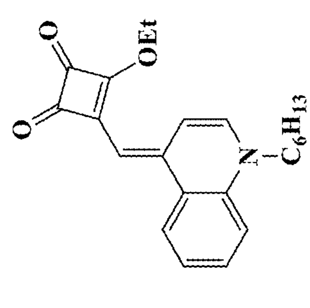
Figure 2:
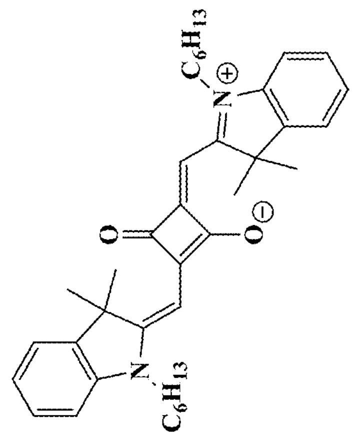

FIG. 2. Examples of Squaraines and Squarylium dyes useable in the context of the present invention.

Figure 3:
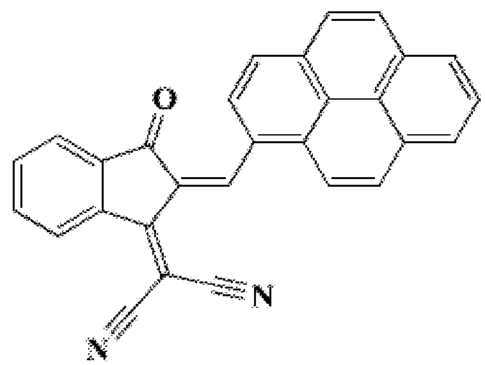
Figure 3:
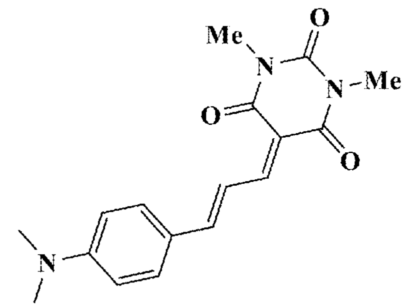

FIG. 3. Examples of push-pull type dyes useable in the context of the present invention.

Figure 4:
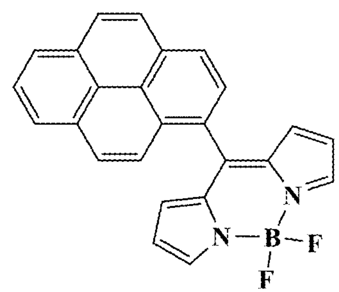

FIG. 4. Examples of Bodipy dyes useable in the context of the present invention.

Figure 5:
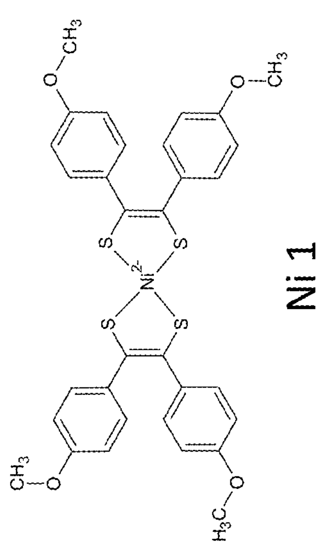
Figure 5:
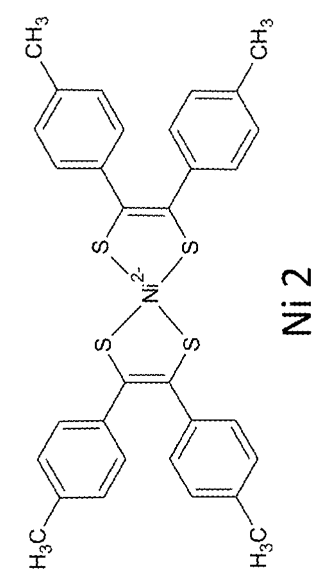

FIG. 5. Examples of dithiolene metal salt dyes useable in the context of the present invention.

Figure 6:
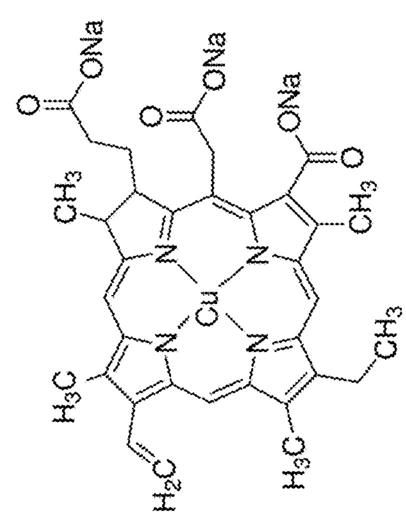

FIG. 6. Examples of porphyrin dyes useable in the context of the present invention.

Figure 7:
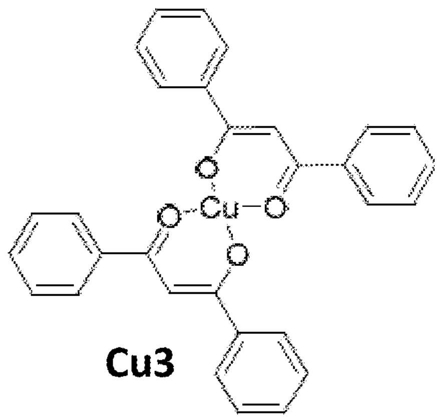
Figure 7:
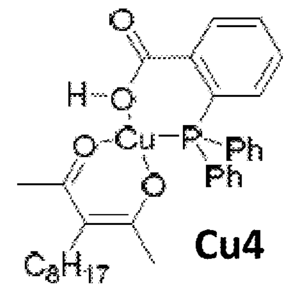

FIG. 7. Examples of copper complex dyes useable in the context of the present invention.

Figure 8:
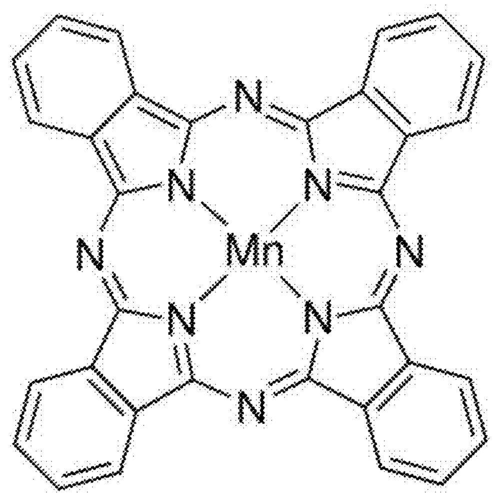

FIG. 8. Examples of phthalocyanine dyes useable in the context of the present invention.

Figure 9:
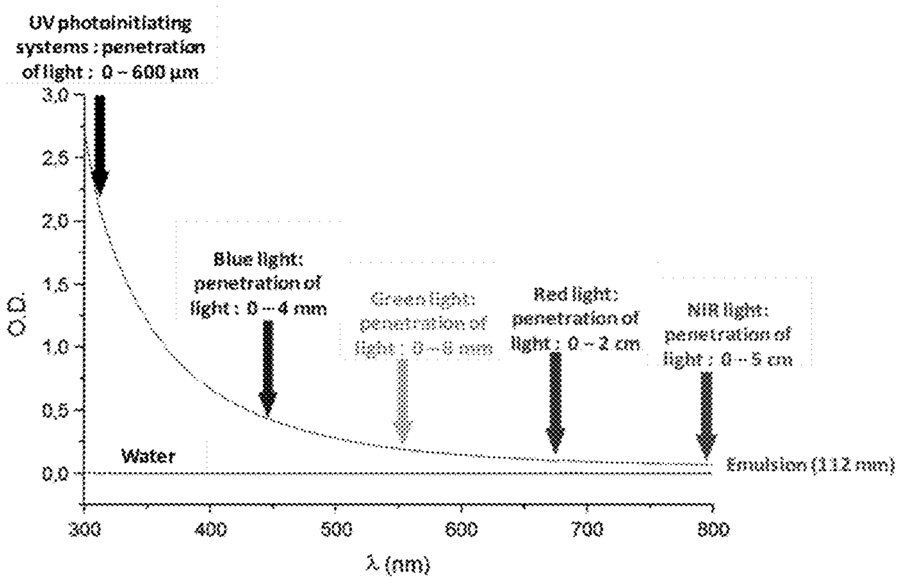

FIG. 9. UV-vis diffusion of light for a polystyrene latex (112 nm of average diameter) and calculated light penetrations of selected photons.

Figure 10:
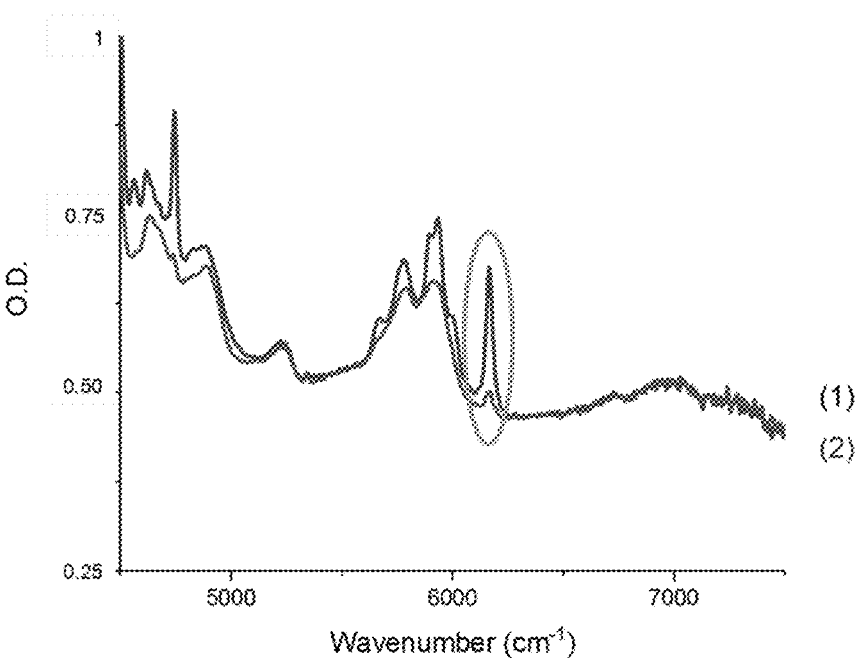

FIG. 10. RT-FTIR spectra of methacrylate monomers between 4500 $cm^{-1}$ and 7500 $cm^{-1}$ (1) before polymerization (2) after polymerization. Circled is the peak representative of the double bond C═C conversion used to calculate the photopolymerization profile (methacrylate function conversion vs. irradiation time).

Figure 11:
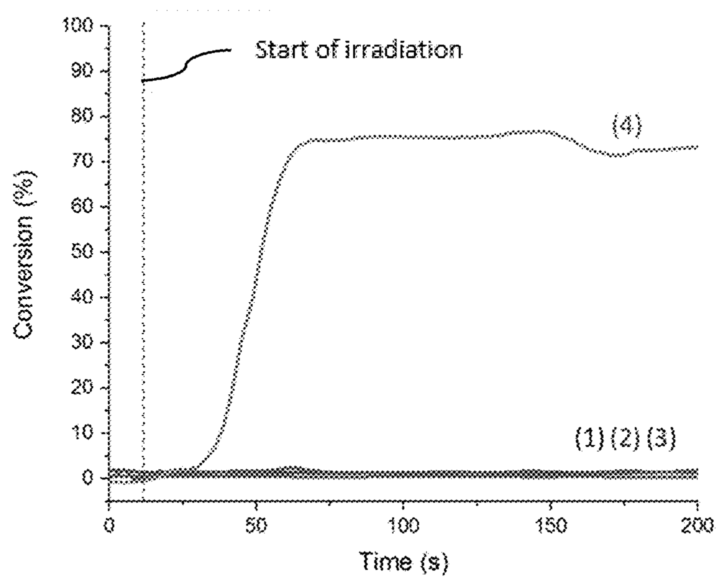

FIG. 11. Photopolymerization of Mix-MA under air (methacrylates function conversion vs. irradiation time) in the presence of (1) no additives, (2) IR-780 borate (0.1 wt %), (3) BlocBuilder-MA (2 wt %), (4) IR-780 borate/BlocBuilder-MA (0.1 wt %/2 wt %), laser diode@785 nm; 400 $mW/cm^2$; thickness=1.4 mm, under air. The irradiation starts at t=17 s.

Figure 12:
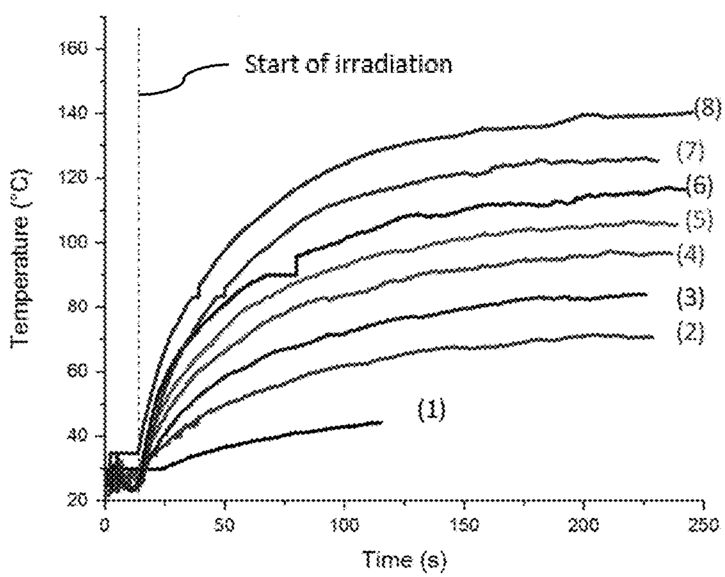

FIG. 12. Temperature profiles of Mix-MA under air (temperature of the sample vs. irradiation time) in the presence of IR-780 borate (0.1 wt %); Laser diode@785 nm at (1) 0.4 $W/cm^2$, (2) 0.69 $W/cm^2$, (3) 0.97 $W/cm^2$, (4) 1.26 $W/cm^2$, (5) 1.56 $W/cm^2$, (6) 1.82 $W/cm^2$, (7) 2.1 $W/cm^2$, (8) 2.55 $W/cm^2$; thickness=10 mm; The irradiation starts at t=17 s.

Figure 13:
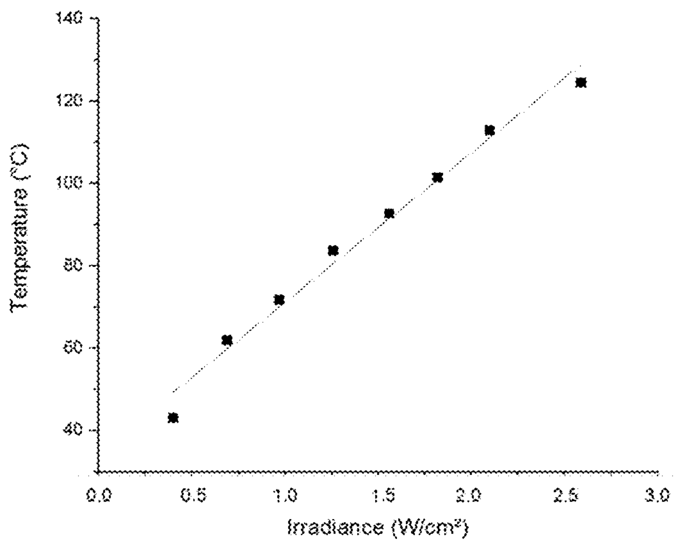

FIG. 13. Temperature reached for Mix-MA under air after 100 s of irradiation at different irradiance (temperature of the sample (° C.) vs. irradiance ($W/cm^2$)) in the presence of 0.1 wt % IR-780 borate; Laser diode@785 nm; thickness=10 mm.

Figure 14:
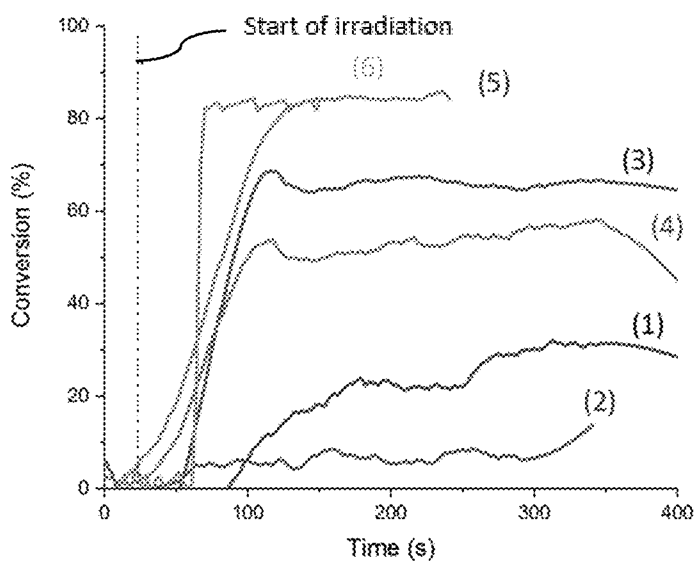

FIG. 14. Photopolymerization of Mix-MA under air (methacrylates conversion vs. irradiation time) in the presence of IR-780 borate (0.1 wt %) and (1) tert-butylperoxide (2 wt %), (2) dicumylperoxide (2 wt %), (3) Luperox P (2 wt %), (4) Luperox 331M80 (2 wt %), (5) Cumene hydroperoxide (2 wt %), (6) 1,1'-Azobis(cyclohexanecarbonitrile) (2 wt %), laser diode@785 nm, 2.55 W/cm$^2$, thickness=1.4 mm; The irradiation starts at t=17 s.

Figure 15:
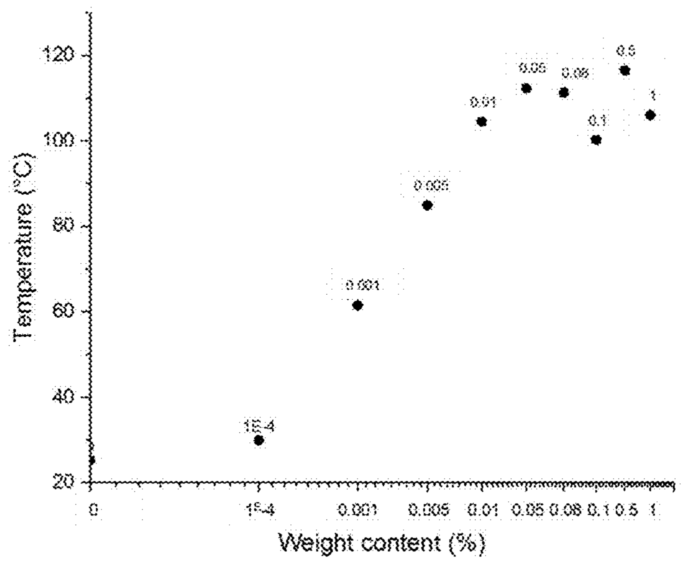

FIG. 15. Temperature maximum of Mix-MA under air after 50 s of irradiation with laser diode @785 nm and 2.55 W/cm$^2$ (temperature max of the sample (° C.) vs. Concentration of IR-780 borate (w %)) in the presence of different weight percentages of IR-780 borate; thickness=10 mm.

Figure 16:
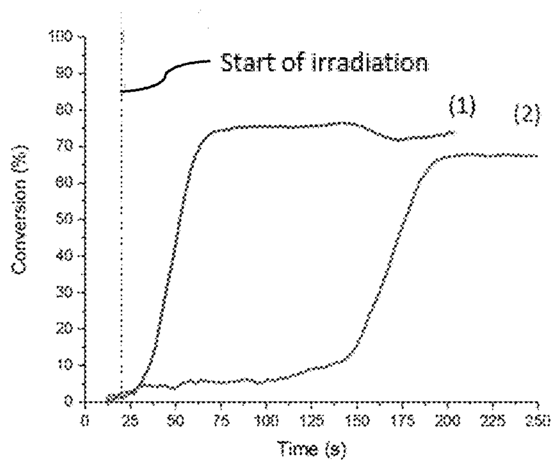

FIG. 16. Photopolymerization of Mix-MA under air (methacrylates function conversion vs. irradiation time) in the presence of BlocBuilder-MA (2 wt %) and IR-780 borate (1) 0.1 wt %, (2) 0.01 wt %, laser diode@785 nm, 400 mW/cm$^2$, thickness=1.4 mm; The irradiation starts at t=17 s.

Figure 17:
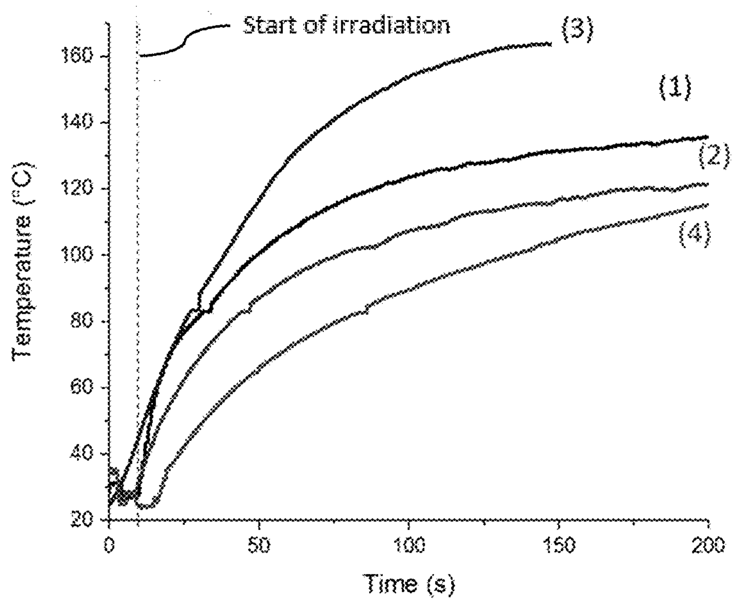

FIG. 17. Temperature profiles for IR-780 borate (0.1 wt %) in different polymerizable components under air (temperature max of the sample vs. irradiation time): (1) Mix-MA, (2) TMPTA, (3) UDMA, (4) HPMA; laser diode@785 nm at 2.55 W/cm$^2$; thickness=10 mm; The irradiation starts at t=17 s.

Figure 18:
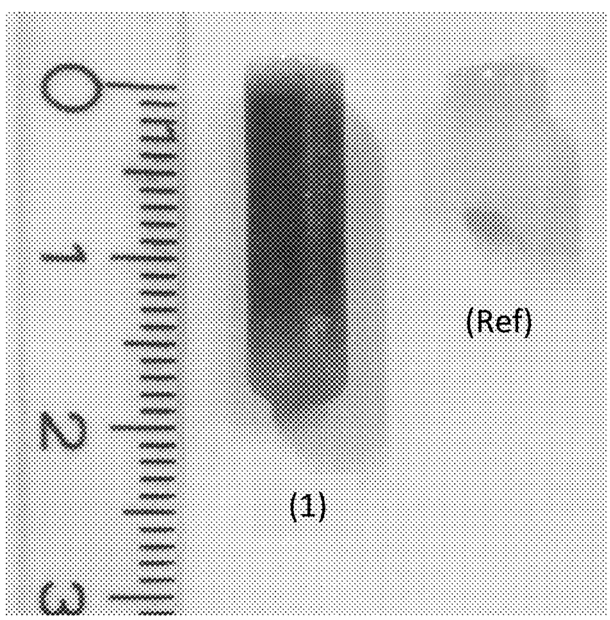

FIG. 18. Photopolymerization of Mix-MA under air in the presence of 50 wt % fillers and (1) IR 780-borate (0.1 wt %) and Blocbuilder-MA (2 wt %), laser diode@785 nm, 2.55 W/cm$^2$; thickness=19 mm; (ref) camphorquinone (1 wt %)+Amine EDB (2 wt %), irradiation during 10 minutes under LED@470 nm; thickness=6 mm.

Figure 19:
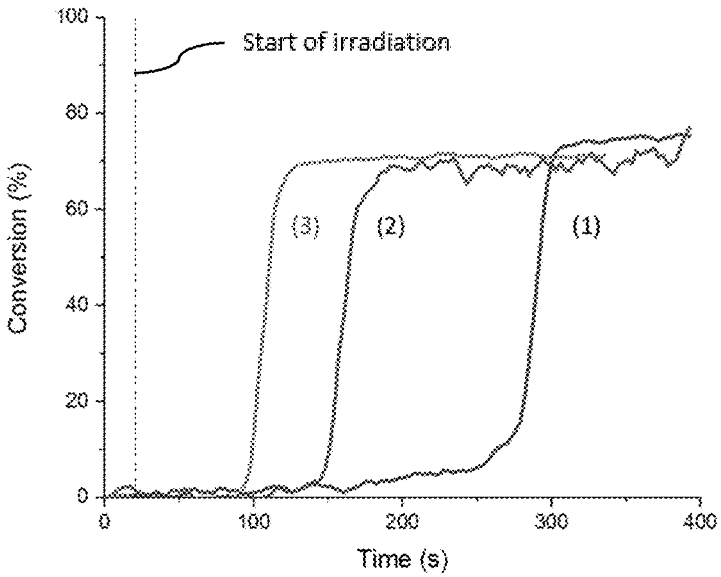

FIG. 19. Photopolymerization of Mix-MA under air (methacrylates function conversion vs. irradiation time) in the presence of IR-780 borate/Blocbuilder-MA (0.01 wt %/2 wt %) and (1) no other additives, (2) $Ar_2I^+PF_6^-$ (1.5 wt %), (3) 4-dppba/$Ar_2I^+/PF_6^-$ (0.5 wt %/1.5 wt %)/0) laser diode@785 nm, 400 mW/cm$^2$, thickness=1.4 mm; The irradiation starts at t=17 s.

Figure 20:
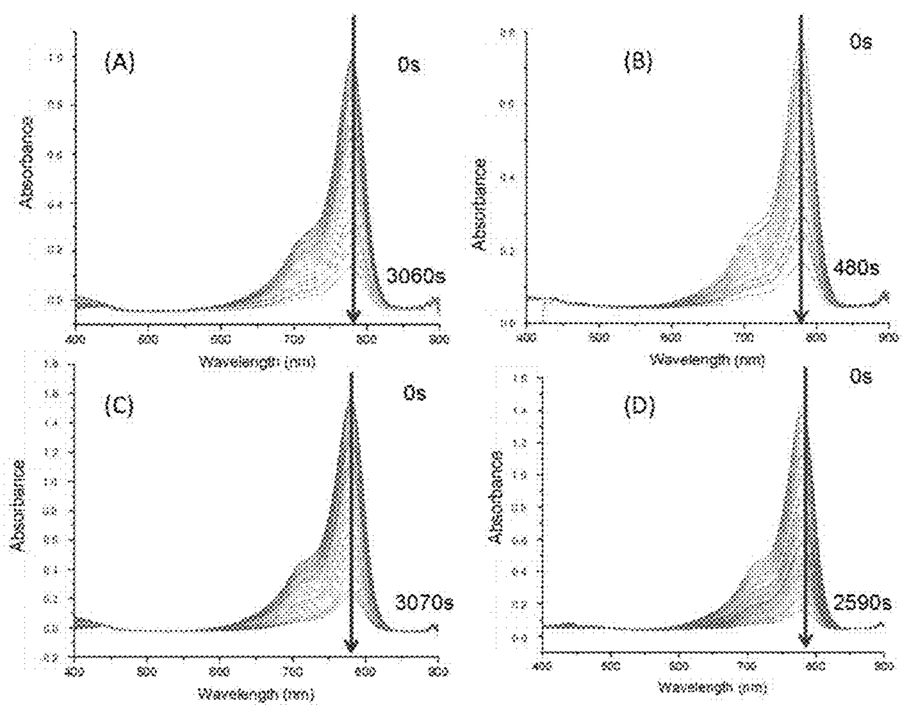

FIG. 20. (A) Photolysis of IR 780-borate in ACN upon laser diode@785 nm, 2.55 W/cm$^2$: UV-vis spectra for different irradiation times; (B) Photolysis of IR 780-borate+BlocBuilder-MA in ACN upon laser diode@785 nm, 2.55 W/cm$^2$: UV-vis spectra for different irradiation times; (C) Photolysis of IR 780-iodide in ACN upon laser diode@785 nm, 2.55 W/cm$^2$: UV-vis spectra for different irradiation times (D) Photolysis of IR 780-iodide+BlocBuilder-MA in ACN upon laser diode@785 nm, 2.55 W/cm$^2$: UV-vis spectra for different irradiation times.

Figure 21:
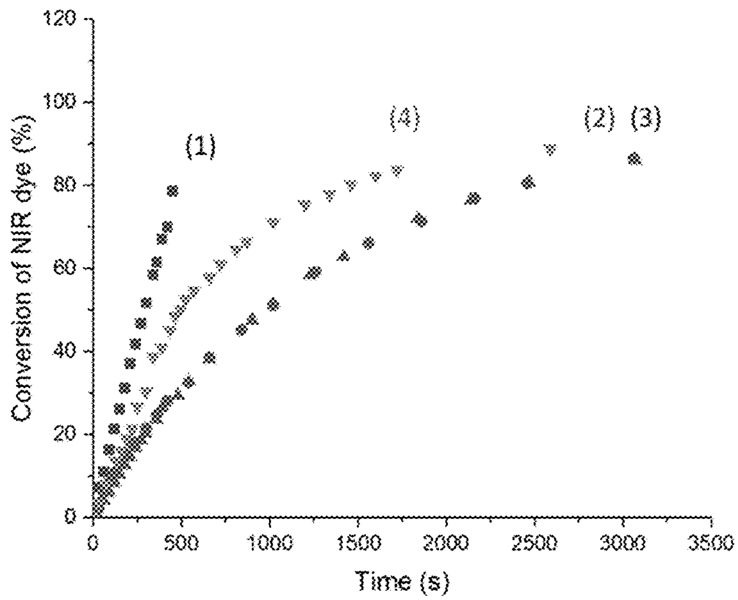

FIG. 21. Photolysis (Conversion of the dye determined through its peak at 780 nm vs. Time of exposure) upon laser diode@785 nm, 2.55 W/cm$^2$ of (1) IR-780 borate+BlocBuilder-MA, (2) IR-780 borate, (3) IR-780 iodide, (4) IR-780 iodide+BlocBuilder-MA in ACN.

Figure 22:
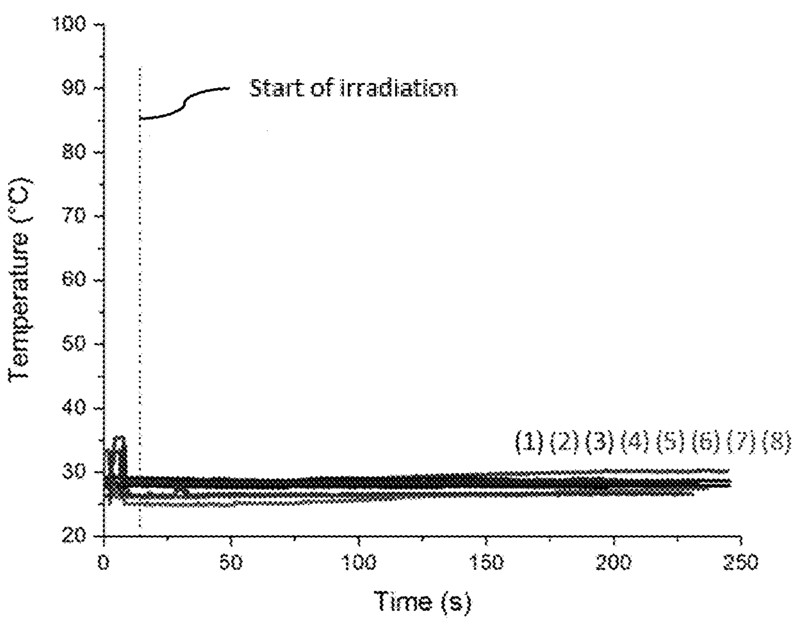

FIG. 22. Temperature profiles of Mix-MA under air (temperature of the sample vs. irradiation time) in the presence of (1) polymerizable component alone, (2) cumene hydroperoxide (2 wt %), (3) Luperox P (2 wt %), (4) BlocBuilder-MA (2 wt %), (5) BPO (2 wt %), (6) Ammonium Persulfate (2 wt %), (7) Dicumylperoxide (2 wt %), (8) Luperox 331M80 (2 wt %); laser diode@785 nm at 2.55 W/cm$^2$; thickness=10 mm; The irradiation starts at t=17 s.

Figure 23:
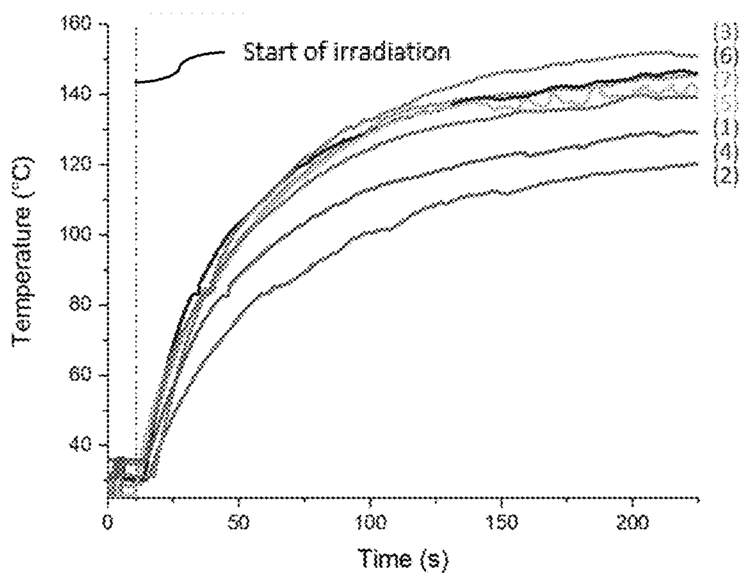

FIG. 23. Temperature profiles of Mix-MA under air (temperature of the sample vs. irradiation time) in the presence of 0.1 wt % (1) IR-780 borate, (3) S0507, (4) IR-140 borate, (5) S2025, (6) IR-813 borate, (7) Indocyanine Green; Laser@785 nm at 2.55 W/cm$^2$; thickness=10 mm; The irradiation starts at t=17 s.

Figure 24:
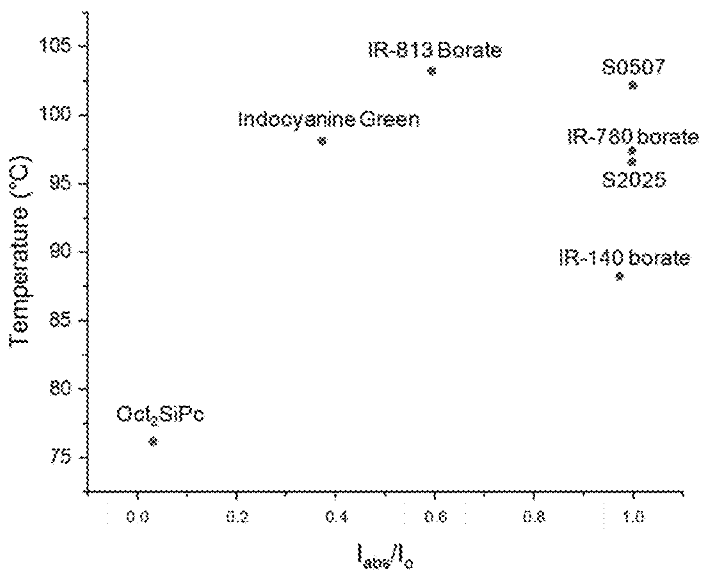

FIG. 24. Temperature of Mix-MA with 0.1 wt % of NIR-dye under air after 50 s under irradiation@785 nm (2.55 W/cm$^2$) vs. the absorbed light.

Figure 25:
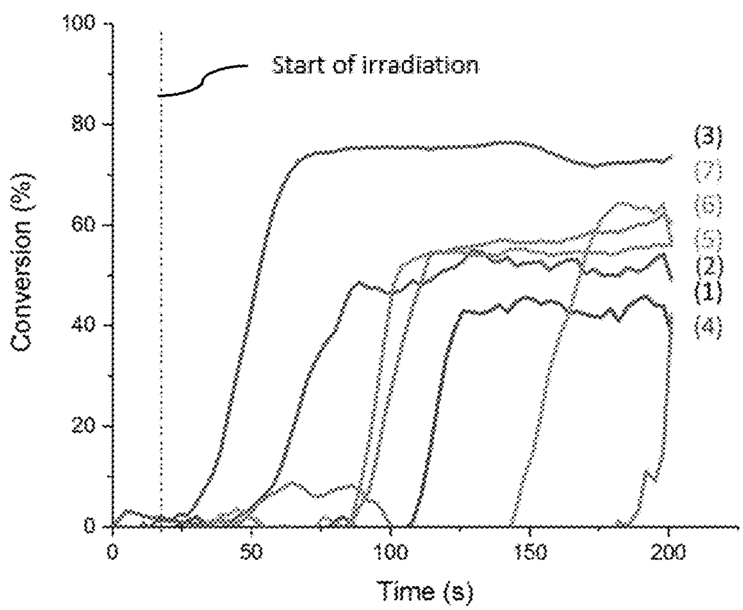

FIG. 25. Photopolymerization of Mix-MA under air (methacrylates function conversion vs. irradiation time) in the presence of blocbuilder-MA (2 wt %) and (1) S0507 (0.1 wt %), (2) IR-140 borate (0.1 wt %), (3) IR-780 borate (0.1 wt %), (4) Indocyanine Green (0.1 wt %), (5) IR-813 borate (0.1 wt %), (6) S2025 (0.1 wt %), laser diode@785 nm, 400 mW/cm$^2$, thickness=1.4 mm; The irradiation starts at t=17 s.

Figure 26:
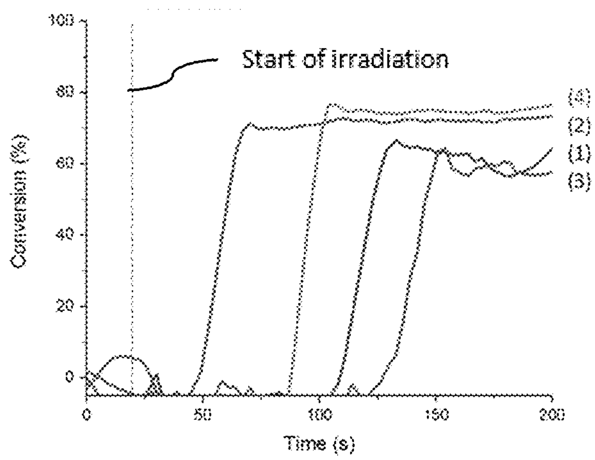

FIG. 26. Photopolymerization of Mix-MA under air (methacrylates function conversion vs. irradiation time) in the presence of BlocBuilder-MA (2 wt %) and (1) IR-780 iodide (0.1 wt %), (2) IR-780 borate (0.1 wt %), (3) IR-813 p-toluenesulfonate (0.1 wt %), (4) IR-813 borate (0.1 wt %) laser diode@785 nm, 400 mW/cm$^2$, thickness=1.4 mm; The irradiation starts at t=17 s.

Figure 27:
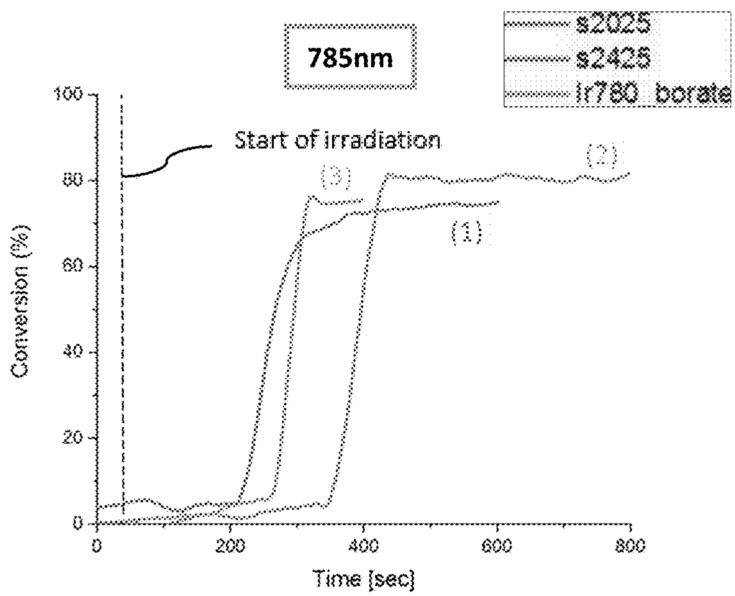

FIG. 27. Conversion profiles for exemplary dyes in the photothermal experiments described in Example 6: Photopolymerization profiles of Mix-MA under air (methacrylates function conversion vs. irradiation time) in the presence of BlocBuilder-MA (2 wt %) and (1) S2025 (0.1 wt %), (2) S2425 (0.1 wt %) and (3) IR-780 borate (0.1 wt %) under exposure to Laser@785 nm, 400 mW/cm$^2$, Thickness=1.4 mm. The irradiation starts for t=17 s.

Figure 28:
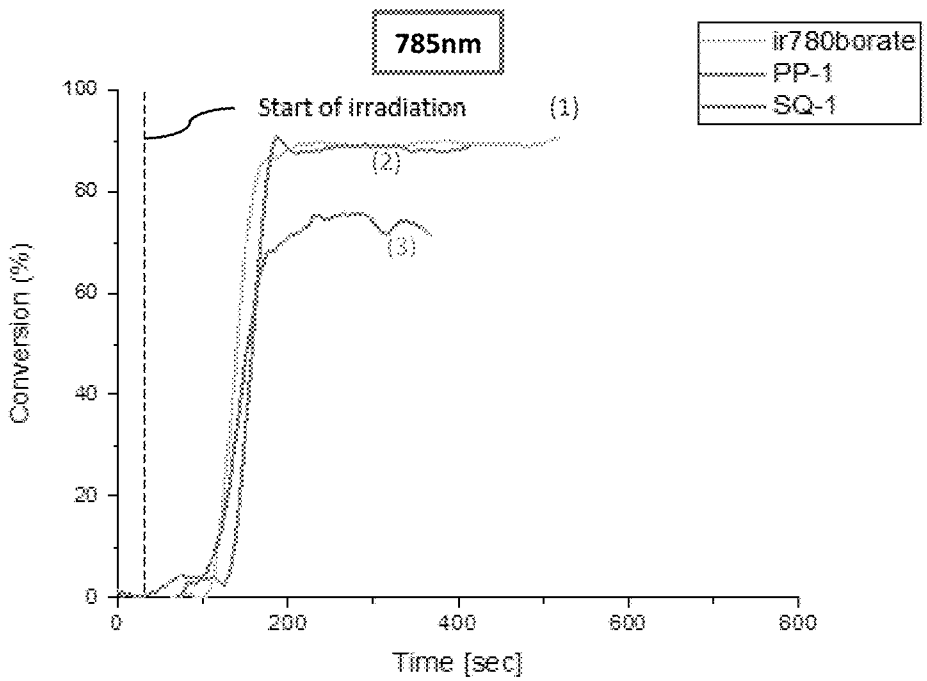

FIG. 28. Conversion profiles for exemplary dyes in the photothermal/photochemical experiments described in Example 6: Photopolymerization profiles of Mix-MA under air (methacrylates function conversion vs. irradiation time) in the presence of BlocBuilder-MA (2 wt %) and (1) IR-780 borate (0.1 wt %), (2) PP-1 (0.1 wt %) and (3) SQ-1 (0.1 wt %) under exposure to laser@785 nm, 400 mW/cm$^2$, Thickness=1.4 mm. The irradiation starts for t=17 s.

Figure 29:
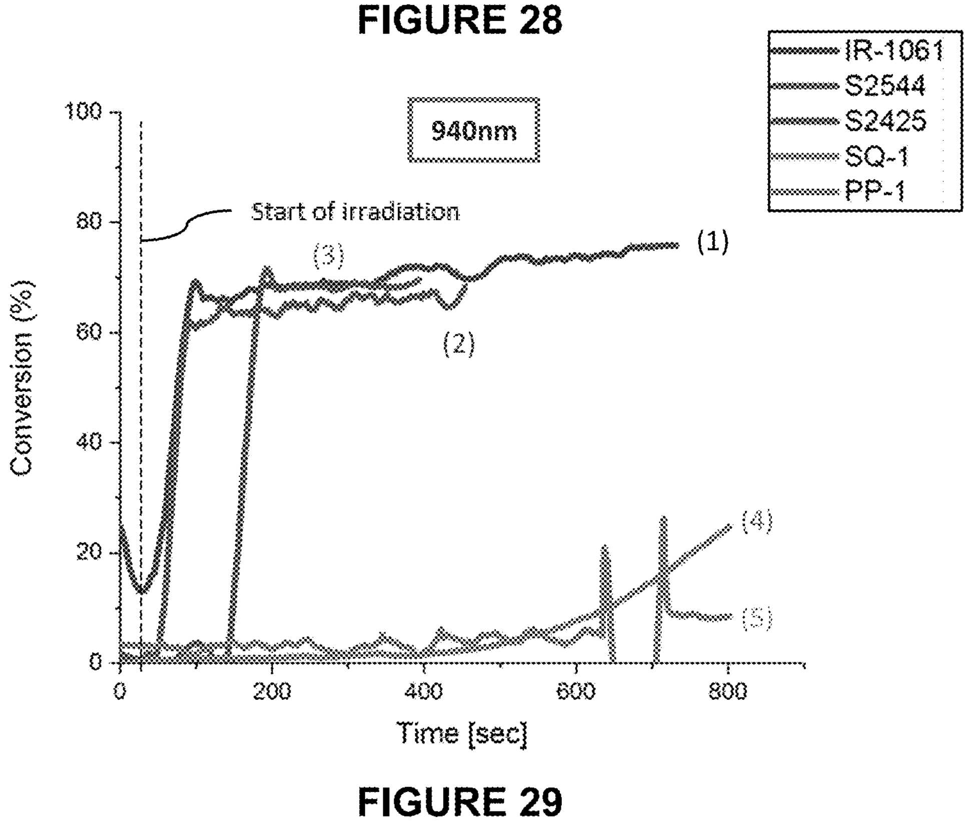

FIG. 29. Conversion profiles for exemplary dyes in the photothermal experiments described in Example 6: Photopolymerization profiles of Mix-MA under air (methacrylates function conversion vs. irradiation time) in the presence of BlocBuilder-MA (2 wt %) and (1) IR-1061 (0.1 wt %), (2) S2544 (0.1 wt %), (3) S2425 (0.1 wt %), (4) SQ-1 (0.1 wt %) and (5) PP-1 (0.1 wt %) under exposure to laser@940 nm, 2 W/cm$^2$, Thickness=1.4 mm. The irradiation starts for t=17 s.

Figure 30A:
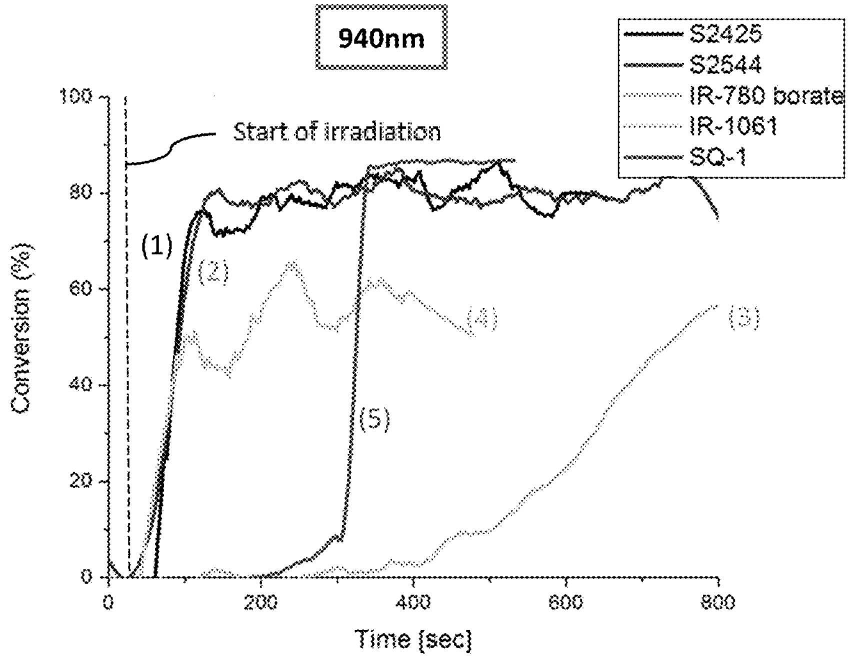
Figure 30B:
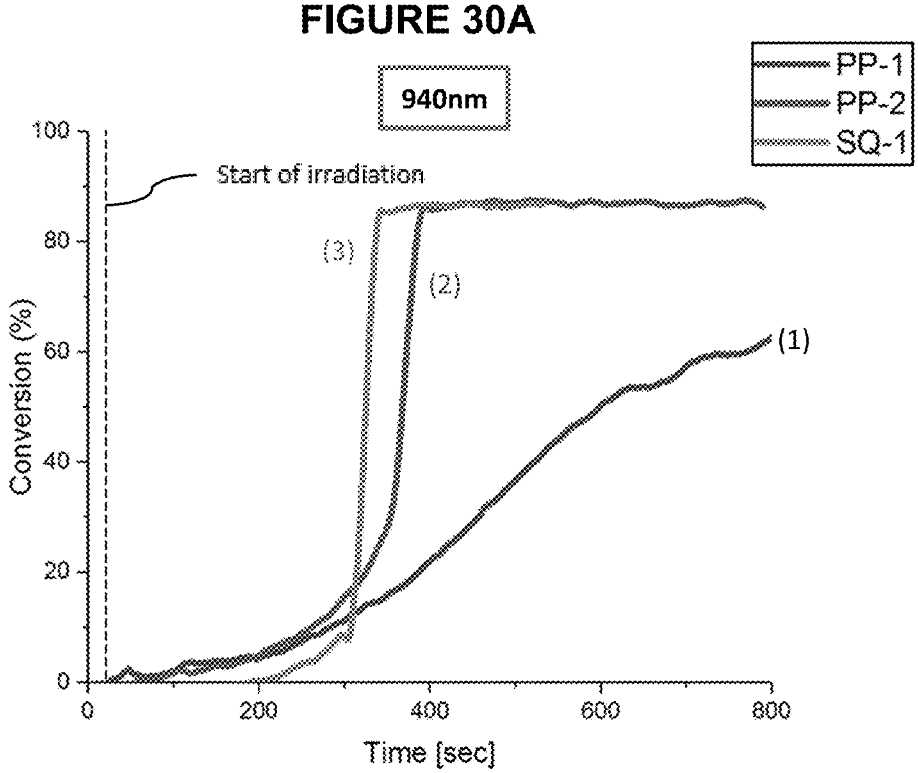

FIG. 30. Conversion profiles for exemplary dyes in the dual photothermal/photochemical experiments described in Example 7. FIG. 30A. Photopolymerization of Mix-MA under air (methacrylates function conversion vs. irradiation time) in the presence of SpeedCure 938 (3 wt %), 4-dppba (2 wt %), blocbuilder (2 wt %) and (1) S2425 (0.1 wt %), (2) S2544 (0.1 wt %), (3) IR-780 borate (0.1 wt %), (4) IR-1061 (0.1 wt %), and (5) SQ-1 (0.1 wt %) under exposure to laser diode@940 nm, 2 W/cm$^2$, thickness=1.4 mm; The irradiation starts at t=17 s. FIG. 30B. Photopolymerization of Mix-MA under air (methacrylates function conversion vs. irradiation time) in the presence of SpeedCure 938 (3 wt %), 4-dppba (2 wt %), blocbuilder-MA (2 wt %) and (1) PP-1 (0.1 wt %), (2) PP-2 (0.1 wt %) and (3) SQ-1 (0.1 wt %), under exposure to laser diode@940 nm, 2 W/cm$^2$, thickness=1.4 mm; The irradiation starts at t=17 s.

Figure 31A:
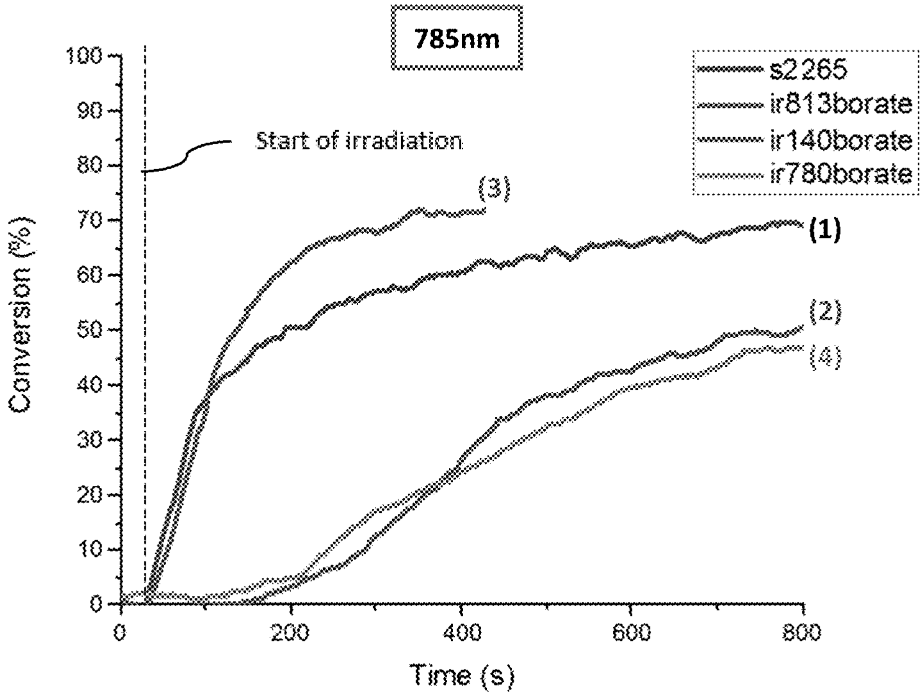
Figure 31B:
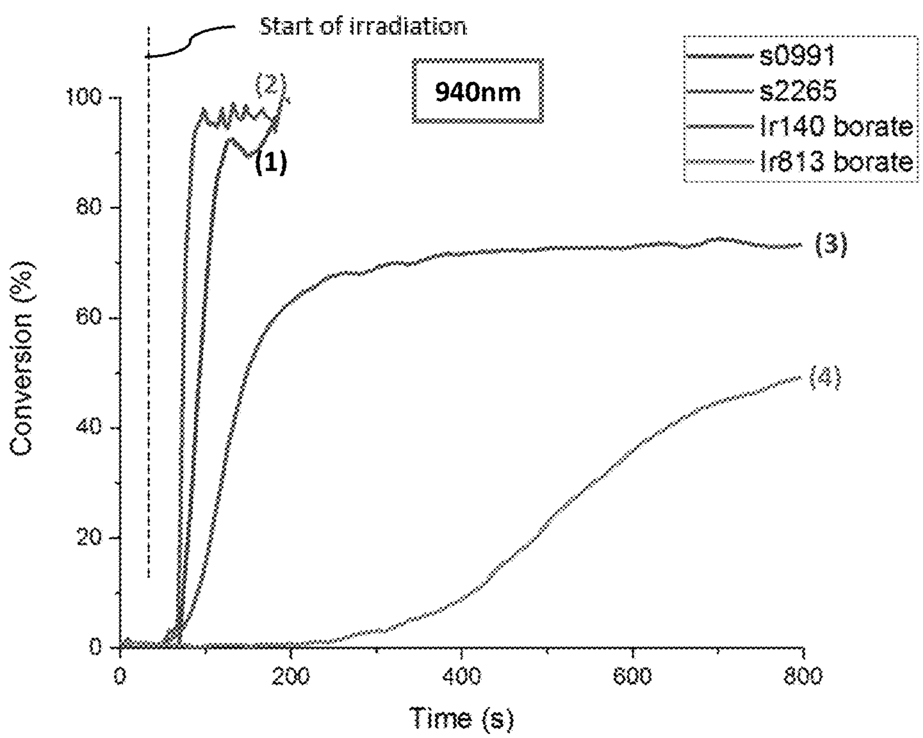

FIG. 31. Conversion profiles for exemplary dyes in the dual photothermal/photochemical experiments described in Example 7. FIG. 31A Photopolymerization profiles of Mix-MA under air (methacrylates function conversion vs. irradiation time) in the presence of SpeedCure 938 (3 wt %), 4-dppba (2 wt %), 1,1' Azobis(cyclohexanecarbonitrile) (2 wt %) and (1) S2265 (0.1 wt %), (2) IR-813 borate (0.1 wt %), (3) IR-140 borate (0.1 wt %), and (4) IR-780 borate (0.1 wt %) under exposure to Laser@785 nm, 400 mW/cm$^2$, Thickness=1.4 mm. The irradiation starts for t=17 s. FIG. 31B Photopolymerization profiles of Mix-MA under air (methacrylates function conversion vs. irradiation time) in the presence of SpeedCure 938 (3 wt %), 4-dppba (2 wt %), 1,1' Azobis(cyclohexanecarbonitrile) (2 wt %) and (1) S2265 (0.1 wt %), (2) IR-813 borate (0.1 wt %), (3) IR-140 borate (0.1 wt %), and (4) IR-780 borate (0.1 wt %) under exposure to laser@940 nm, 2 W/cm$^2$, Thickness=1.4 mm. The irradiation starts for t=17 s.

Figure 32A:
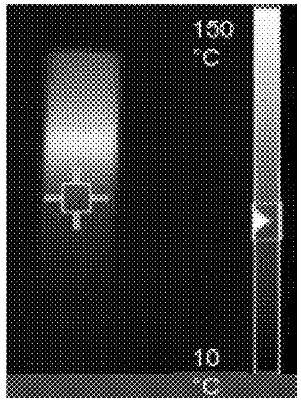
Figure 32B:
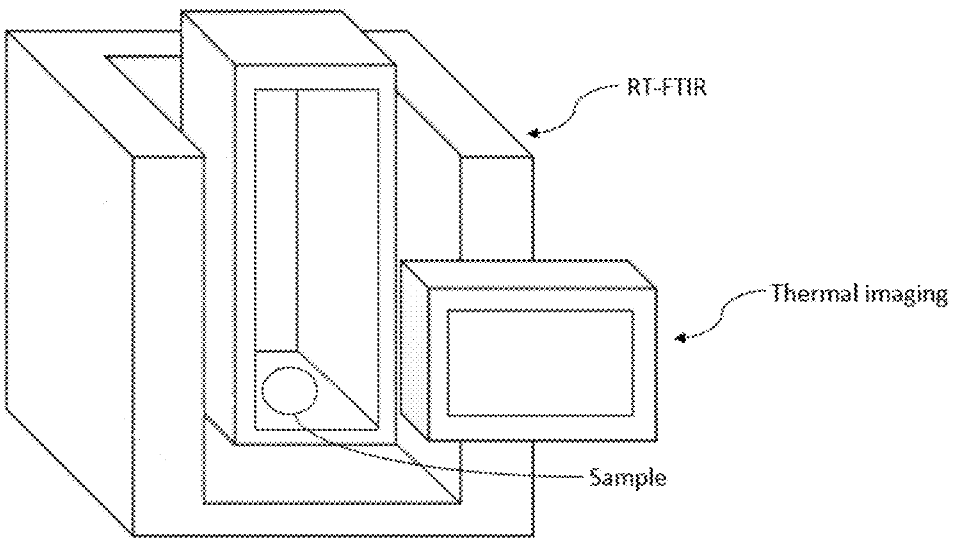

FIG. 32. Illustration of thermal imaging technology (for example for use in determination of heat-generating profiles of dyes useable in the context of the present invention and/or for simultaneous monitoring temperature-conversion profiles). FIG. 32A: Temperature measurement using an infrared thermal imaging camera (Fluke TiX500) with a thermal resolution of about 1° C. and a spatial resolution of 1.31 mRad. FIG. 32B: Experimental set-up for simultaneous monitoring of temperature-conversion profiles. Cf. Garra, P., Bonardi, A., Baralle, A., Al Mousawi, A., Bonardi, F., Dietlin, C., Morlet-Savary, F., Fouassier, J. and Lalevée, J. (2018), Monitoring photopolymerization reactions through thermal imaging: A unique tool for the real-time follow-up of thick samples, 3D printing, and composites. J. Polym. Sci. Part A: Polym. Chem., 56: 889-899. [23]

Figure 33:
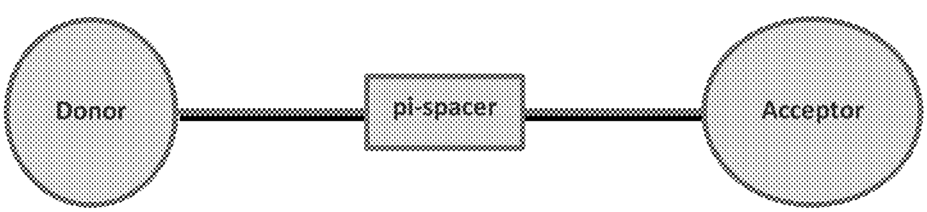

FIG. 33. Schematic structure of push-pull compounds.

DEFINITIONS

To facilitate an understanding of the present invention, a number of terms and phrases are defined below:

As used herein other than the claims, the terms "a," "an," "the," and/or "said" means one or more. As used herein in the claim(s), when used in conjunction with the words "comprise," "comprises" and/or "comprising," the words "a," "an," "the," and/or "said" may mean one or more than one. As used herein and in the claims, the terms "having," "has," "is," "have," "including," "includes," and/or "include" has the same meaning as "comprising," "comprises," and "comprise." As used herein and in the claims "another" may mean at least a second or more.

The phrase "a mixture thereof" and such like following a listing, the use of "and/or" as part of a listing, a listing in a table, the use of "etc" as part of a listing, the phrase "such as," and/or a listing within brackets with "e.g.," or i.e., refers to any combination (e.g., any sub-set) of a set of listed components, and combinations and/or mixtures of related species and/or embodiments described herein though not directly placed in such a listing are also contemplated. Such related and/or like genera(s), sub-genera(s), specie(s), and/or embodiment(s) described herein are contemplated both in the form of an individual component that may be claimed, as well as a mixture and/or a combination that may be described in the claims as "at least one selected from," "a mixture thereof" and/or "a combination thereof."

In general, the term "substituted" whether preceded by the term "optionally" or not, and substituents contained in formulae of this invention, refer to the replacement of hydrogen radicals in a given structure with the radical of a specified substituent. When more than one position in any given structure may be substituted with more than one substituent selected from a specified group, the substituent may be either the same or different at every position. As used herein, the term "substituted" is contemplated to include all permissible substituents of organic compounds.

The term "aliphatic", as used herein, includes both saturated and unsaturated, straight chain (i.e., unbranched) or branched aliphatic hydrocarbons, which are optionally substituted with one or more functional groups. As will be appreciated by one of ordinary skill in the art, "aliphatic" is intended herein to include, but is not limited to, alkyl, alkenyl, alkynyl moieties.

As used herein, the term "alkyl", refers to straight and branched alkyl groups. An analogous convention applies to other generic terms such as "alkenyl", "alkynyl" and the like. As used herein, "lower alkyl" is used to indicate those alkyl groups (substituted, unsubstituted, branched or unbranched) having about 1-6 carbon atoms. Illustrative alkyl groups include, but are not limited to, for example, methyl, ethyl, n-propyl, isopropyl, allyl, n-butyl, sec-butyl, isobutyl, tert-butyl, n-pentyl, sec-pentyl, isopentyl, tert-pentyl, n-hexyl, sec-hexyl, moieties and the like, which again, may bear one or more substituents. Alkenyl groups include, but are not limited to, for example, ethenyl, propenyl, butenyl, 1-methyl-2-buten-1-yl, and the like. Representative alkynyl groups include, but are not limited to, ethynyl, 2-propynyl (propargyl), 1-propynyl and the like.

The term "alicyclic", as used herein, refers to compounds which combine the properties of aliphatic and cyclic compounds and include but are not limited to cyclic, or polycyclic aliphatic hydrocarbons and bridged cycloalkyl compounds, which are optionally substituted with one or more functional groups. As will be appreciated by one of ordinary skill in the art, "alicyclic" is intended herein to include, but is not limited to, cycloalkyl, cycloalkenyl, and cycloalkynyl moieties, which are optionally substituted with one or more functional groups. Illustrative alicyclic groups thus include, but are not limited to, for example, cyclopropyl, —$CH_2$-cyclopropyl, cyclobutyl, —$CH_2$-cyclobutyl, cyclopentyl, —$CH_2$-cyclopentyl-n, cyclohexyl, —$CH_2$-cyclohexyl, cyclohexenylethyl, cyclohexanylethyl, norborbyl moieties and the like, which again, may bear one or more substituents.

The term "heteroaliphatic", as used herein, refers to aliphatic moieties in which one or more carbon atoms in the main chain have been substituted with a heteroatom. Thus, a heteroaliphatic group refers to an aliphatic chain which contains one or more oxygen, sulfur, nitrogen, phosphorus or silicon atoms, i.e., in place of carbon atoms. Heteroaliphatic moieties may be branched or linear unbranched. An analogous convention applies to other generic terms such as "heteroalkyl", "heteroalkenyl", "heteroalkynyl" and the like.

The term "heterocyclic" or "heterocycle", as used herein, refers to compounds which combine the properties of heteroaliphatic and cyclic compounds and include but are not limited to saturated and unsaturated mono- or polycyclic heterocycles such as morpholino, pyrrolidinyl, furanyl, thiofuranyl, pyrrolyl etc., which are optionally substituted with one or more functional groups, as defined herein. In certain embodiments, the term "heterocyclic" refers to a non-aromatic 5-, 6- or 7-membered ring or a polycyclic group, including, but not limited to a bi- or tri-cyclic group comprising fused six-membered rings having between one and three heteroatoms independently selected from oxygen, sulfur and nitrogen, wherein (i) each 5-membered ring has 0 to 2 double bonds and each 6-membered ring has 0 to 2 double bonds, (ii) the nitrogen and sulfur heteroatoms may optionally be oxidized, (iii) the nitrogen heteroatom may optionally be quaternized, and (iv) any of the above heterocyclic rings may be fused to an aryl or heteroaryl ring. Representative heterocycles include, but are not limited to, pyrrolidinyl, pyrazolinyl, pyrazolidinyl, imidazolinyl, imidazolidinyl, piperidinyl, piperazinyl, oxazolidinyl, isoxazolidinyl, morpholinyl, thiazolidinyl, isothiazolidinyl, and tetrahydrofuryl.

In general, the term "aromatic" or "aryl", as used herein, refers to stable substituted or unsubstituted unsaturated mono- or polycyclic hydrocarbon moieties having preferably 3-14 carbon atoms, comprising at least one ring satisfying Hückle's rule for aromaticity. Examples of aromatic moieties include, but are not limited to, phenyl, indanyl, indenyl, naphthyl, phenanthryl and anthracyl.

As used herein, the term "heteroaryl" refers to unsaturated mono-heterocyclic or polyheterocyclic moieties having preferably 3-14 carbon atoms and at least one ring atom selected from S, O and N, comprising at least one ring satisfying the Hückel rule for aromaticity. The term "heteroaryl" refers to a cyclic unsaturated radical having from about five to about ten ring atoms of which one ring atom is selected from S, O and N; zero, one or two ring atoms are additional heteroatoms independently selected from S, O and N; and the remaining ring atoms are carbon, the radical being joined to the rest of the molecule via any of the ring atoms, such as, for example, pyridyl, pyrazinyl, pyrimidinyl, pyrrolyl, pyrazolyl, imidazolyl, thiazolyl, oxazolyl, isooxazolyl, thiadiazolyl, oxadiazolyl, thiophenyl, furanyl, quinolinyl, isoquinolinyl, and the like. Examples of heteroaryl moieties include, but are not limited to, pyridyl, quinolinyl, dihydroquinolinyl, isoquinolinyl, quinazolinyl, dihydroquinazolyl, and tetrahydroquinazolyl.

As used herein, the expression "$C_x$-$C_y$, preferably $C_{x1}$-$C_{y1}$, alkylaryl, aralkyl or aryl", where x, y, x1 and y1 represent integers denoting the number of carbon atoms in the chemical moiety to which it refers (e.g., "alkylaryl", "aralkyl", "aryl")), means "$C_x$-$C_y$alkylaryl, $C_x$-$C_y$aralkyl or $C_x$-$C_y$aryl, preferably $C_{x1}$-$C_{y1}$alkylaryl, aralkyl or $C_{x1}$-$C_{y1}$aryl". Likewise, the expression "$C_x$-$C_y$ alkylaryl, aralkyl or aryl", means "$C_r$-$C_y$alkylaryl, $C_x$-$C_y$aralkyl or $C_x$-$C_y$aryl".

The term "halogen" as used herein refers to an atom selected from fluorine, chlorine, bromine and iodine.

The term "amine" refers to a group having the structure —$N(R)_2$ wherein each occurrence of R is independently hydrogen, or an aliphatic, heteroaliphatic, aryl or heteroaryl moiety, or the R groups, taken together with the nitrogen atom to which they are attached, may form a heterocyclic moiety.

As used herein, the term "independently" refers to the fact that the substituents, atoms or moieties to which these terms refer, are selected from the list of variables independently from each other (i.e., they may be identical or the same).

As used herein, the term "mild light irradiation conditions" or "mild irradiation conditions" refers to irradiation conditions in the near infrared region e.g., λ=625-2500 nm, for example under near infrared light range λ=700-2500 nm, in particular in the near infrared light range λ=700-1500 nm, with low intensity of a few $W/cm^2$ or even in the $mW/cm^2$ range. For example the near infrared irradiation intensity may range from 50 $mW/cm^2$ to 10 $W/cm^2$, advantageously from 100 $mW/cm^2$ to 7 $W/cm^2$, more advantageously from 200 $mW/cm^2$ to 5 $W/cm^2$, still more advantageously from 300 $mW/cm^2$ to 3 $W/cm^2$.

As used herein, the term "photothermal" when qualifying a polymerization mode refers to embodiments of the invention where the red-NIR dye used behaves only as heat-generator under the triggering action of red to near-infrared irradiation of intensity<10 $W/cm^2$, as further described herein. In this case, the dye is typically associated with a thermal initiator, preferably selected from peroxides, hydroperoxides, alkoxyamines, and azo compounds.

As used herein, the term "photochemical" or "pure photochemical" when qualifying a polymerization mode refers to polymerization conditions involving a red-NIR dye which behaves only as involved in redox reaction upon light irradiation (photoredox processes and absence of heat-generator behavior) under the triggering action of red to near-infrared irradiation of intensity<10 $W/cm^2$. As such, the polymerization takes place under a photoredox process. Pure photochemical polymerization falls outside the scope of the present invention.

As used herein, the term "dual photothermal/photochemical" when qualifying a polymerization mode refers to embodiments of the invention where the red-NIR dye used behaves both as heat-generator and photoredox electron transfer, under the triggering action of red to near-infrared irradiation of intensity<10 $W/cm^2$, as further described herein. In this case, the dye is typically associated with a thermal initiator (preferably selected from peroxides, hydroperoxides, alkoxyamines, and azo compounds), an iodonium salt, and a phosphine-type reducing agent.

As used herein, "about" refers to any inherent measurement error or a rounding of digits for a value (e.g., a measured value, calculated value such as a ratio), and thus the term "about" may be used with any value and/or range. As used herein, the term "about" can refer to a variation of ±5% of the value specified. For example, "about 50" percent can in some embodiments carry a variation from 45 to 55 percent. For integer ranges, the term "about" can include one or two integers greater than and/or less than a recited integer. Unless indicated otherwise herein, the term "about" is intended to include values, e.g., weight %, temperatures, proximate to the recited range that are equivalent in terms of the functionality of the relevant individual ingredient, the composition, or the embodiment.

As used herein, the term "and/or" means any one of the items, any combination of the items, or all of the items with which this term is associated.

As will be understood by the skilled artisan, all numbers, including those expressing quantities of ingredients, properties such as molecular weight, reaction conditions, and so forth, are approximations and are understood as being optionally modified in all instances by the term "about." These values can vary depending upon the desired properties sought to be obtained by those skilled in the art utilizing the teachings of the descriptions herein. It is also understood that such values inherently contain variability necessarily resulting from the standard deviations found in their respective testing measurements.

As will be understood by one skilled in the art, for any and all purposes, particularly in terms of providing a written description, all ranges recited herein also encompass any and all possible subranges and combinations of subranges thereof, as well as the individual values making up the range, particularly integer values. A recited range (e.g., weight percents or carbon groups) includes each specific value, integer, decimal, or identity within the range. Any listed range can be easily recognized as sufficiently describing and enabling the same range being broken down into at least equal halves, thirds, quarters, fifths, or tenths. As a non-limiting example, each range discussed herein can be readily broken down into a lower third, middle third and upper third, etc. As will also be understood by one skilled in the art, all language such as "up to," "at least," "greater than," "less than," "more than," "or more," and the like, include the number recited and such terms refer to ranges that can be subsequently broken down into subranges as discussed above. In the same manner, all ratios recited herein also include all subratios falling within the broader ratio. Accordingly, specific values recited for radicals, substituents, and ranges, are for illustration only; they do not exclude other defined values or other values within defined ranges for radicals and substituents.

One skilled in the art will also readily recognize that where members are grouped together in a common manner, such as in a Markush group, the invention encompasses not only the entire group listed as a whole, but each member of the group individually and all possible subgroups of the main group. Additionally, for all purposes, the invention encompasses not only the main group, but also the main group absent one or more of the group members. The invention therefore envisages the explicit exclusion of any one or more of members of a recited group. Accordingly, provisos may apply to any of the disclosed categories or embodiments whereby any one or more of the recited elements, species, or embodiments, may be excluded from such categories or embodiments, for example, as used in an explicit negative limitation.

As will be understood by one skilled in the art, for any and all purposes, particularly in terms of providing a written description, the expression "≤x %" (for example when used to express % w/w contents in components) is equivalent to "x % or <x %". As such, the expression "≤x %" is understood to provide support for the values "x %" and "<x %", independently.

DETAILED DESCRIPTION OF CERTAIN PREFERRED EMBODIMENTS OF THE INVENTION

As noted above, there is a dire need for the development of new systems and methods for more efficient thermal FRP, without the known disadvantages of thermal- and photo-initiated FRP, and that allow FRP reactions to be efficiently carried out in depth through thick samples/materials The inventors have discovered that an appropriately selected two-component thermal-initiator system can overcome the aforementioned drawbacks in the field.

In this context, there is provided herein a red to near infrared ("red-NIR") photoinduced thermal-initiating composition comprising:

(a) at least one heat-generating dye that generates heat, when exposed to a 625-2500 nm light source of intensity<10 W/cm$^2$; and (b) at least one thermal initiator preferably selected from peroxides, hydroperoxides, alkoxyamines, and azo compounds;

wherein the at least one thermal initiator undergoes homolytic cleavage to generate two free radicals upon exposure to the heat generated in the composition, without electron transfer from the dye.

This new Red-NIR system relies on a photothermal effect produced by a heat generating red-NIR dye which, upon irradiation, initiates the thermal polymerization.

As such, in another aspect, there is provided a composition thermally curable on demand under the triggering action of red to near-infrared irradiation of intensity<10 W/cm$^2$ comprising:

(a) <0.50% w/w, preferably ≤0.10% w/w, most preferably ≤0.08% w/w of the total weight of the composition, of at least one heat-generating dye that generates heat, when exposed to a 625-2500 nm light source of intensity<10 W/cm$^2$;

(b) at least one thermal initiator preferably selected from peroxides, hydroperoxides, alkoxyamines, and azo compounds; and (c) at least one polymerizable component comprising a C═C bond polymerizable by free radical polymerization;

wherein the at least one thermal initiator undergoes homolytic cleavage to generate two free radicals upon exposure to the heat generated in the composition, without electron transfer from the dye.

In essence, the heat-generating dye, when exposed to a 625-2500 nm light source of intensity<10 W/cm$^2$, generates within the composition an exotherm allowing the decomposition of the thermal initiator. This may happen for example when the heat-generating dye, when exposed to a 625-2500 nm light source of intensity<10 W/cm$^2$, generates within the composition an exotherm greater than the decomposition temperature of the thermal initiator.

Polymerizable Component

Advantageously, the polymerizable component in the thermally curable compositions according to the invention may be any C═C bond-containing compound polymerizable by free radical polymerization. Advantageously, at least one polymerizable component may be an ethylenically unsaturated monomer, the polymerization of which may be effected by free radical polymerization. As used herein, the term "ethylenically unsaturated monomer" refers to a polymerizable components that contains at least one carbon-carbon double bond. Preferably, ethylenically unsaturated monomers whose polymerization may be effected by free radical polymerization, contains at least one carbon-carbon double bond that is conjugated with an aryl moiety (e.g., phenyl), a carboxyl (C═O) group, or another double bond. Such monomers in this category include for example acrylates —[(ROCO)CHCH$_2$]— (acrylic acid, methyl acrylate, ethyl acrylate, butyl acrylate, etc. . . . ), methacrylates —[(ROCO)C(Me)CH$_2$]— (methacrylic acid, methyl methacrylic acid, etc. . . . ), styrene, ethylene, propylene, N-vinyl acrylamide, N-vinylpyrrolidone. For example, at least one polymerizable component may be selected from monomers, prepolymers, dimers, trimers or oligomers containing at least one C═C bond that is conjugated with an aryl moiety, a carboxyl group, or another double bond. For example, at least one polymerizable component may be selected from conjugated carboxylic acids such as acrylic acid, methacrylic acid, itaconic acid, crotonic acid, isocrotonic acid, maleic acid, and esters and amides thereof; or styrene, ethylene, propylene, N-vinyl acrylamide, or N-vinylpyrolidone.

For example, at least one polymerizable component may be an acrylate or methacrylate monomer. For example, at least one polymerizable component may be an acrylate monomer such as trimethylolpropane triacryalate (TMPTA). For example, at least one polymerizable component may be a methacrylate monomer such as (hydroxypropyl)methacrylate (HPMA), 1,4-butanediol dimethacrylate (1,4-BDDMA), 1,6-Bismethacryloxy-2-ethoxycarbonylamino-2,4,4-trimethylhexane (BMATMH) or methacrylate functionalized prepolymers such as aliphatic and aromatic diurethane dimethacrylates, for example UDMA.

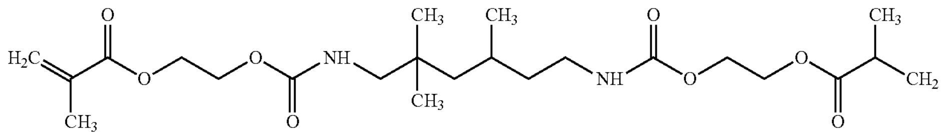

UDMA

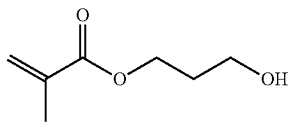

HPMA

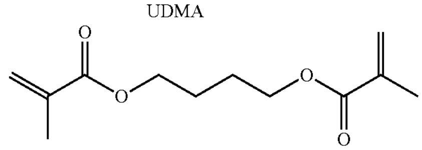

1,4-BDDMA

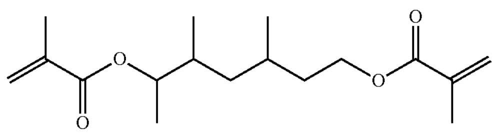

BMATMH

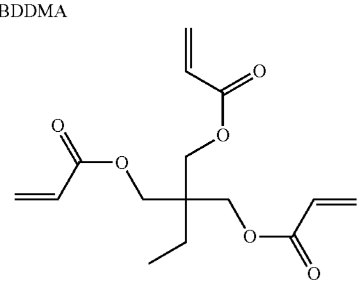

TMPTA

Advantageously, the polymerizable component may be a mixture of two or more monomers, prepolymers, dimers, trimers or oligomers containing at least one C═C bond that is conjugated with an aryl moiety, a carboxyl group, or another double bond, as described immediately above. For example, it may be a mixture of at least two compounds selected from methacrylate monomers such as HPMA, 1,4-BDDMA, BMATMH and methacrylate functionalized prepolymers such as aliphatic and aromatic diurethane dimethacrylates (e.g., UDMA). A preferred polymerizable component include mixtures of HPMA, 1,4-BDDMA and aliphatic and aromatic diurethane dimethacrylates such as UDMA, for example Mix-Ma as described herein.

Preferably the at least one polymerizable component may be selected from acrylates and methacrylates or mixture thereof, such as:

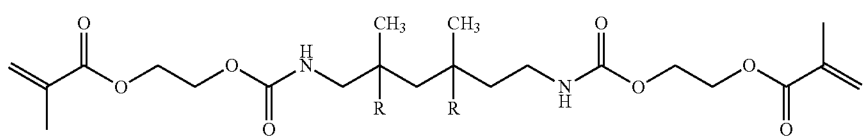

UDMA
R = H or $CH_3$ (~1:1)
33 wt %

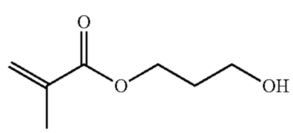

HPMA
33 wt %

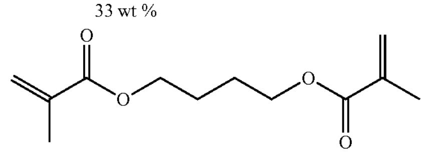

1,4-BDDMA
33 wt %

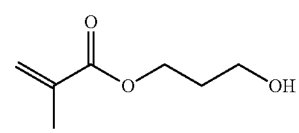

HPMA

Mix-MA

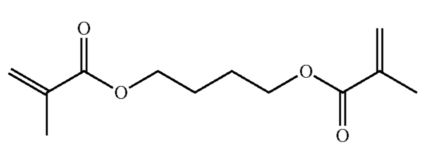

1,4-BDMA

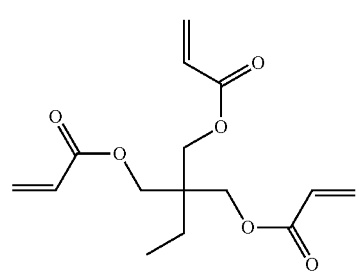

TMPTA or a mixture of two or more of them, most preferably a 1:1:1 mixture by weight of HPMA, 1,4-BDMA and UDMA.

Heat-Generating Dye

Advantageously, the heat-generating dye may be any suitable dye that generates heat when exposed to a 625-2500 nm light source (i.e., when exposed to irradiation in the red to near-infrared), for example when exposed to a 625-1500 nm light irradiation. Advantageously, the heat-generating dye, when exposed to red to near-infrared irradiation, may generate an exotherm within the decomposition temperature range of the thermal initiator further defined herein (i.e., the decomposition temperature of the thermal initiator is reached), so that the exotherm triggers decomposition of the thermal initiator into free radicals (homolytic cleavage) which in turn triggers the polymerization process. If accelerated polymerization is desired, the choice of heat-generating dye may be made on a dye that generates an exotherm greater than the decomposition temperature range of the thermal initiator, when exposed to red to near infrared irradiation. As the reader will appreciate, the choice of the thermal initiator (with high, intermediate or low decomposition temperature) can be made depending on the application that is targeted/desired, and the temperature that the system can tolerate. This, together with the fact that low intensity red-NIR irradiation makes it possible to very finely control the temperature, provides to the system according to the present invention a great versatility in terms of fine-tuning the temperature, and the polymerization process, which is a notable advantage over existing systems.

Advantageously, the heat-generating dye may comprise a cyclic or acyclic conjugated system containing 2 or 4 heteroatoms selected from N or S the lone pair of which may participate in the conjugated system; wherein the heat-generating dye generates heat when exposed to a 625-2500 nm light source, for example when exposed to a 625-1500 nm light irradiation. Advantageously, the heat-generating dye may comprise:

- an opened conjugated system containing two N or S atoms, preferably two N atoms, the lone pairs of which may participate in the conjugated system;
- a conjugated macrocyclic system containing four N or S atoms, preferably four N atoms, complexed to a single metal atom; preferably a metal atom that absorbs in the red to near-infrared region of 625-2500 nm, for example a metal atom that absorbs in the range 625-1500 nm;
- a metal complex comprising two bidentate conjugated ligands; each bidentate ligand containing two N or S atoms, preferably two S atoms, complexed to a single metal atom; preferably a metal atom that absorbs in the red to near-infrared region of 625-2500 nm, for example a metal atom that absorbs in the range 625-1500 nm.

Advantageously, the at least one heat-generating dye may be selected from:

(i) cyanine dyes;
(ii) squaraine and squarylium dyes;
(iii) push-pull compounds;
(iv) BODIPY and pyrromethene dyes;
(v) Dithiolene metal salt dyes;
(vi) Porphyrin dyes;
(vii) Copper complex dyes;
(viii) Phthalocyanine dyes;
or a mixture of one or more of the above.

The dyes may be tested for their ability to generate heat upon red-NIR irradiation by thermal imaging. For this characterization, an appropriate concentration of red-NIR dye is incorporated in the polymerizable resin and irradiated with the red-NIR light. Through thermal imaging experiments, the temperature of the resin can be recorded for different irradiation times. Thermal camera, thermocouple or pyrometer can also be used to record the temperature. Without the presence of the red-NIR-dye the temperature remains almost unchanged showing the role of the red-NIR dye as heater.

As used herein, the term "cyanine dye" does not deviate from the conventional meaning of the term in the art, and refers to a dye having an opened conjugated system where a moiety

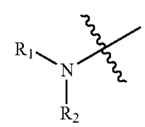

and a moiety

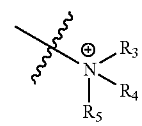

are covalently linked via a conjugated system of two or more double bonds, some of which may belong to an aromatic radical. A counter-ion $X^-$ is typically present to counterbalance the positive charge of the ammonium ion. Advantageously, $X^-$ may represent $Cl^-$, $I^-$, $ClO_4^-$, p-toluenesulfonate, p-dodecylbenzenesulfonate, or a borate anion, such as triphenylbutylborate. Advantageously, the counter ion $X^-$ may represent a borate anion. For example $X^-$ may represent triphenylbutylborate.

The expression "opened conjugated system" refers to the fact that the moieties

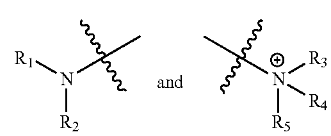

do not form a cycle together with the conjugated double bonds (i.e, the whole does not piggy-back together to form a cycle). However, the whole system may comprise one or more mono- or polycyclic alicyclic, heterocyclic, aromatic or heteroaromatic radicals. For example, cyanine dyes useable in the context of the invention include as synthetic dyes with the general formula $R_2N[CH{=}CH]_nCH{=}N{+}R_2$ or $R_2N{+}{=}CH[CH{=}CH]_nNR_2$ (n is a small number, typically 2-5) in which the nitrogen and part of the conjugated chain usually form part of a heterocyclic system, such as imidazole, pyridine, pyrrole, quinoline and thiazole, e.g. [18] Examples of such cyanine dyes useable as heat-generator according to the present invention include those depicted in FIG. 1.

As used herein, the term "squaraine dye" does not deviate from the conventional meaning of the term in the art, and refers to a family of chromophores containing structures such as cyanine dyes, two donor groups conjugated to an electron deficient oxocyclobutenolate core, leading to a highly electron delocalized structure that can be exemplified as zwitterions. Generally, squaraine dyes with donor-acceptor-donor (D-A-D) structures are synthesized by the condensation reaction of 3,4-dihydroxy-3-cyclobutene-1,2-dione (squaric acid) with activated aromatic or heterocyclic components [19] Examples of such squaraine dyes useable as heat-generator according to the present invention include those depicted in FIG. 2.

As used herein, the term "push-pull dye" does not deviate from the conventional meaning of the term in the art, and refers to organic pi-systems end-capped with an electron donor (D) and an electron acceptor (A) at each side of the pi-system. Interaction between A and D allows intramolecular charge-transfer (ICT) and a new low-energy molecular orbital is formed. Thus, it is easier to achieve excitation of electrons in the molecular orbital at longer wavelength. Typical electron donors D are represented by the substituents with +M/+I effects such as OH, $NH_2$, OR and $NR_2$, heterocyclic moieties. . . . On the other hand, the most used electron acceptors A involve substituents featuring M/I effects such as $NO_2$, CN, CHO, electron deficient heterocyclic compounds . . . [20] (cf. FIG. 33). Examples of such push-pull dyes useable as heat-generator according to the present invention include that depicted in FIG. 3.

As used herein, the term "BODIPY" does not deviate from the conventional meaning of the term in the art, and refers to boron-dipyrromethene type compounds, which is a class of fluorescent dyes. It is composed of dipyrromethene complexed with a disubstituted boron atom, typically a BF2 unit. [21] An example of such BOPIDY dyes useable as heat-generator according to the present invention include that depicted in FIG. 4.

As used herein, the term "dithiolene dye" does not deviate from the conventional meaning of the term in the art, and refers to metal complexes including unsaturated bidentate ligands containing two sulfur donor atoms (e.g., dithiolene ligands attached to a central metal). They may be also referred to as "metallodithiolene dyes". Generally, the metal used is nickel, palladium or platinum and is in a zerovalent state. Dithiolene ligands are unsaturated bidentate ligand wherein the two donor atoms are sulfur. This formed square planar complexes. Because of the extensive electron delocalization about the dithiolene ring system and the interaction of this delocalized system's available d-orbitals on the central metal, strong NIR absorption is observed with these compounds. [22]

Advantageously, a dithiolene dye useable as heat-generator according to the present invention include:

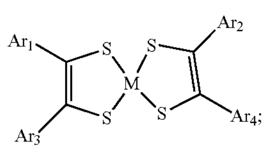

wherein M represents a metal center that absorbs in the red to near-infrared region of 625-2500 nm, for example a metal atom that absorbs in the range 625-1500 nm, such as Ni; and $Ar_1$, $Ar_2$, $Ar_3$, and Ara independently represent a $C_{6-10}$ aryl; wherein each aryl moiety may be, individually, further substituted with one or more substituents, such as OH, —OR, halogen atom, —$NO_2$, —CN, —$NR^A_1R^A_2$, —NHC(═O)$R^A_3$, —OC(═O)$R^A_3$, vinyl, or linear or branched $C_{1-10}$ alkyl or $C_{6-10}$ aryl moieties; wherein R and $R^A_3$ independently represent a linear or branched $C_{1-10}$ alkyl or $C_{6-10}$ aryl moiety; and $R^A_1$ and $R^A_2$ independently represent H or linear or branched $C_{1-6}$ alkyl or $C_{6-10}$ aryl moieties, where $R^A_1$ and $R^A_2$, taken together with the nitrogen atom to which they are attached, may form a 5- or 6-membered heterocyclic moiety; wherein each of the foregoing aryl moieties may be, individually, further substituted with one or more linear or branched $C_{1-6}$ alkyl or $C_{6-10}$aryl moieties. Advantageously, $Ar_1$, $Ar_2$, $Ar_3$, and Ara may independently represent a phenyl moiety; wherein each phenyl moiety may be, individually, further substituted with one or more substituents, such as those as described immediately above, preferably linear or branched $C_{1-6}$alkyl moieties, including methyl, propyl, butyl, i-propyl.

Examples of such dithiolene dyes useable as heat-generator according to the present invention include those depicted in FIG. 5.

As used herein, the term "porphyrin dye" does not deviate from the conventional meaning of the term in the art, and refers to conjugated heterocyclic macrocycle metal complexes comprising four modified pyrrole subunits interconnected at their a carbon atoms via methine bridges (═CH—).

Advantageously, a porphyrin dye useable as heat-generator according to the present invention may have a heterocyclic conjugated system having the structure:

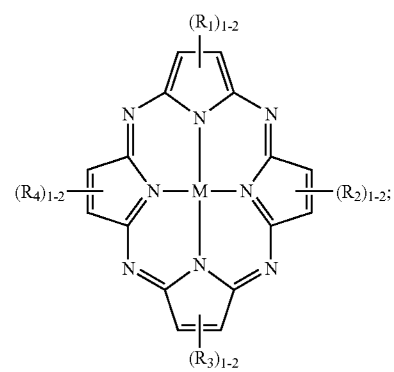

wherein M represents a metal center that absorbs in the red to near-infrared region of 625-2500 nm, for example a metal atom that absorbs in the range 625-1500 nm, such as Mg or Cu; and each occurrence of $R_1$, $R_2$, $R_3$, and $R_4$ may independently represent H, —C(═O)$OR_5$, vinyl, a linear or branched $C_{1-10}$ alkyl or a $C_{6-10}$aryl moiety; wherein $R_5$, for each occurrence, may independently represent H or an alkali metal cation such as $Na^+$; and wherein each of the foregoing alkyl or aryl moieties may be, individually, further substituted with one or more linear or branched $C_{1-6}$ alkyl or $C_{6-10}$ aryl moieties.

Examples of such porphyrin dyes useable as heat-generator according to the present invention include chlorophyllin sodium copper salt depicted in FIG. 6.

As used herein, the term "copper complex dye" does not deviate from the conventional meaning of the term in the art, and refers to conjugated oxygen-containing systems (acetylacetonate derivatives) comprising either one of the following basic motifs:

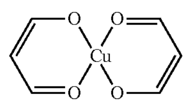

or

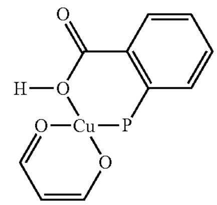

each of which may bear one or more alkyl and/or aryl substituents.

Examples of such copper complex dyes useable as heat-generator according to the present invention include those depicted in FIG. 7.

As used herein, the term "phthalocyanine dye" does not deviate from the conventional meaning of the term in the art, and refers to conjugated macrocycles which, depending on how they were synthesized, contain different metal or metalloid inclusions. Advantageously, a phthalocyanine dye useable as heat-generator and photoredox electron donor may have a cyclic conjugated system having the structure:

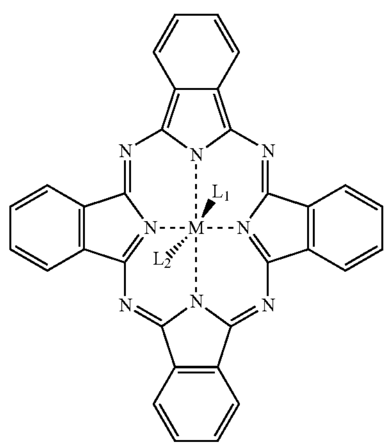

wherein M represents a metal center, for example Mn, and $L_1$ and $L_2$ independently represent acyloyl ligands or may be absent, depending on the metal atom valency. Examples of such phthalocyanine dyes useable as heat-generator and photoredox electron donor for dual RED-NIR thermal/photochemical polymerization include Manganese (II) phthalocyanine depicted on FIG. 8.

Preferably the at least one heat-generating dye may be selected from any one or more of the dyes depicted on FIGS. 1-8 and/or in the Examples of this document, most preferably cyanine dyes such as those depicted in FIG. 1.

Advantageously, the at least one heat-generating dye may be a cyanine dye, squaraine or squarylium dye, a push-pull dye, a BODIPY or pyrromethene dye, a porphyrin dye, a copper complex dye, or a phthalocyanine dye, in the form of a borate salt; preferably a cyanine dye in the form of a borate salt, more preferably:

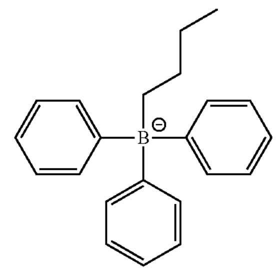

IR-140⊕ or

IR-780⊕ or

IR-813⊕ with

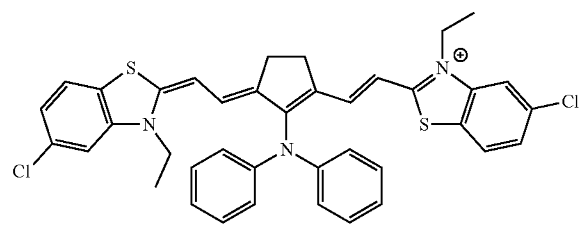

IR-140⊕

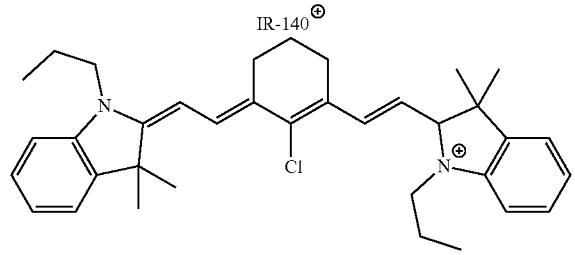

IR-780⊕

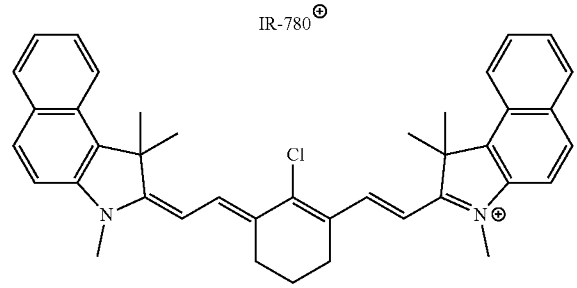

IR-813⊕ most preferably IR-780 borate.

The dye performance as heat generator may vary with the irradiation wavelength and/or intensity. As such, both parameters (irradiation wavelength and/or intensity) may therefore be used to tune the dye performance for polymerizing a given resin (polymerizable component) by photothermal free radical polymerization.

Advantageously, the heat generating dye may be used in about 0.001% w/w to <0.5% w/w, preferably 0.001-0.4% w/w, preferably 0.001-0.3% w/w, more preferably ≤0.25% w/w, still more preferably ≤0.20% w/w, most preferably ≤0.15% w/w, most preferably ≤0.10% w/w, yet most preferably about 0.1% w/w or even <0.1% w/w, based on the total weight of the composition to be polymerized; i.e. total weight of polymerizable component+heat generating dye+ thermal initiator. For example the heat generating dye may be used in about 0.005% w/w, 0.007% w/w, 0.009% w/w, 0.01% w/w, 0.02% w/w, 0.03% w/w, 0.04% w/w, 0.05% w/w, 0.06% w/w, 0.07% w/w, 0.08% w/w, 0.09% w/w, 0.10% w/w, 0.11% w/w, 0.12% w/w, 0.13% w/w, 0.14% w/w, 0.15% w/w, 0.16% w/w, 0.17% w/w, 0.18% w/w, 0.19% w/w, 0.20% w/w, based on the total weight of the composition to be polymerized; i.e. total weight of polymerizable component+heat generating dye+thermal initiator. Advantageously, the heat generating dye may be used in about <0.50% w/w, preferably ≤0.40% w/w, preferably ≤0.30% w/w, preferably ≤0.20% w/w, preferably ≤0.15% w/w, preferably ≤0.10% w/w, most preferably ≤0.08% w/w of the total weight of the composition to be polymerized.

Thermal Initiator

Advantageously, the at least one thermal initiator may be selected from any suitable thermal initiator known in the art. The thermal initiator is preferably a compound having a decomposition temperature that is compatible with the polymerization to be carried out (the compound's decomposition temperature should not be too high otherwise thermal initiation of the polymerization process will not occur). For example, thermal initiators having a decomposition temperature in the order of 50-180° C. may be used. As used herein the term "decomposition temperature" or "dissociation temperature" refers to the temperature at which the thermal initiator undergoes homolytic cleavage to generate two free radicals upon exposure to the heat generated in its surroundings (e.g., in the composition). For example, mention may be made of tert-Amyl peroxybenzoate; tert-Amyl peroxybenzoate; 1,1'-Azobis(cyclohexanecarbonitrile); 2,2'-Azobisisobutyronitrile (AIBN); Benzoyl peroxide; 2,2-Bis(tert-butylperoxy)butane; 1,1-Bis(tert-butylperoxy)cyclohexane; 2,5-Bis(tert-butylperoxy)-2,5-dimethylhexane; 2,5-Bis(tert-Butylperoxy)-2,5-dimethyl-3-hexyne; Bis(1-(tert-butylperoxy)-1-methylethyl)benzene; 1,1-Bis(tert-butylperoxy)-3,3,5-trimethylcyclohexane; tert-Butyl hydroperoxide; tert-Butyl peracetate; tert-Butyl peroxide; tert-Butyl peroxybenzoate; tert-Butylperoxy isopropyl carbonate; Cumene hydroperoxide; Cyclohexanone peroxide; Dicumyl peroxide; Lauroyl peroxide; 2,4-Pentanedione peroxide; Peracetic acid or Potassium persulfate. Additional examples include 2-butanone peroxide, $H_2O_2$, ME 60 L® peroxane (mixture of 2-butanone peroxide and $H_2O_2$ for example in dimethyl phthalate and butanone), dibenzoyle peroxide (perkadox CH50X®), tert-butyl peroxide), or cumyl hydroperoxide (trigonox 239®).

As discussed previously, the choice of the thermal initiator (with high, intermediate or low decomposition temperature) can be made depending on the application that is targeted/desired, and the temperature that the system can tolerate. Decomposition temperatures of conventional thermal initiators are known and can be procured readily, for example from commercial suppliers of such compounds.

Advantageously, the at least one thermal initiator may be selected from:

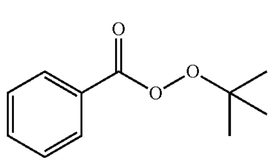

Luperox P

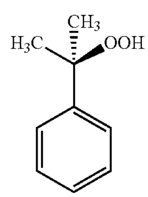

Cumene hydroperoxide

-continued

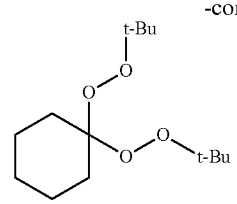

Luperox 331M80

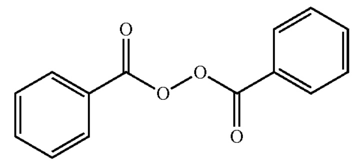

Benzoyl peroxide

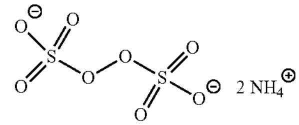

Ammonium persulfate

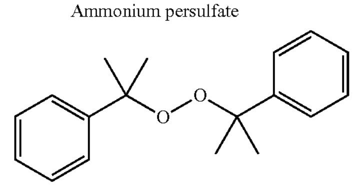

dicumylperoxide

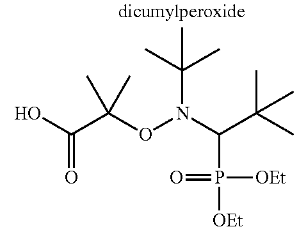

BlocBuilder MA

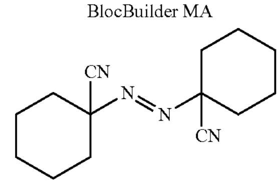

1,1'Azobis(cyclohexanecarbonitrile)

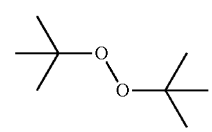

Tert-butylperoxide

A preferred thermal initiator is BlocBuilder MA.

Advantageously, the thermal initiator may be used in about 0.1-5.0% w/w, preferably 0.5-5.0% w/w, preferably 0.5-4.0% w/w, more preferably 0.5-4.0% w/w, still more preferably 1.0-4.0% w/w, yet more preferably 1.0-3.0% w/w, yet more preferably 2.0-3.0 w/w, most preferably about 2% w/w, based on the total weight of the composition to be polymerized; i.e. total weight of polymerizable component+heat generating dye+thermal initiator. For example the thermal initiator may be used in about 0.5% w/w, 1.0% w/w, 1.5% w/w, 2.0% w/w, 2.5% w/w, 3.0% w/w, 3.5% w/w, 4.0% w/w, 4.5% w/w, 5.0% w/w, based on the total weight of the composition to be polymerized; i.e. total weight of polymerizable component+heat generating dye+thermal initiator.

The heat generating dye, thermal initiator, polymerizable component and irradiation light source may be as defined in any variant described herein.

Advantageously, the following proportions of components may be used:

the heat generating dye may be used in about 0.001% w/w to <0.5% w/w, preferably 0.001-0.4 w/w, preferably 0.001-0.3% w/w, more preferably ≤0.25% w/w, still more preferably ≤0.20% w/w, most preferably ≤0.15% w/w, most preferably ≤0.10% w/w, yet most preferably about 0.1% w/w or even <0.1% w/w. For example the heat generating dye may be used in about 0.005% w/w, 0.007% w/w, 0.009% w/w, 0.01% w/w, 0.02% w/w, 0.03% w/w, 0.04% w/w, 0.05% w/w, 0.06% w/w, 0.07% w/w, 0.08% w/w, 0.09% w/w, 0.10% w/w, 0.11% w/w, 0.12% w/w, 0.13% w/w, 0.14% w/w, 0.15% w/w, 0.16% w/w, 0.17% w/w, 0.18% w/w, 0.19% w/w, 0.20% w/w. Advantageously, the heat generating dye may be used in about <0.50% w/w, preferably ≤40% w/w, preferably ≤0.30% w/w, preferably ≤0.20% w/w, preferably ≤0.15% w/w, preferably ≤0.10% w/w, most preferably ≤0.08% w/w;

the thermal initiator may be used in about 0.1-5.0% w/w, preferably 0.5-5.0% w/w, preferably 0.5-4.0% w/w, more preferably 0.5-4.0% w/w, still more preferably 1.0-4.0% w/w, yet more preferably 1.0-3.0% w/w, yet more preferably 2.0-3.0% w/w, most preferably about 2% w/w. For example the thermal initiator may be used in about 0.5% w/w, 1.0% w/w, 1.5% w/w, 2.0% w/w, 2.5% w/w, 3.0% w/w, 3.5% w/w, 4.0% w/w, 4.5% w/w, 5.0% w/w;

all % w/w being expressed based on the total weight of the composition to be polymerized; i.e. total weight of polymerizable component+heat generating dye+thermal initiator.

Dual Red-NIR-Initiated Thermal, and Photochemical Polymerization

Advantageously, the heat-generating dye may also have the additional property of being an electron donor. In that case, in addition to generating heat upon exposure to a 625-2500 nm light source of intensity<10 W/cm$^2$; the dye used may also function as absorbing moiety under the same irradiation conditions, in a photoredox process, to form a dye.$^+$ radical. In other words, the dye may function as dual heat-generator and photoredox electron donor, to effect free radical polymerization in a dual thermal/photochemical process.

Example of such dyes that may function both as heat-generator and photoredox electron donor include cyanine dyes, squaraine or squarylium dyes, push-pull dyes, BODIPY or pyrromethene dyes, porphyrin dyes, copper complex dyes, or phthalocyanine dyes.

Examples of such cyanine dyes that may function both as heat-generator and photoredox electron donor under exposure to a 625-2500 nm light source of intensity<10 W/cm$^2$ include the cyanine dyes depicted in FIG. 1, the squaraine dyes depicted in FIG. 2, the push-pull dyes depicted in FIG. 3, BOPIDY-1, the dithiolene dyes depicted in FIG. 5, CISC depicted in FIG. 6, and Mn(II)-Ph depicted in FIG. 8.

Preferably, any one or more of the cyanine dyes of FIG. 1 may be used as heat-generator and photoredox electron donor dye, preferably in the form of a borate salt, most preferably IR-780 borate.

Some cyanine dyes will perform better as heat-generator (for example IR-780), while others will perform better as photoredox electron donor (for example IR-140). The cyanine dye performance in either mode (heat generator or as photoredox electron donor) may vary with the irradiation wavelength and/or intensity. As such, the latter parameters (irradiation wavelength and/or intensity) may therefore be used to tune the dye performance for polymerizing a given resin (polymerizable component).

Borate cyanine dyes may be particularly advantageous. When the cyanine borate dye is photoirradiated, electron transfer between the dye and the counter ion allows a recombination of dye radical to give a colorless dye. This process facilitates the bleaching, and ultimately, the recycling of the paper several times. This bleaching property can also be very interesting for photopolymerization. Going from green to colorless while polymerizing, light can penetrate deeper in the sample and so thicker samples can be polymerized.

When dual Red-NIR thermal/photochemical polymerization is desired, the dye will be combined with:

an oxidizing agent suitable for a polymerization reaction and capable of generating free radicals and/or cations by electron transfer from the dye when exposed to a 625-2500 nm light source; and optionally a reducing agent suitable for regenerating the dye.

An oxygen scavenger may optionally be used in addition. Alternatively or additionally, the reducing agent suitable for regenerating the dye may also be an oxygen scavenger (i.e., it may function as a compound to overcome the oxygen inhibition).

The selection of the polymerization mode may be effected by properly choosing the starting materials, as illustrated in the Table below. Namely:

Photothermal mode: no iodonium salt, nor phosphine reducing agent

Dual photothermal/photochemical: presence of thermal initiator, combined with an iodonium salt and phosphine reducing agent

| | Pure photochemical (outside scope of the present invention) | Photothermal | Dual photothermal/ photochemical |
|---|---|---|---|
| Polymerizable component | Y | Y | Y |
| Dye | Y | Y | Y |
| Thermal initiator | — | Y | Y |
| Iodonium salt | Y | — | Y |
| Phosphine reducing agent | Y | — | Y |
| Oxygen scavenger | Optionally present | Optionally present | Optionally present |

As such, there is provided herein a photo-initiating composition suitable for dual Red-NIR thermal/photochemical polymerization comprising:

(a) a suitable dye that functions both as heat-generator and photoredox electron donor when exposed to a 625-2500 nm light source;

(b) an oxidizing agent suitable for a polymerization reaction and capable of generating free radicals and/or cations by electron transfer from the dye when exposed to a 625-2500 nm light source;

(c) a reducing agent suitable for regenerating the dye; and (d) optionally, an oxygen scavenger.

As used herein, "dye that functions both as heat-generator and photoredox electron donor when exposed to a 625-2500 nm light source" will be understood to mean that the dye generates heat and functions as photoredox electron donor when exposed to a single light source emitting at a given wavelength that is selected in the red-NIR range (625-2500 nm). For example, the dye may both generate heat and function as photoredox electron donor when irradiated at 785 nm. In another example, the dye may both generate heat and function as photoredox electron donor when irradiated at 940 nm.

The dye performance in either functional mode (heat generator or as photoredox electron donor) may vary with the irradiation wavelength and/or intensity. As such, both parameters (irradiation wavelength and/or intensity) may therefore be used to tune the dye performance for polymerizing a given resin (polymerizable component) by dual photothermal/photochemical free radical polymerization.

Advantageously, the dye that functions both as heat-generator and photoredox electron donor may be used in the same amount (% w/w) as that indicated supra for the heat generating dye.

The oxidizing agent (b) may be selected from an onium salt (for example an iodonium or a sulfonium salt of formula $(R_A)_2I^+X_A^-$ or $(R_A)_3S^+X_A^-$; wherein each occurrence of $R_A$ independently represents a $C_{6-10}$ aryl or a $C_{1-10}$ alkyl moiety; wherein each aryl moiety may be, individually, further substituted with one or more linear or branched $C_{1-6}$ alkyl or $C_{6-10}$ aryl moieties; and $X_A^-$ represents a suitable counter ion). For example each occurrence of $R_A$ may independently represent a phenyl or a $C_{1-10}$ alkyl moiety; wherein each phenyl moiety may be, individually, further substituted with one or more linear or branched $C_{1-6}$ alkyl or $C_{6-10}$ aryl moieties. For example, the phenyl moiety may bear one or more methyl, ethyl, n-propyl, i-propyl, t-butyl groups, preferably in para position relative to the iodine atom. In exemplary embodiments, $X_A^-$ may represent $B(PhF_6)_4^-$, $PF_6^-$, $SbF_6^-$ or $Cl^-$. Preferably, $X_A^-$ may represent $B(PhF_6)_4^-$ or $PF_6^-$, most preferably $B(PhF_6)_4^-$.

Advantageously, the oxidizing agent (b) may be an iodonium salt of formula $(R_A)_2I+X_A^-$, as defined and described in any variant above and herein. Advantageously, the oxidizing agent may be:

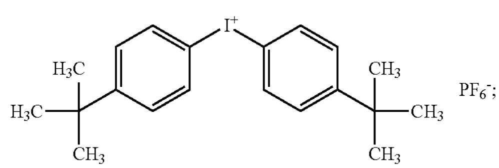

$Ar_2I/PF_6^-$

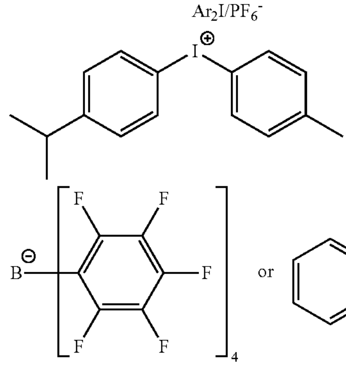

or

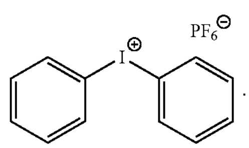

Advantageously, the oxidizing agent may be used in about 0.1-5.0% w/w, preferably 0.5-5.0% w/w, preferably 0.5-4.0% w/w, more preferably 1-4.0% w/w, still more preferably 2.0-4.0% w/w, most preferably about 3% w/w, based on the total weight of the composition to be polymerized; i.e. total weight of polymerizable component+heat generating dye+thermal initiator+oxidizing agent+reducing agent. For example the oxidizing agent may be used in about 0.5% w/w, 1.0% w/w, 1.5% w/w, 2.0% w/w, 2.5% w/w, 3.0% w/w, 3.5% w/w, 4.0% w/w, 4.5% w/w, 5.0% w/w, based on the total weight of the composition to be polymerized; i.e. total weight of polymerizable component+heat generating dye+thermal initiator+oxidizing agent+reducing agent.

Advantageously, the reducing agent (c) may be any reducing agent suitable for regenerating the dye (a) that will have undergone photoredox process (when the dye functions as electron donor). In the initial stages of the photo-initiating process, the dye (which may function as electron donor when exposed to a 625-2500 nm light source, for example when exposed to a 625-1500 nm light irradiation) absorbs in the red-NIR range to release an electron and form a radical $dye.^+$. The expression "regenerate the absorbing dye (a)", as used in the context of the present invention, refers to the process of reverting a $dye.^+$ radical back to the initial neutral dye molecule. As such, advantageously, the reducing agent (RA) may preferably be able to revert $dye.^+$ radicals back to the initial neutral dye molecules, as follows:

$$dye.^+ + RA \longrightarrow dye + RA.^+$$

Examples of suitable reducing agents include phosphine compounds/phosphine-based reducing agents (for example 4-(diphenylphosphino)benzoic acid (4-dppba), 2-diphenylphosphinobenzoic acid (2-dppba), bis(2-diphenylphosphinophenyl)-ether (2-dpppe), triomethoxyphenylphosphine (triompp), DPBP bidentate phosphine (DPBP), 4-dimethylaminophenyldiphenylphosphine (4-dmapdp), (R,R) dach phenyl trost (trost), triphenylphosphine (tpp)); and amine compounds/amine-based reducing agents (for example Ethyl 4-dimethylaminobenzoate (EDB), 4-(dimethylamino) phenylacetic acid (ADP), triphenylamine (TPA), N,N-dibutylaniline (DBA), N-Ethyl-N-isopropylaniline (EIPA), 3-(dimethylamino)benzyl alcohol (3-dmaba or "DABA")). Other suitable amine-based reducing agents include N-phenyl glycine or other aromatic amines.

Advantageously, the reducing agent (c) may be a phosphine-based reducing agent from the class $P(R_{B1})_3$, wherein each occurrence of $R_{B1}$ independently represents a $C_{6-10}$ aryl; wherein any of the foregoing aryl moieties may be independently further substituted with one or more —C(═O)OH, —C(═O)$OR_{B2}$, or a linear or branched $C_{1-6}$ alkyl or $C_{6-10}$ aryl moieties; wherein $R_{B2}$ independently represents a $C_{6-10}$ aryl or a $C_{1-10}$ alkyl moiety. Advantageously, the reducing agent (c) may be from the class $(Ph)_2PR_{B1}$, wherein RBI independently represents a $C_{6-10}$ aryl moiety optionally further substituted with one or more —C(═O)OH, —C(═O)$OR_{B2}$, or a linear or branched $C_{1-6}$ alkyl or $C_{6-10}$ aryl moieties; wherein $R_{B2}$ independently represents a $C_{6-10}$ aryl or a $C_{1-10}$ alkyl moiety. Preferably the reducing agent (c) may be from the class $(Ph)_2PR_{B1}$, wherein $R_{B1}$ represents a $C_6$ aryl moiety bearing one or more —C(═O)OH or —C(═O)$OR_{B2}$ moieties, wherein $R_{B2}$ independently represents a $C_{6-10}$ aryl or a $C_{1-10}$ alkyl moiety. For example, the reducing agent (c) may be 4-(diphenylphosphino)benzoic acid (4-dppba).

Advantageously, the reducing agent (c) may be an aromatic amine-based compound having formula (I):

(I)

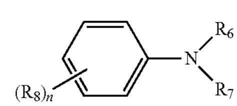

wherein n represents an integer from 0 to 3, preferably 0-2, most preferably 0 or 1;

$R_6$ and $R_7$ may independently represent H, —C1-6alkyl or —C1-6alkylC(═O)OR$_9$, where $R_9$ represents H or C1-6alkyl; and $R_8$ may independently represent —C1-6alkyl-OH or —C1-6alkylC(═O)OR$_{10}$, where $R_{10}$ represents H or C1-6alkyl.

Advantageously, at least one of $R_6$ or $R_7$ is not H.

Advantageously, n may represent 0, $R_6$ may represent H and $R_7$ may represent —C1-6alkylC(═O)OR$_9$, where $R_9$ represents H or C1-6alkyl.

Advantageously, n may represent 1, $R_8$ may represent —C1-6alkyl-OH, and $R_6$ and $R_7$ may independently represent C1-6alkyl.

Advantageously, the reducing agent (c) may be NPG or DABA:

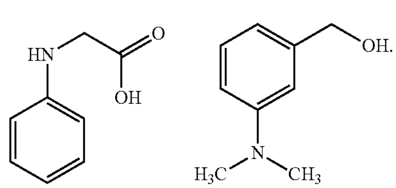

NPG DABA

Advantageously, the reducing agent may be used in about 0.1-5.0% w/w, preferably 0.5-5.0% w/w, preferably 0.5-4.0% w/w, more preferably 1.0-4.0% w/w, still more preferably 1.0-3.0% w/w, most preferably about 2% w/w, based on the total weight of the composition to be polymerized; i.e. total weight of polymerizable component+heat generating dye+thermal initiator+oxidizing agent+reducing agent. For example the oxidizing agent may be used in about 0.5% w/w, 1.0% w/w, 1.5% w/w, 2.0% w/w, 2.5% w/w, 3.0% w/w, 3.5% w/w, 4.0% w/w, 4.5% w/w, 5.0% w/w, based on the total weight of the composition to be polymerized; i.e. total weight of polymerizable component+heat generating dye+thermal initiator+oxidizing agent+reducing agent.

Advantageously, an oxygen scavenger (d) may be used in the dual RED-NIR thermal/photochemical photo-initiating composition according to the invention to facilitate polymerization in cases where unwanted peroxide radicals are formed during the polymerization process (for example when the polymerization is carried in the presence of oxygen gas (e.g., under air or ambient atmosphere). Advantageously, when an oxygen scavenger is used it should be compatible with the photopolymerization reaction that is intended (free radical, cationic or dual free radical/cationic): it preferably does not interfere with active species that promote the type of polymerization reaction that is being carried out. For example, the oxygen scavenger preferably does not interfere with free radical formation and/or cation formation.

For example, when polymerization is performed under air, certain polymerizable components (such as methacrylates) may be sensitive to the oxygen present in the air. In such cases, peroxyl radicals may be generated in the course of polymerization that are too stable to allow polymerization to proceed (in other words, polymerization is inhibited). The oxygen scavenger helps to overcome oxygen inhibition by reacting with the peroxyl radicals to yield less stable radicals, which in turn can allow for the polymerization to proceed/continue. Any commonly used oxygen scavenger for facilitating polymerization may be further used as part of the photo-initiating composition of the invention. Examples of such oxygen scavengers include potassium sulfite, unsaturated hydrocarbons, and ascorbic acid derivatives.

Advantageously, the reducing agent (c) and the oxygen scavenger (d) may be one and the same compound (in other words, the same compound may serve as reducing agent (c) and oxygen scavenger (d)). For example, any one of the phosphine reducing agents (c) above may also function as oxygen scavenger. As such, advantageously, the oxygen scavenger (d) may be a phosphine-based compound from the class $P(R_{B1})_3$, wherein each occurrence of $R_B$, independently represents a $C_{6-10}$aryl; wherein any of the foregoing aryl moieties may be independently further substituted with one or more —C(═O)OH, —C(═O)OR$_{B2}$, or a linear or branched $C_{1-6}$ alkyl or $C_{6-10}$ aryl moieties; wherein $R_{B2}$ independently represents a $C_{6-10}$ aryl or a $C_{1-10}$ alkyl moiety. Advantageously, the oxygen scavenger (d) may be from the class $(Ph)_2PR_{B1}$, wherein $R_{B1}$ independently represents a $C_{6-10}$ aryl moiety optionally further substituted with one or more —C(═O)OH, —C(═O)OR$_{B2}$, or a linear or branched $C_{1-6}$ alkyl or $C_{6-10}$ aryl moieties; wherein $R_{B2}$ independently represents a $C_{6-10}$ aryl or a $C_{1-10}$ alkyl moiety. Preferably the oxygen scavenger (d) may be from the class $(Ph)_2PR_{B1}$, wherein $R_{B1}$ represents a $C_6$aryl moiety bearing one or more C(═O)OH or —C(═O)OR$_{B2}$ moieties, wherein $R_{B2}$ independently represents a $C_{6-10}$ aryl or a $C_{1-10}$ alkyl moiety. For example, the oxygen scavenger (d) may be 4-(diphenylphosphino)benzoic acid (4-dppba).

As such, in another aspect, the present invention relates to a composition dually thermally and photochemically curable on demand under the triggering action of red to near-infrared irradiation of intensity<10 W/cm$^2$ comprising:

(a) <0.50% w/w, preferably ≤0.10% w/w, most preferably ≤0.08% w/w of the total weight of the composition, of at least one dye that functions both as heat-generator and photoredox electron donor when exposed to a 625-2500 nm light source of intensity<10 W/cm$^2$;

(b) at least one thermal initiator preferably selected from peroxides, hydroperoxides, alkoxyamines, and azo compounds; and (c) at least one polymerizable component comprising a C═C bond polymerizable by free radical polymerization;

wherein the at least one thermal initiator undergoes homolytic cleavage to generate two free radicals upon exposure to the heat generated in the composition, without electron transfer from the dye;

wherein the composition further comprises an onium salt, and optionally:

a reducing agent suitable for regenerating the dye; and/or an oxygen scavenger.

The onium salt, reducing agent and oxygen scavenger may as described in any variant above.

Advantageously, in the composition dually thermally and photochemically curable on demand, the onium salt may be of formula $((R_A)_2I^+X_A^-$ or $(R_A)_3S^+X_A^-$; wherein each occurrence of $R_A$ independently represents a $C_{6-10}$ aryl or a $C_{1-10}$ alkyl moiety; wherein the aryl moiety may be, individually, further substituted with one or more linear or branched $C_{1-6}$ alkyl or $C_{6-10}$ aryl moieties; and wherein $X_A^-$ represents a suitable counter ion such as $B(PhF_6)_4^-$, $PF_6^-$, $SbF_6^-$ or $Cl^-$. Advantageously, the onium salt may be:

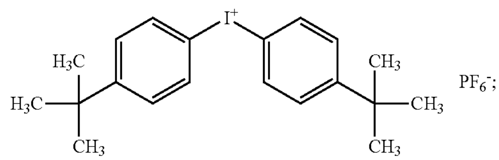

$Ar_2I/PF_6^-$

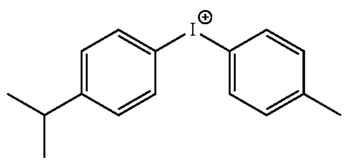

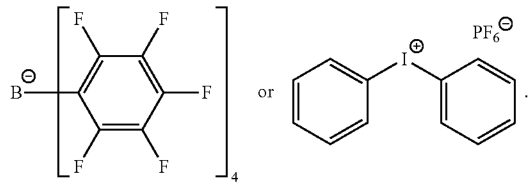

Advantageously, in the composition dually thermally and photochemically curable on demand, the reducing agent c) and the oxygen scavenger d) are one and the same compound, preferably a phosphine-based compound such as 4-(diphenylphosphino)benzoic acid (4-dppba).

Advantageously, in the composition dually thermally and photochemically curable on demand, the reducing agent may be selected from:

- phosphine compounds/phosphine-based reducing agents such as 4-(diphenylphosphino)benzoic acid (4-dppba), 2-diphenylphosphinobenzoic acid (2-dppba), bis(2-diphenylphosphinophenyl)-ether (2-dppe), triomethoxyphenylphosphine (triompp), DPBP bidentate phosphine (DPBP), 4-dimethylaminophenyldiphenylphosphine (4-dmapdp), (R,R) dach phenyl trost (trost), or triphenylphosphine (tpp)); and
- amine compounds/amine-based reducing agents such as Ethyl 4-dimethylaminobenzoate (EDB), 4-(dimethylamino)phenylacetic acid (ADP), triphenylamine (TPA), N,N-dibutylaniline (DBA), N-Ethyl-N-isopropylaniline (EIPA), or 3-(dimethylamino)benzyl alcohol (3-dmaba or "DABA")). Other suitable amine-based reducing agents include N-phenyl glycine or other aromatic amines such as those of formula (I) as defined herein.

For dual RED-NIR thermal/photochemical polymerization, the dual heat generator/photoredox electron donor dye, thermal initiator, polymerizable component, oxidizing agent (e.g. onium salt), reducing agent, irradiation light source, and optional oxygen scavenger may be as defined in any variant described herein.

Advantageously, the following proportions of components may be used:

- the dual heat generator/photoredox electron donor dye may be used in about 0.001% w/w to <0.5% w/w, preferably 0.001-0.4% w/w, preferably 0.001-0.3% w/w, more preferably ≤0.25% w/w, still more preferably ≤0.20% w/w, most preferably ≤0.15% w/w, most preferably ≤0.10% w/w, yet most preferably about 0.1% w/w or even <0.1% w/w. For example the dual heat generator/photoredox electron donor dye may be used in about 0.005% w/w, 0.007% w/w, 0.009% w/w, 0.01% w/w, 0.02% w/w, 0.03% w/w, 0.04% w/w, 0.05% w/w, 0.06% w/w, 0.07% w/w, 0.08% w/w, 0.09% w/w, 0.10% w/w, 0.11% w/w, 0.12% w/w, 0.13% w/w, 0.14% w/w, 0.15% w/w, 0.16% w/w, 0.17% w/w, 0.18% w/w, 0.19% w/w, 0.20% w/w. Advantageously, the dual heat generator/photoredox electron donor dye may be used in about <0.50% w/w, preferably ≤0.40% w/w, preferably ≤0.30% w/w, preferably ≤0.20% w/w, preferably ≤0.15% w/w, preferably ≤0.10% w/w, most preferably ≤0.08% w/w;
- the thermal initiator may be used in about 0.1-5.0% w/w, preferably 0.5-5.0% w/w, preferably 0.5-4.0% w/w, more preferably 0.5-4.0% w/w, still more preferably 1.0-4.0% w/w, yet more preferably 1.0-3.0% w/w, yet more preferably 2.0-3.0% w/w, most preferably about 2% w/w. For example the thermal initiator may be used in about 0.5% w/w, 1.0% w/w, 1.5% w/w, 2.0% w/w, 2.5% w/w, 3.0% w/w, 3.5% w/w, 4.0% w/w, 4.5% w/w, 5.0% w/w;
- the oxidizing agent may be used in about 0.1-5.0% w/w, preferably 0.5-5.0% w/w, preferably 0.5-4.0% w/w, more preferably 1-4.0% w/w, still more preferably 2.0-4.0% w/w, most preferably about 3% w/w. For example the oxidizing agent may be used in about 0.5% w/w, 1.0% w/w, 1.5% w/w, 2.0% w/w, 2.5% w/w, 3.0% w/w, 3.5% w/w, 4.0% w/w, 4.5% w/w, 5.0% w/w;
- the reducing agent may be used in about 0.1-5.0% w/w, preferably 0.5-5.0% w/w, preferably 0.5-4.0% w/w, more preferably 1.0-4.0% w/w, still more preferably 1.0-3.0% w/w, most preferably about 2% w/w, based on the total weight of the composition to be polymerized; i.e. total weight of polymerizable component+heat generating dye+thermal initiator+oxidizing agent+reducing agent. For example the oxidizing agent may be used in about 0.5% w/w, 1.0% w/w, 1.5% w/w, 2.0% w/w, 2.5% w/w, 3.0% w/w, 3.5% w/w, 4.0% w/w, 4.5% w/w, 5.0% w/w;

all % w/w being expressed based on the total weight of the composition to be polymerized; i.e. total weight of polymerizable component+dual heat generator/photoredox electron donor dye+thermal initiator+oxidizing agent (e.g. onium salt)+reducing agent.

The oxygen scavenger, if different from the reducing agent, may be used in a suitable amount conventionally used in photopolymerization processes to exercise its oxygen scavenging function.

Methods and Uses

In yet another aspect, the invention relates to the use of a heat-generating dye in combination with a thermal initiator for effecting a thermal free radical polymerization reaction triggered under the action of red to near-infrared irradiation of intensity<10 $W/cm^2$;

- wherein the thermal initiator is selected from peroxides, hydroperoxides, alkoxyamines, and azo compounds, and generates a free radical upon exposure to the heat generated by the heat-generating dye, without electron transfer from the dye; and wherein the heat-generating dye is present in an amount <0.50% w/w, preferably ≤0.10% w/w, most preferably ≤0.08% w/w of the total weight of the composition.

In yet another aspect, the invention relates to a process for thermal amplification of free radical polymerization comprising the step of exposing to red to near-infrared radiation of intensity<10 $W/cm^2$ a composition comprising at least one polymerizable component comprising a C═C bond polymerizable by free radical polymerization, in the presence of:

- <0.50% w/w, preferably ≤0.10% w/w, most preferably ≤0.08% w/w of at least one heat-generating dye, and at least one thermal initiator selected from peroxides, hydroperoxides, alkoxyamines, and azo compounds, wherein the heat-generating dye and the thermal initiator are as defined in any variant described herein.

Advantageously, the process further comprises a step of mixing or impregnating composite reinforcements with said composition prior to red to near-infrared irradiation.

Advantageously, the composite reinforcements may be any suitable reinforcements/charges known in the field of composites, particularly polymer composites. For example, the composite reinforcements may be glass fibers, carbon fibers, aramid fibers, basalt fibers, silica fibers, polymer fibers, natural fibers or a mixture of two or more of those.

Advantageously, the process according to the invention allows crosslinking/curing of the composition to occur throughout the whole thickness of the composition. For example, the sample to be cured/crosslinked is at least 1 cm thick, preferably at least 2 cm thick, mist preferably >3 cm thick.

Advantageously, the process according to the invention may be carried out in the presence of oxygen.

In yet another aspect, the invention relates to the use of a heat-generating dye as defined generally and in any variants herein, in association with a thermal initiator for controlling the onset of thermal free radical polymerization of a composition by the action of red to near-infrared irradiation of intensity<10 W/cm$^2$, the composition comprising at least one polymerizable component comprising a C═C bond polymerizable by free radical polymerization;

wherein the thermal initiator is selected from peroxides, hydroperoxides, alkoxyamines, and azo compounds, and generates a free radical upon exposure to the heat generated by the absorbing dye, without electron transfer from the dye; and wherein the heat-generating dye is present in an amount ≤0.10% w/w, preferably ≤0.09% w/w, most preferably ≤0.08% w/w of the total weight of the composition.

In yet another aspect, the invention relates to the use of a dye, as defined generally and in any variants herein, in association with:

a thermal initiator as defined generally and in any variants herein;

an oxidizing agent suitable for a polymerization reaction and capable of generating free radicals and/or cations by electron transfer from the dye when exposed to a 625-2500 nm light source; and optionally a reducing agent suitable for regenerating the dye;

for effecting dual thermal/photochemical free radical polymerization of a composition by the action of red to near-infrared irradiation of intensity<10 W/cm$^2$, the composition comprising at least one polymerizable component comprising a C═C bond polymerizable by free radical polymerization;

wherein the dye functions both as heat-generator and photoredox electron donor upon exposure to a 625-2500 nm light source of intensity<10 W/cm$^2$. The oxidizing agent and reducing agent may be as described generally and in any variants previously described. As discussed previously, an oxygen scavenger may optionally be used in addition. Also as previously described, the reducing agent suitable for regenerating the dye may also be an oxygen scavenger (i.e., it may function as a compound to overcome the oxygen inhibition).

Advantageously, in the processes/uses described above, at least one polymerizable component may be an acrylate or methacrylate, such as HPMA, TMPTA, 1,4-BDMA, aliphatic and aromatic diurethane dimethacrylates such as UDMA, or mixtures of two or more thereof; preferably mixtures of HPMA, 1,4-BDDMA and aliphatic and aromatic diurethane dimethacrylates such as UDMA; most preferably a 1:1:1 mixture by weight of HPMA, 1,4-BDMA and UDMA.

It is to be understood that all the variants described above, notably for the various components for the photoinduced thermal-initiating compositions according to the invention are applicable mutatis mutandis to this section, and will be understood to apply to the thermal amplification process/polymerization method/uses defined in this section. This includes all the variants described in the "Detailed Description of Certain Preferred Embodiments of the Invention" section of this document, including any one and all variants relating to the a) heat-generating dye, b) thermal initiator, c) polymerizable component, and all the variants described herein relating to the oxidizing agent, reducing agent, oxygen scavenger (for dual red-NIR thermal/photochemical free radical polymerization). In addition, all the variants described below relating to the irradiation light source described below in the present document are applicable mutatis mutandis to this section.

Articles and Composites

In yet another aspect, the invention relates to an article obtained by a thermal amplification process according to the present invention, as described generally and in any variants herein.

In yet another aspect, the invention relates to a polymer obtained by a thermal amplification process according to the present invention, as described generally and in any variants herein.

In yet another aspect, the invention relates to a composite material obtained by a thermal amplification process according to the present invention, as described generally and in any variants herein. Advantageously, the thermal amplification process may occur as part of a dual red-NIR-initiated thermal and photochemical polymerization process according to the present invention.

Likewise, for each of the above three aspects, the variants described above, notably for the various components for the photoinduced thermal-initiating compositions according to the invention are applicable mutatis mutandis to this section, and will be understood to apply to the articles/composites materials defined in this section. This includes all the variants described in the "Detailed Description of Certain Preferred Embodiments of the Invention" section of this document, including any one and all variants relating to the a) heat-generating dye, b) thermal initiator, c) polymerizable component, and all the variants described herein relating to the oxidizing agent, reducing agent, oxygen scavenger (for dual red-NIR thermal/photochemical free radical polymerization). In addition, all the variants described below relating to the irradiation light source described below in the present document are applicable mutatis mutandis to this section.

Advantageously, the methods/processes according to the invention can generally be carried out using conventional methods of preparing the above described polymers according to the present invention in a suitable mixing device such as, but not limited to, stirred tanks, dissolvers, homogenizers, microfluidizers, extruders, or other equipment conventionally used in the field.

When the polymerization method of the invention is used in the preparation of composites and/or laminated articles, the process may further comprise a step of adding a material/reinforcement designed for this purpose using known methods. Advantageously, the polymerization method further comprises a step of impregnating composite reinforcements with a mixture of the red-NIR photoinduced thermal-initiating composition and at least one polymerizable component according to the invention, in a mold, such as a silicone mold, prior to the application of light source.

Advantageously, the composite reinforcements may be any reinforcing conventionally used in the manufacture and implementation of composite materials. For example, the composite reinforcements may be selected from:

- Glass fibers
- Carbon fibers
- Aramid fibers (Kevlar®)
- Basalt fibers
- Silica fibers
- Silicon carbide fibers
- Polymer fibers
- Vegetal fibers (hemp, flax . . . )
- Mineral, metallic or organic fillers (for example gravel, sand, glass beads, carbonate powder, alumina hydrate powder, steel powder, aluminum powder, polymer particles, titanium oxide, alumina, etc. . . . )

Advantageously, the composite reinforcements may be selected from glass fibers, carbon fibers, aramid fibers, basalt fibers, silica fibers, polymer fibers (such as polyesters, poly (p-phenylene-2,6-benzobisoxazole), aliphatic and aromatic polyamides, polyethylene, polymethyl methacrylate, polytetrafluoroethylene), natural fibers (such as nettle, flax or hemp fibers) . . . .

Advantageously, the composite reinforcements may be previously disposed in a mold, and then impregnated by a mixture of the red-NIR photoinduced thermal-initiating composition and the at least one polymerizable component according to the invention (step(i)), before application of light radiation (step (ii)).

Alternatively, composite reinforcements may be pre-impregnated with a mixture of the photo-initiating composition and the at least one polymerizable component according to the invention. Then the resulting mixture may be deposited/spread evenly over the mold, either manually or using an automated robot, in the case of mass production.

The process may further include a step of adding any other additive conventionally used in the field of resins, composite materials and applications. Examples of suitable additives include:

- pigments, such as colored pigments, fluorescent pigments, electrically conductive pigments, magnetically shielding pigments, metal powders, scratch-proofing pigments, organic dyes or mixtures thereof;
- light stabilizers such as benzotriazoles or oxalanilides;
- crosslinking catalysts such as dibutyltin dilaurate or lithium decanoate;
- slip additives;
- defoamers;
- emulsifiers, especially nonionic emulsifiers such as alkoxylated alkanols and polyols, phenols and alkylphenols or anionic emulsifiers, such as alkali metal salts or ammonium salts of alkanecarboxylic acids, alkanesulfonic acids, alkanol sulfonic acids or alkoxylated polyols, phenols or alkyl phenols;
- wetting agents such as siloxanes, fluorinated compounds, carboxylic monoesters, phosphoric esters, polyacrylic acids or their copolymers, polyurethanes or acrylate copolymers, which are commercially available under the trademark MODAFLOW® or DISPERLON®;
- adhesion promoters such as tricyclodecan-dimethanol;
- leveling agents;
- film-forming adjuvants such as cellulose derivatives;
- flame retardants;
- sag control agents such as ureas, modified ureas and/or silicas,
- rheology control additives such as those described in patent documents WO 94/22968 [3], EP0276501A1 [4], EP0249201A1 [5], and WO 97/12945 [6];
- crosslinked polymeric microparticles, as described for example in EP0008127A1 [7];
- inorganic phyllosilicates such as aluminum magnesium silicate, magnesium sodium silicates or magnesium fluoride sodium lithium phyllosilicates of montmorillonite type;
- silicas such as Aerosils® silicas;
- flatting agents such as magnesium stearate; and/or
- tackifiers.

Mixtures of at least two of these additives are also suitable in the context of the invention.

As used herein, the term "tackifier" refers to polymers which increase the tack properties, that is to say, the intrinsic viscosity or self-adhesion, the compositions so that, after a slight pressure a short period, they adhere firmly to surfaces.

Irradiation Light Source

For purposes of the present invention, any light source known in the art, capable of generating light in the 625-2500 nm region, for example in the range of 625-1500 nm, may be used. For example, light emitted from LED bulbs, laser, laser diode, low pressure mercury and argon lamps, fluorescent light systems, electric arc-light sources, high intensity light sources may be used. Advantageously, the light source may generate light in the red region of the light spectrum (i.e., 625-750 nm). For example, light sources that may be used to that effect include LED bulb, laser, laser diode, fluorescent light system, electric arc light source, high intensity (metal halide 3000K, high pressure sodium lamp), Xenon light, Mercury-Xenon light. Advantageously, the light source may generate light in the near-infrared region of the light spectrum (i.e., 700-2500 nm, for example 700-1500 nm). For example, light sources that may be used to that effect include NIR LEDs, NIR lasers, low pressure mercury and argon lamps (696-1704 nm) Tungsten light source, tungsten halogen light source, Nd:Yag laser, Nd:$YVO_4$, Nd:$CidVO_4$, Nd:$LuVO_4$, $CO_2$ laser, the intensity of which (especially for the most powerful irradiation light source systems such as lasers (e.g., Nd:Yag lasers)) may be tuned down to the desired intensity $<10$ W/cm$^2$ for purposes of carrying out the present invention.

An important advantage of the invention is that photopolymerization can be effected under long wavelength irradiation conditions (i.e., less energetic and safer than UV-type irradiation for example).

Another important advantage include the potentiality of having a tunable heat released: by changing the concentration of the dye, the power of the light delivered, the polymerizable component used or the dye, the temperature of the system (and ultimately the control of the polymerization rate) can readily be modulated. This is a stark advantage over existing processes. The present invention therefore provides much better control of the temperature within the composition to be polymerized, and thus much better control of the polymerization process (and quality of the product obtained). Notably, the temperature can be controlled by the choice of heat-generating dye, the red to near-infrared irradiation intensity and/or the amount of fillers used (for composite materials).

Advantageously, the light source may be preferably selected as a function of the heat-generating dye to be used: most advantageously, the light source may be one that emits light in the wavelength range where the dye most readily absorbs the light to generate an exotherm, which thermally initiates the polymerization process. The heat-generating profiles of dyes known to absorb in the red or near infrared range of the light spectrum are known or can be readily determined by running an exotherm vs. wavelength graph using thermal imaging (cf. FIG. 32).

Briefly, the heat-generating potential of a red-NIR dye may be determined using an infrared thermal imaging camera, such as (Fluke TiX500) with a thermal resolution of about 1° C. and a spatial resolution of 1.31 mRad by recording the heat released by the red-NIR dye in the resin (polymerizable component) under exposition to the suitable irradiation is described in detail in [23].

As will be readily apparent throughout the teachings of the present document, if a particular dye generates low/moderate heat at a given wavelength, one may still proceed with that particular dye at the same given wavelength by increasing the intensity of the light irradiation. This may be done by using a tunable power light source for example, such as commercially available tunable power red to near-infrared light sources.

| Dye | RED or NIR Absorbance range |
|---|---|
| IR 140 | 600-900 nm |
| IR 780 | >670 nm |
| Indocyanine Green | 600-900 nm |
| IR 813 | >670 nm |
| S 2265 | 600-850 nm |
| S 0991 | >650 nm |
| Mn—Ph | 600-800 nm |
| Dithiolene Nickel 1 | >750 nm |
| Chlorophyllin copper sodium salt | 550-700 nm |
| IR1048 | 700-1100 nm |

For illustration purposes, if IR 780 is used as heat-generating dye, a NIR laser@785 nm may be used.

As discussed above, it is understood that the light source may be a tunable power light source; that is one that is equipped with tunable power, so as be able to adjust the power of the red to near infrared light irradiation, if needed. Such tunable power light source may also be used to determine the light intensity threshold at which a particular dye starts to absorb at any given wavelength, and therefore to fine-tune the wavelength/irradiation intensity that may be used to obtain optimal conditions for polymerization.

Likewise, the absorbance profiles of dyes known to absorb in the red or near infrared range of the light spectrum are known or can be readily determined by running an absorbance vs. wavelength graph. As will be readily apparent throughout the teachings of the present document, if a particular dye exhibits low/moderate absorbance at a given wavelength, one may still proceed with that particular dye at the same given wavelength by increasing the intensity of the light irradiation. This may be done by using a tunable power light source for example, such as commercially available tunable power red to near-infrared light sources.

The combination of both techniques (heat-generation profile and absorbance profile) allows to identify/select dyes that may be suitable for carrying our dual red-NIR thermal/photochemical initiated free radical polymerization (selection of dyes that function both as heat-generator and photoredox electron donor upon exposure to a 625-2500 nm light source of intensity<10 W/cm$^2$).

Synthetic Methods

The practitioner has a well-established literature of synthetic organic and inorganic chemistry and polymer chemistry to draw upon, in combination with the information contained herein, for guidance on synthetic strategies, protecting groups, and other materials and methods useful for the synthesis of the photo-initiating compositions and polymers according to the present invention. For example, the reader may refer to the Exemplification section below, and references cited therein for synthetic approaches suitable for the preparation of some of the compositions and polymer materials described herein. The reader may refer for references to references [1] and [2], which relate to phthalocyanine dyes. These are often simple to synthesize with relatively high yields and have been used as commercial pigments and dyes for decades.

The present invention finds application in a wide variety of fields, including adhesives (e.g., surgical glue), sealant (e.g., cement) and composite materials (e.g., with glass fibers).

The present invention offers many advantages, including:

The generation of free radicals under mild irradiation conditions (i.e., under an irradiation intensity of a few W/cm$^2$ or even in the mW/cm$^2$ range, in the near infrared region e.g., λ=625-2500 nm, for example under near infrared light range λ=700-2500 nm, in particular in the near infrared light range λ=700-1500 nm);

Very high photopolymerization conversions are obtained, even with very low % w/w of heat-generating dye (<0.50% w/w dye, even only ≤0.10% w/w dye is enough for efficient polymerization;

The process is safer than those using shorter wavelength photopolymerization processes, notably widely used UV-curing processes;

Red to Near-infrared wavelengths induce a deeper penetration of the light with the sample to be polymerized, thereby allowing better curing of filled samples. As shown in FIG. 9, the greater the wavelength: the less the light is diffused by the charges in the material. Thus, the curing of filled materials with RED-NIR source is enhanced compared to curing with UV or visible light; This allows polymerization of much thicker samples/polymeric materials than conventional UV-induced or visible light-induced photopolymerization;

Dual thermally induced and photoinduced free radical polymerization is rendered possible, by simple use of additives (e.g., phosphines as reducing agent and iodonium salt as oxidizing agent).

Cost efficiency (the process can be carried out at room temperature and under milder light irradiation than conventional UV-based of visible light-induced photoinitiator systems;

Environmentally friendly (no solvent necessary);

Possibility of applications in the medical field or paramedical field, notably due to the use of Red to near-infrared wavelengths (much safer than UV wavelengths). Existing laser sources in the dermatologic field may be used for that purpose.

Other advantages may also emerge to those skilled in the art upon reading the examples below, with reference to the attached figures, which are provided as non-limiting illustrations.

EQUIVALENTS

The representative examples that follow are intended to help illustrate the invention, and are not intended to, nor should they be construed to, limit the scope of the invention. Indeed, various modifications of the invention and many further embodiments thereof, in addition to those shown and described herein, will become apparent to those skilled in the art from the full contents of this document, including the examples which follow and the references to the scientific and patent literature cited herein. It should further be appreciated that the contents of those cited references are incorporated herein by reference to help illustrate the state of the art.

The following examples contain important additional information, exemplification and guidance that can be adapted to the practice of this invention in its various embodiments and the equivalents thereof.

EXEMPLIFICATION

The polymer materials and compositions of this invention and their preparation can be understood further by the examples that illustrate some of the processes by which these polymer materials and compositions are prepared or used. It will be appreciated, however, that these examples do not limit the invention. Variations of the invention, now known or further developed, are considered to fall within the scope of the present invention as described herein and as hereinafter claimed.

Summary:

In the Examples that follow is illustrated the use of a two-component system with a near-infrared (NIR) heat-generating dye combined with a thermal initiator for thermal amplification of free radical polymerization of methacrylates. The dye acts as a heat generator (heater) upon irradiation with NIR light. Several thermal initiators are illustrated such as an alkoxyamine (e.g. BlocBuilder-MA), azo derivatives and (hydro) peroxides. The heat delivered by the dye dissociates the thermal initiator which initiates the free radical polymerization of (meth)acrylates. Several types of heat generator dyes are illustrated such as borate based dyes and a silicon phthalocyanine derivative. For the first time, the effects of the NIR heater concentration, light intensity and polymerizable component structure on the heat released are investigated using thermal imaging studies.

Materials and Methods

All reagents and solvents for the synthesis of IR-140 borate, IR-780 borate and IR-813 borate (Scheme 1) were purchased from Aldrich or Alfa Aesar and used as received without further purification. 5,5'-Dichloro-11-(diphenylamino)-3,3'-diethyl-10,12-ethylene-thiatricarbocyanine perchlorate (IR140), 2-[2-[2-Chloro-3-[(1,3-dihydro-3,3-dimethyl-1-propyl-2H-indol-2-ylidene)ethylidene]-1-cyclohexen-1-yl]ethenyl]-3,3-dimethyl-1-propylindolium iodide (IR-780) and 2-[2-[2-Chloro-3-[2-(1,3-dihydro-1,1,3-trimethyl-2H-benzo[e]-indol-2-ylidene)-ethylidene]-1-cyclohexen-1-yl]-ethenyl]-1,1,3-trimethyl-1H-benzo[e]indolium p-toluene sulfonate (IR-813) were purchased from Aldrich. Mass spectroscopy was performed by the Spectropole of Aix-Marseille University. ESI mass spectral analyses were recorded with a 3200 QTRAP (Applied Biosystems SCIEX) mass spectrometer. The HRMS mass spectral analysis was performed with a QStar Elite (Applied Biosystems SCIEX) mass spectrometer. Elemental analyses were recorded with a Thermo Finnigan EA 1112 elemental analysis apparatus driven by the Eager 300 software. $^{1}H$ and $^{13}C$ NMR spectra were determined at room temperature in 5 mm o.d. tubes on a Bruker Advance 400 spectrometer of the Spectropole: $^{1}H$ (400 MHz) and $^{13}C$ (100 MHz). The $^{1}H$ chemical shifts were referenced to the solvent peak $CDCl_3$ (7.26 ppm), DMSO (2.49 ppm) and the $^{13}C$ chemical shifts were referenced to the solvent peak $CDCl_3$ (77 ppm), DMSO (49.5 ppm). Lithium triphenylbutylborate was synthesized as previously reported in the literature, without modifications and obtained in similar yields. [24] The soft salt was synthesized as previously reported in the literature, by using a biphasic mixture of $CHCl_3$/water and THF to act as a phase transfer agent. The soft salt (the organic salt) was recovered in the organic phase, the inorganic one in the aqueous phase. [11]

Example 1—Free Radical Polymerization of Methacrylates Using Heat-Generating Dyes a) Synthesis of Exemplary NIR Borate-Dyes Lithium triphenylbutylborate (0.770 mmol, 1.2 eq.) in water (20 mL) was added to a solution of IR-140 or IR-780 or IR-813 (0.642 mmol, 1 eq.) in a mixture of $CHCl_3$ (100 mL) and THF (20 mL). The solution was stirred at room temperature while being protected from light for 1 hour and then set aside for 10 minutes. THF was removed under reduced pressure (still while protecting the solution from light) and the solution was transferred in a separating funnel (covered with aluminum foil). The organic phase was separated, dried over magnesium sulfate and the solvent removed under reduced pressure. Addition of THF (2 mL) followed by pentane precipitated a solid that was filtered off, washed several times with pentane and dried under vacuum. HRMS (ESI MS) m/z: theor: 679.7428 found: 679.7426 (M+ detected); HRMS (ESI MS) m/z: theor: 299.2375 found: 299.2377 (M− detected); Anal. Calc. for $C_{61}H_{58}BCl_2N_3S_2$: C, 74.8; H, 6.0; N, 4.3 Found: C, 74.6, H, 6.1; N, 4.4%).

Scheme 1. Exemplary synthetic pathway of NIR borate dyes

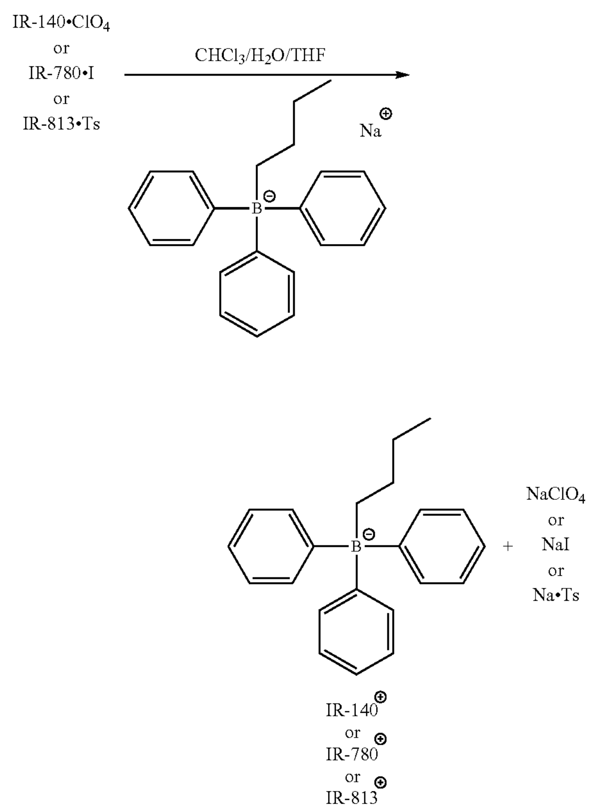

-continued with

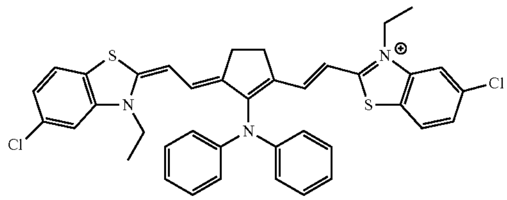

IR-140⊕

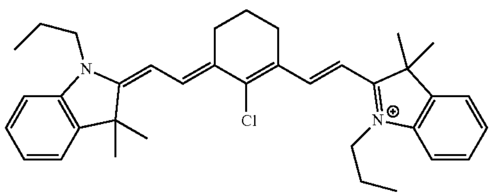

IR-780⊕

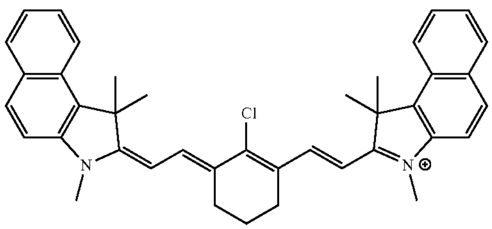

IR-813⊕ b) NIR Heat-Generating Dyes (Commercial and Non-Commercial).

Indocyanine Green, IR-140 perchlorate, IR-780 iodide and IR-813 p-toluenesulfonate (Scheme 2) were purchased from Sigma-Aldrich. S0507, S2544, S0991 and S2025 (Scheme 2) were obtained from Few Chemicals. Camphorquinone (CQ) and ethyldimethylaminobenzoate (EDB), used as reference two component CQ/EDB photoinitiating system upon blue light, were purchased from Sigma Aldrich with the highest purity available.

Scheme 2. Structures of other exemplary NIR dyes

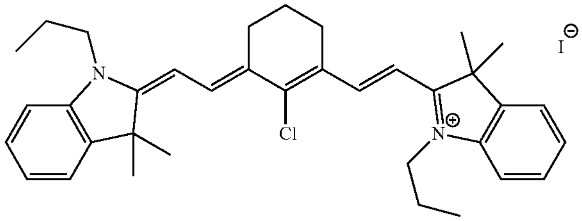

IR-780 iodide

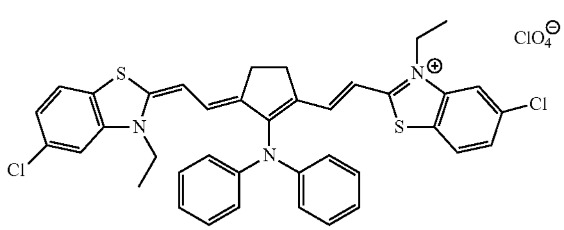

IR-140 perchlorate

-continued

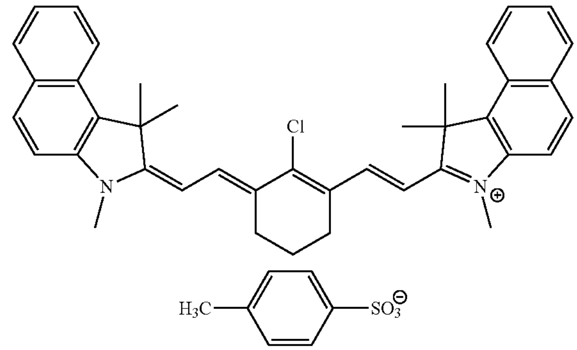

IR-813 p-toluenesulfonate

S0507

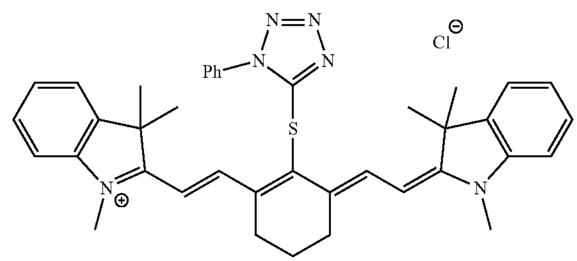

S2025

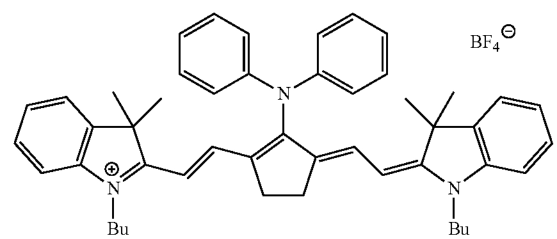

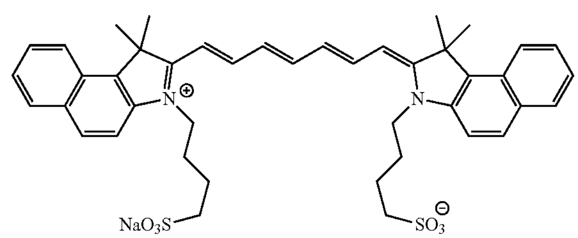

Indocyanine Green

S 0991

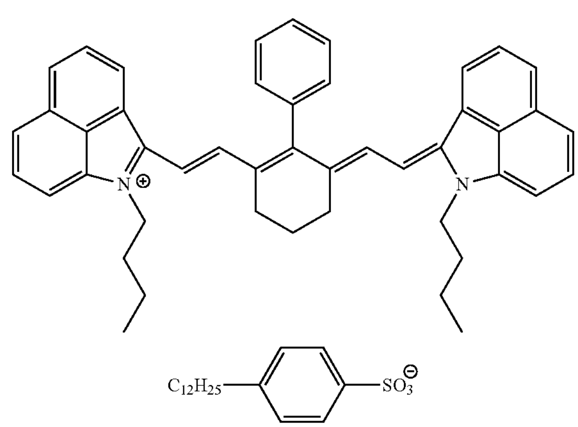

c) Exemplary Thermal Free Radical Initiators

Luperox P, Luperox 331M80, dicumylperoxide, ammonium persulfate, 1,1'-azobis(cyclohexane-carbonitrile), tert-butylperoxide and cumene hydroperoxide (Scheme 3) were obtained from Sigma Aldrich. Peroxan (50 wt % of BPO (Scheme 3) on 50 wt % dicyclohexyl phthalate) and BlocBuilder® MA were also studied.

Scheme 3. Chemical structures of exemplary thermal free radical initiators

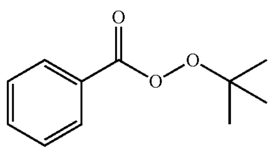

Luperox P

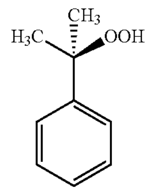

Cumene hydroperoxide

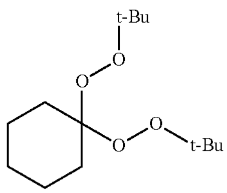

Luperox 331M80

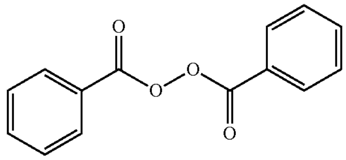

Benzoyl peroxide

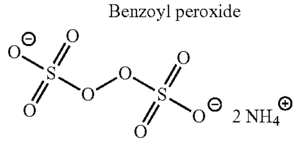

Ammonium persulfate

-continued

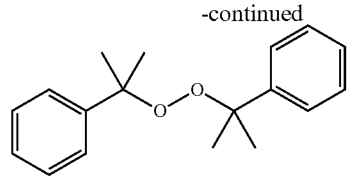

dicumylperoxide

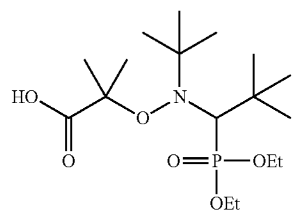

BlocBuilder MA

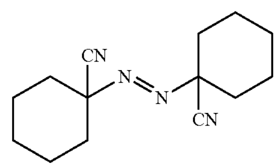

1,1′Azobis(cyclohexanecarbonitrile)

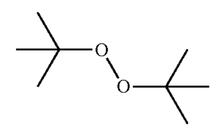

Tert-butylperoxide d) Exemplary Polymerizable Components

"Mix-MA" has been used as a benchmarked resin (mixture of polymerizable components (scheme 4) consisting of 33.3 wt % of (hydroxypropyl)methacrylate (HPMA), 33.3 wt % of 1,4-butanediol dimethacrylate (1,4-BDDMA) and 33.3 wt % of a urethane dimethacrylate monomer (UDMA)) and was obtained from Sigma Aldrich. Trimethylolpropane triacrylate (TMPTA) was obtained from Allnex (Scheme 4).

Scheme 4. Chemical structures of exemplary polymerizable components

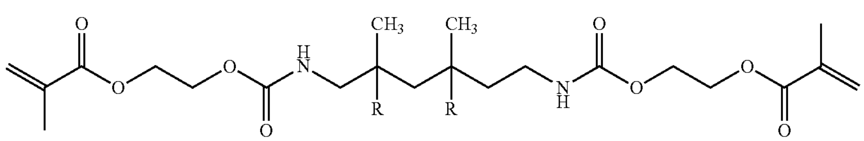

R = H or $CH_3$(~1:1) 33 wt %

UDMA

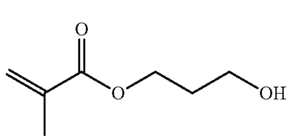

HPMA 33 wt %

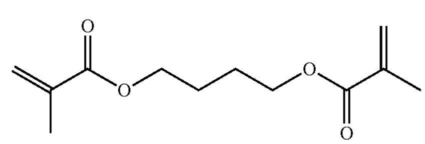

1,4-BDMA 33 wt %

Mix-MA

-continued

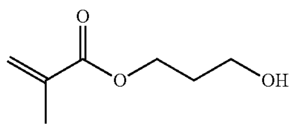

HPMA

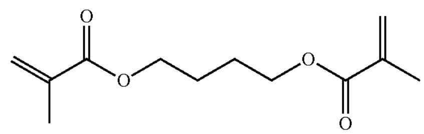

1,4-BDMA

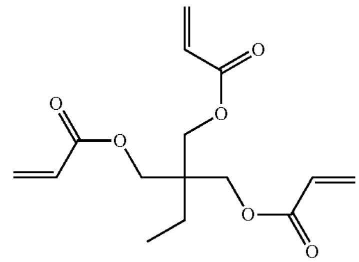

TMPTA e) Exemplary Additives and Fillers 4-(diphenylphosphino)benzoic acid (4-dppba, Scheme 5) was purchased from Sigma-Aldrich. The iodonium salt bis(4-tert-butylphenyl)iodonium hexafluorophosphate ($Ar_2I^+/PF_6^-$ or also Speedcure 938) was obtained from Lambson Ltd (Scheme 5). Fillers used in the present Example are silica beads of 400 nm of diameters.

Scheme 5. Chemical structures of exemplary additives.

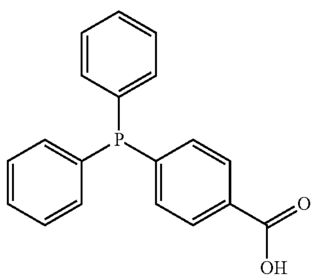

4-dppba

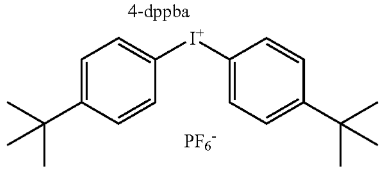

$Ar_2I^+$ $PF_6^-$ f) Exemplary Irradiation Sources

Several types of irradiation sources were used: NIR LED@850 nm (with an irradiance of 1 W/cm$^2$) from Thor-Labs and a NIR laser diode@785 nm with selectable irradiance (ranging from 0 W to 2.55 W/cm$^2$) from Changchun New Industries (CNI).

g) Real Time Conversion Measurements Upon NIR Light Irradiation

The double bond C═C conversion was followed by Real Time Fourier Transformation Infrared (RT-FTIR) spectroscopy using a JASCO 4600. The photosensitive formulations were deposited on a polypropylene film in a mold (thickness of the sample=1.4 mm) and polymerized under air by irradiation with LED or laser diode. The peak followed is at 6100-6220 cm$^{-1}$ (FIG. 10). More details about the conditions of photopolymerization experiments are given in the figures legends. The procedure has been described in detail in ref [14, 15].

h) Thermal Imaging Experiments

Thermal imaging experiments were recorded with an infrared thermal imaging camera (Fluke TiX500) with a thermal resolution of about 1° C. and a spatial resolution of 1.31 mRad. The temperature propagation over 1 cm of the sample was recorded and thermal images were extracted using a Fluke SmartView4.1.

The procedure is described in detail in [23].

i) Photolysis Experiments

The photolysis of IR-780 borate under irradiation by laser diode@785 nm (400 mW/cm$^2$ or 2.55 W/cm$^2$) was quantified by UV-vis measurements using a Varian Cary 3 spectrophotometer. Two different solutions were prepared: IR-780 borate alone ($5.10^{-6}$ mol/L, ε=180 000 L mol$^{-1}$ cm$^{-1}$, in acetonitrile (ACN, Sigma Aldrich) and IR-780 borate and BlocBuilder-MA (Conc. BlocBuilder-MA=$10^{-2}$ mol/L, ACN).

In all the Examples, polymerization experiments were carried out in bulk (no solvent used).

Example 1.1. Low Intensity NIR Light Irradiation and 0.1 wt % of NIR-Dye

IR-780 borate dye was investigated to initiate the free radical polymerization of methacrylates upon irradiation by a laser diode at 785 nm (400 mW/cm$^2$). The system used was a two-component system containing the dye IR-780 borate (as a light-to-heat converter noted heater; 0.1 wt %) and BlocBuilder-MA (2 wt %). Remarkably, this system gave a high polymerization rate under exposure to the NIR light (FIG. 11). Without one of the two components (IR-780 borate or BlocBuilder-MA), the polymerization is not possible. The polymerization efficiency of the different control experiments is outlined in Table 1.

TABLE 1

Polymerization results of Mix-MA under air in the presence of different initiating systems under exposure to laser diode@785 nm (400 mW/cm$^2$) during 500 s; thickness = 1.4 mm: (+) efficient polymerization or (−) no polymerization observed.

| System | Irradiance on the surface of the sample (W/cm$^2$) | Polymerization |
|---|---|---|
| Polymerizable component (Mix-MA) alone | 0.4 | − |
| IR-780 borate | 0.4 | − |
| BlocBuilder MA | 0.4 | − |
| IR-780 borate/BlocBuilder MA | 0.4 | + |

Example 1.2. Effect of NIR Light Intensity

The NIR laser diode used in Example 1 has a tunable irradiance from 0 to 2.55 W/cm$^2$. The impact of the laser diode power on the maximum temperature reached by the system has been measured with IR780-borate alone (0.1 wt %) in Mix-MA (FIG. 12). No polymerization occurred without thermal initiator and no heating was observed without IR780-borate, showing that the heat released is not ascribed to polymerization but to the ability of the NIR dye to convert light to heat (heat-generating behavior). Remarkably, through incremental increases of the irradiance on the surface of the sample, the maximal temperature reached by the system also increased. The obtained maximal temperature was 45° C. using 400 mW/cm$^2$ and over 140° C. under 2.55 W/cm$^2$.

It was observed that the temperature reached by the sample after 100 seconds of irradiation at 785 nm was linearly correlated to the irradiance on the surface of the sample (FIG. 13). This demonstrates that it is possible to modulate the maximum temperature reached by the sample, depending on the application required. This characteristic is important when tuning the system temperature and when selecting thermal free radical initiators with different thermal decomposition temperatures.

Example 1.3. Investigation of Additional Thermal Initiators

As evidenced above, it was observed that BlocBuilder-MA was an efficient thermal initiator for the system. The dissociation temperatures of all thermal initiators [8] investigated in this Example are summarized in Table 2. For example, at 400 mW/cm$^2$, polymerization was only observed with BlocBuilder-MA. For greater laser intensity, polymerization was also observed when using other thermal initiator such as 1,1'-Azobis(cyclohexanecarbonitrile), Cumene hydroperoxide, Luperox 331M80 and Luperox P (FIG. 14). Moreover, with these thermal initiators, a bleaching of the dye was observed during polymerization in line with the formation of an alkylated cyanine that has no color [9] (see below). This is a great advantage because thicker samples can be polymerized in such conditions as the internal filter effect decreases.

TABLE 2

Dissociation temperatures of thermal initiators from ref [8].

| Thermal initiators | Dissociation temperature (° C.) |
|---|---|
| Ammonium Persulfate | 120° C. |
| Luperox P | 100-130° C. |
| Cumene hydroperoxide | 115° C. |
| BPO | 80° C. |
| BlocBuilder-MA | 60° C. |
| 1,1'-Azobis(cyclo-hexane-carbonitrile) | 80° C. |
| Luperox 331M80 | 120° C. |
| Dicumylperoxide | 110° C. |
| Tert-butyl peroxide | 115° C. |

Example 1.4, Influence of the NIR Dye Concentration

It was demonstrated that greater dye concentration lead to greater maximum temperature and ultimately faster polymerization. When reducing the concentration of IR-780 borate to below 0.01 wt %, we found this to hold true (FIG. 15). However, the maximum temperature of roughly 110° C. is already reached for concentrations as low as 0.01 wt % (FIG. 15) showing that for an efficient NIR dye heater only a very low content is required. This property is useful to reduce the overall cost of this new proposed approach to photothermal polymerization.

This maximum temperature indicates that the decomposition of labile free radical initiator such as BlocBuilder-MA is still possible at low dye loading and low irradiation intensity. The IR-780/BlocBuilder (0.01 wt %/2 wt %) system successfully polymerized a methacrylate monomer mixture (Mix-MA) @785 nm and 400 mW/cm$^2$ and the conversion was followed by RT-FTIR (FIG. 16). With lower concentrations of IR-780 borate, the polymerization still took place but the polymerization rate was lower. Nevertheless, the final conversion of C═C was still around 80% with only 0.01 wt % of IR-780 borate, which demonstrates how powerful the system of the invention is.

Polymerizations with even lower amounts of IR-780 borate were attempted. Using only 0.001 wt % of IR-780 borate, higher light intensities (2.55 W/cm$^2$) at 785 nm are required for the polymerization. This is again very interesting because the NIR dye may be one of the most expensive (if not the most expensive) component of the formulation. Being able to go at very low % w/w heat-generating dye concentrations means that less expensive formulations can be used (=>less costly process) by merely using much more powerful laser diodes.

Example 1.5. Influence of the Polymerizable Component

All previous measurements were carried out with the benchmarked resin Mix-MA. The temperature for formulations containing 0.1 wt % IR-780 borate dye has also been measured in other polymerizable components: (hydroxypropyl)methacrylate (HPMA), urethane dimethacrylate monomer (UDMA) and trimethylolpropane triacrylate (TMPTA), and was compared to the temperature reached when Mix-MA is used as polymerizable component (FIG. 17).

Each polymerizable component has a different viscosity (from the less viscous to the most viscous: HPMA<TMPTA<Mix-MA<UDMA). FIG. 17 clearly shows that as the viscosity of the polymerizable component increases, the greater the temperature was reached upon light irradiation (laser diode@785 nm at 2.55 W/cm$^2$). By increasing the viscosity of the polymerizable component, the heat dissipation ability by the system (reaction mixture) is decreased, which leads to greater temperatures observed in the samples.

Example 2—In-Depth Polymerization of Thick Samples—Composite Materials

The polymerization of composites by photopolymerization is usually very difficult due to the low penetration of the light in the sample especially for the UV light. Indeed, the strong diffusion of the UV light by the fillers strongly reduces the light penetration and therefore the potential depth of cure.

In this Example, different types of fillers were tested: silica, glass fibers and carbon fibers. NIR light offered a good penetration in the samples and especially in the presence of fillers. Using the two-component initiating systems, the polymerization has been successful (final methacrylate functions conversion between 50 and 60% in formulations with loading of silica beads from 25 wt % to 75 wt %). Tack-free, 1.9 cm thick films containing up to 50 wt % of fillers have been successfully polymerized using NIR light (FIG. 18; sample 1).

As a comparison, when using visible light camphorquinone/EDB as a reference system (scheme 6) at 470 nm [10], a maximum thickness of 6 mm was obtained (FIG. 18; sample noted Ref). This comparative example evidences that the method of the present invention provides access to greater film thicknesses. This comes in stark contrast to samples that are photopolymerized in the UV range, for which the maximal thickness that can be polymerized is roughly 100 μm.

Scheme 6. Chemical structures of the photoinitiators for the reference system

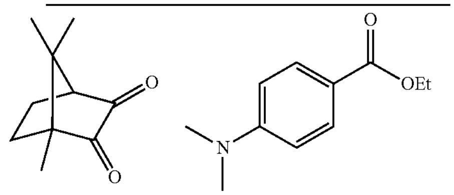

Camphorquinone EDB

Example 3—Dual NIR Thermal/Photochemical Free Radical Polymerization

In the Examples that precede, it was shown that polymerization using a two-component system (NIR heat-generating dye/thermal initiator) was already very efficient upon irradiation at 785 nm (400 mW/cm$^2$) using a laser diode. The final methacrylate conversion was roughly 60-70% for multifunctional monomers.

As the cyanine used in the Examples that precede can also function as photoredox electron donor at 785 nm (400 mW/cm$^2$), dual NIR thermal/photochemical polymerization was tested by adding an iodonium salt ($Ar_2I^+PF_6^-$) to the reaction mixture prior to irradiation. Interestingly, the presence of iodonium salt decreases the inhibition time ascribed to the oxygen inhibition i.e. the lag times are 300 s and 150 s using IR-780 borate/BlocBuilder MA (FIG. 19, curve 1) and IR-780 borate/BlocBuilder MA/$Ar_2I^+PF_6^-$ (FIG. 19, curve 2) respectively. This is in agreement with the ability of iodonium salts to react with the excited states of photoredox electron donor dyes to generate additional initiating radicals (i.e. "pure photochemical free radical polymerization" mentioned in the present document). [12]

These polymerizations were also performed under air even though the methacrylates are sensitive to oxygen. Initiating and propagating radicals and oxygen react, leading to the creation of peroxyl radicals (Scheme 7). These radicals are too stable to initiate the polymerization leading to an oxygen inhibition for the FRP process. Phosphines, such as 4-(Diphenylphosphino)benzoic acid (4-dppba) react with the formed peroxyl radicals to generate alkoxyl radicals (RO.) that are able to initiate the polymerization. [10, 12]

An additional round of tests was carried out, with the addition of 4-dppba to the reaction mixture (in addition to the iodonium salt). The presence of the phosphine did not increase the final conversions but lead to much better results in term of polymerization rates (FIG. 19 curve 3). These results demonstrate that the combination of photothermal process according to the present invention (NIR heat-generating dye/thermal initiator) with pure photochemical initiation (NIR absorbing electron donor dye/4dppba/$Ar_2I^+PF_6^-$) can improve the global performance.

Scheme 7. Mechanisms of free radical scavenging by $O_2$ and conversion of stable peroxyls (ROO•) to initiating alkoxyl (RO•) using phosphine.

$$R^\bullet + O_2 \longrightarrow ROO^\bullet$$

$$ROO^\bullet + R'_3P \longrightarrow ROO{-}RP'^\bullet_3$$

$$ROO{-}RP'^\bullet_3 \longrightarrow RO^\bullet + R'_3P{=}O$$

Example 4—Steady State Photolysis Experiments

Steady state photolysis experiments of IR-780 borate alone, IR-780 iodide alone, IR-780 borate/BlocBuilder-MA and IR-780 iodide/BlocBuilder-MA at 785 nm (2.55 W/cm$^2$; FIG. 20; condition detailed in the Figure legend) show that i) the degradation of the dye is somewhat slow even under such a high light intensity, ii) there is no apparent influence of the counter-ion in IR-780 borate and IR-780 iodide alone (FIG. 21, curves 2,3), iii) an acceleration of the degradation in the presence of BlocBuilder-MA occurs (likely through a redox process) (FIG. 21, curve 1 vs. curve 2) and iv) in that case, an effect of the anion (the more electron donating borate allows an electronic rearrangement between the cyanine and the anion; FIG. 21, curves 1, 4).

Heat is released by the dye and the temperature of the polymerizable component is high enough to dissociate the thermal free radical initiator (see again the decomposition temperatures in Table 2). The thermal initiator decomposition leads to the generation of free radicals (via homolytic cleavage) which are able to initiate the polymerization (Scheme 8).

Scheme 8. Proposed chemical mechanisms for the photoinitiated thermal polymerization according to the present invention

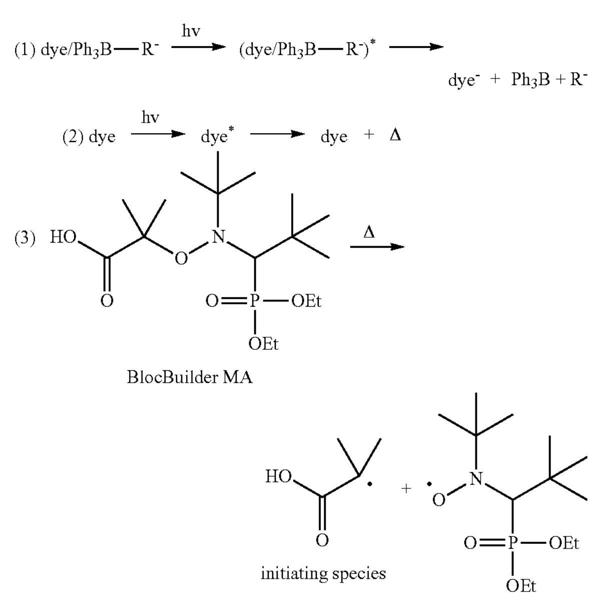

The temperature of the polymerizable component in the presence of a thermal initiator (2 wt %) under no irradiation and when irradiated at 785 nm and 2.55 W/cm$^2$ were measured, and released no heat (FIG. 22). Thus, this confirms that no polymerization is possible in the absence of the NIR dye used as a heat-generator.

Example 5—Photoinitiation Ability with Other Exemplary NIR Dyes Used as Heat-Generator 5.1. Effect of Structure on Photoinitiation at 785 nm A wide range of commercially available dyes (whose absorption properties are summarized in Table 3) have been characterized as potential NIR dyes (irradiation at 785 nm; 400 mW/cm$^2$). Mention may be made of: S0507, S2025, IR-140 (with a counter-ion borate), IR-813 (borate counter-ion), Indocyanine Green. Under 2.55 W/cm$^2$ irradiation, these selected dyes all generated temperatures above 100° C. (FIG. 23) demonstrating their ability to thermally initiate the polymerization and to emphasize their role of conversion of light to heat (heat-generator behavior). The same experiment has also been carried out under 2.55 W/cm$^2$ (FIG. 24). Thus, all these dyes are effective heat-generating dye useable in the context of the present invention.

TABLE 3

Absorption properties of different NIR heat-generator dyes.

| Dye | IR780 borate | IR 813 borate | IR 140 borate | S2025 | S0507 | Indocyanine Green |
|---|---|---|---|---|---|---|
| ε (785 nm) L/mol · cm | 181860 | 24790 | 110860 | 195800 | 186080 | 11270 |
| T° C. after 30 sec | 79 | 83 | 71 | 78 | 76 | 80 |
| T° C. after 100 sec | 128 | 133 | 116 | 133 | 136 | 135 |
| T° C. after 200 sec | 145 | 146 | 129 | 143 | 143 | 145 |

Examples of photopolymerization profiles under air upon exposure to the 785 nm laser (400 mW/cm$^2$) are displayed in FIG. 25. IR-780 borate still appears as the most efficient NIR dye under these conditions.

5.2. Influence of the Counter-Ion

Two dyes with two different counter-ions were compared: IR-780 iodide/IR-780 borate and IR-813 p-toluenesulfonate/IR-813 borate (FIG. 26). In both cases, it was observed that the borate-based dye was better. A first advantage of the borate as a counter-ion has already been mentioned supra: it helps the discoloration of the dye by alkylation of the cyanine. A second advantage of the use of a borate counter-ion is that the solubility of the dye in the polymerizable component is enhanced. Moreover, as the borate ion is an electron donating component, the reaction with BlocBuilder-MA seems to be enhanced (as already mentioned above).

5.3. Photothermal Initiation Abilities at 850 nm

As the penetration of light is better when the wavelength increases, systems operating at greater wavelengths than 785 nm were tested. Examples are provided in Table 4 for the polymerization Mix-MA under air in the presence of different NIR heat-generating dyes upon exposure to LED@850 nm (1 W/cm$^2$). Not only cyanine are good heat-generating dyes for polymerization at this wavelength but also squarylium dyes such as S2425 (obtained from Few Chemicals) or Dithiolene Nickel (referred to herein as Ni1 or Ni2, synthesized such as described in the literature in [16, 17]) show good polymerization profiles. Chemical structures of these dyes are represented below:

Ni1

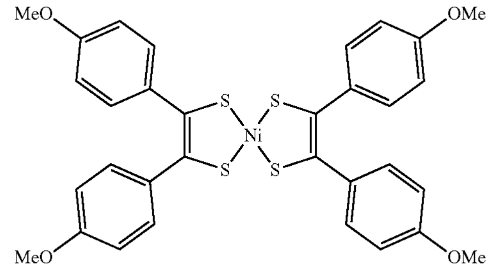

Ni2

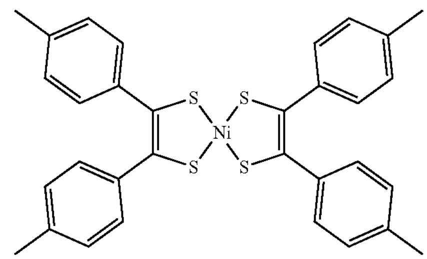

S0507

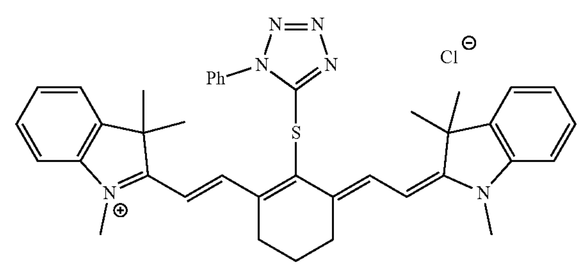

S 2544

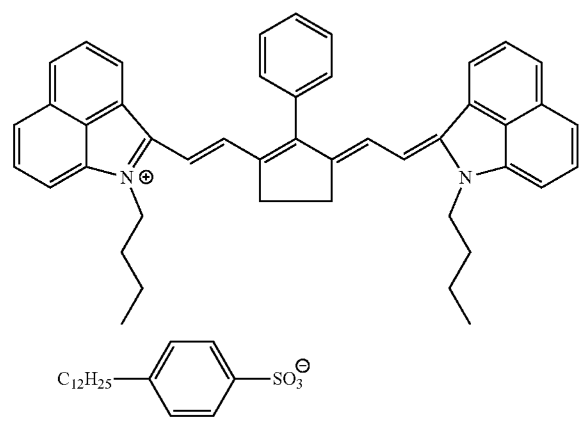

S2425

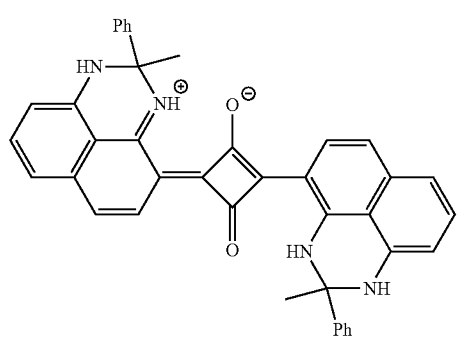

TABLE 4

Polymerization performance of Mix-MA under air in the presence of different NIR dye (0.1 w %) and Blocbuilder MA (2 w %) upon exposure to LED@850 nm (1 $W/cm^2$) during 500 s; thickness = 1.4 mm; (+) some polymerization observed, (++) strong polymerization observed. The conversion of C═C is measured by RT-FTIR.

| Dye | Polymerization | Conversion |
|---|---|---|
| IR-780 borate | ++ | 69% |
| IR-140 borate | + | 5% |
| IR-813 borate | ++ | 74% |
| Indocyanine Green | ++ | 69% |
| S2544 | ++ | 69% |
| S2425 | ++ | 59% |
| Ni1 | ++ | 66% |
| Ni2 | ++ | 70% |

Example 6

Photothermal free radical polymerization experiments were carried out under air with a variety of dyes using Mix-MA as polymerizable component with a laser diode@

785 nm, 400 $mW/cm^2$, thickness=1.4 mm; 800 s irradiation;

940 nm, 2 $W/cm^2$, thickness=1.4 mm.; 800 s irradiation; and a LED@850 nm, 1 $W/cm^2$, thickness=1.4 mm, 300 s irradiation.

Nature and amounts of the starting materials are detailed in the Table below:

| | Photothermal mode |
|---|---|
| Polymerizable component | Mix-MA |
| Dye | 0.1 wt % |
| Thermal initiator | BlocBuilder MA, 2 w % |
| Iodonium salt | — |
| Phosphine reducing agent | — |

Mix-MA: mixture of 33 wt % of (hydroxypropyl)methacrylate (HPMA), 33 wt % of 1,4-butanediol dimethacrylate (1,4-BDDMA) and 33 wt % of a urethane dimethacrylate monomer (UDMA).

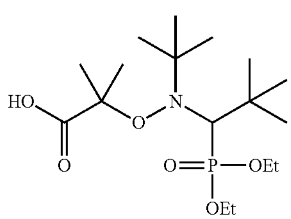

BlocBuilder MA

In exemplary embodiments, free radical polymerization of Mix-Ma was effected in the pure photothermal mode according to the invention, using a variety of heat-generating dyes at different wavelengths in the Red-NIR range. The results are reported below, and are further illustrated in FIG. 27-29. Structures of the dyes are depicted in FIG. 1-8.

| Dye family | Dye | Photothermal FRP @785 nm* | Photothermal FRP @850 nm** | Photothermal FRP @940 nm* |
|---|---|---|---|---|
| Cyanine | IR-780 borate | 75% TF: ++ | 69% | 5% |
| | IR-1601 | Not mesured | Not mesured | 77% TF: ++ |
| | S2025 | 73% TF: + | 65% | 30% |
| | S2544 | 70% | 65% | 66% TF: +++ |
| Squaraine & Squarylium | S2425 | 81% TF: ++ | 59% | 65% TF: ++ |
| | SQ-1 | 2% | Not mesured | 30% |
| Push-pull compounds | PP-1 | 0% | 2% | 30% |
| Dithiolene metal salt | Ni-1 | Not mesured | Not mesured | 73% TF: +++ |
| | Ni-2 | Not mesured | Not mesured | 70% TF: +++ |
| Porphyrine | ClSc | 62% TF: + | Not mesured | Not mesured |
| Copper complexes | Cu3 | 60% TF: + | Not mesured | Not mesured |
| | Cu4 | 72% TF: + | Not mesured | Not mesured |
| Phthalocyanine | Mn(II)-Ph | 53% TF: + | Not mesured | Not mesured |

TF: Tack-free character (+fair, ++good, +++excellent)
FRP: Free radical polymerization

Example 7

Dual photothermal/photochemical polymerization experiments according to the invention were carried out under air with a variety of dyes using Mix-MA as polymerizable component and 1,1' azo bis (cyclohexanecarbonitrile) as thermal initiator in combination with an iodonium salt, under various irradiation conditions:

a) laser diode@785 nm, 400 $mW/cm^2$, 800 s irradiation;

b) laser diode@940 nm, 2 $W/cm^2$, 800 s irradiation; and c) a LED@850 nm, 1 $W/cm^2$, 300 s irradiation.

All experiments were carried out with a sample thickness=1.4 mm.

Nature and amounts of the starting materials are detailed in the Table below:

| | Dual photothermal/photochemical |
|---|---|
| Polymerizable component | Mix-MA |
| Dye | 0.1 wt % |

-continued

| | Dual photothermal/photochemical |
|---|---|
| Thermal initiator | 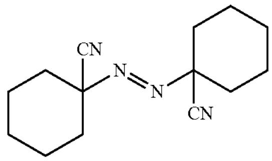 1,1′Azobis(cyclohexanecarbonitrile) 2 w % |
| Iodonium salt | Bis-(4-tert-butylphenyl)-Iodonium hexafluorophosphate ($Ar_2I^+/PF_6^-$, also designated Speedcure 938 ®), 3 w % |
| Phosphine reducing agent | 4-(diphenylphosphino)benzoic acid (4-dppba), 2 w % |

As such, free radical polymerization of Mix-Ma was effected in the dual photothermal/photochemical mode according to the invention, using a variety of heat-generating dyes at different wavelengths in the Red-NIR range. The results are reported below, and are further illustrated in FIG. 30-31. Structures of the dyes are depicted in FIG. 1-8.

| Dye family | Dye | Dual photothermal/ photochemical FRP @785 nm* | Dual photothermal/ photochemical FRP @850 nm** | Dual photothermal/ photochemical FRP @940 nm* |
|---|---|---|---|---|
| Cyanine | IR-780 borate | 90% TF: ++ | 80% | 54% |
| | IR-1601 | 15% | 90% | 70% TF: + |
| | S2025 | 89% TF: +++ | 94% | 30% |
| | S2544 | 80% | 86% | 67% TF: +++ |
| Squaraine & Squarylium | S2425 | 85% TF: +++ | 78% | 68% TF: +++ |
| | SQ-1 | 70% TF: +++ | 85% | 86% TF: +++ |
| | SQ-2 | 36% | 7% | 85% TF:+++ |
| | SQ-3 | 8% | 17% | 75% TF: ++ |
| Push-pull compounds | PP-1 | 89 % TF: +++ | 93% | 63% TF: ++ |
| | PP-2 | 15% | 85% | 86% TF: ++ |
| BODIPY | BODIPY-1 | 87% TF: +++ | 84% | 86% TF: +++ |

TF: Tack-free character (+fair, ++good, +++excellent)
FRP: Free radical polymerization As evidenced in the Table above, in some cases, it was observed that the dual mode (dual photothermal/photochemical free radical polymerization) leads to a marked improvement in polymerization efficacy (% conversion), as compared to the pure photothermal mode. This unexpected synergistic effect can be advantageously used to perfect/improve free radical polymerization performance, notably for difficult samples (e.g., thick samples, and/or opaque samples (i.e., with a fair amount of charges)), and/or to boost the effect of the Red-NIR dye on the polymerization result when its heat-generating properties at the given light irradiation wavelength and intensity are insufficient to support alone (i.e., pure photothermal process) a satisfactory polymerization rate and/or % conversion.

CONCLUSIONS

The Examples that preceded illustrate the efficacy of a two-component NIR photo-initiating composition according to the invention (heat-generating dye+thermal initiator) in free radical thermal polymerization, for example for NIR curing of (meth)acrylate monomers. The reaction using NIR light (at 785 nm, 850 nm and 940 nm irradiation) was successfully initiated by several types of dyes including a silicon phthalocyanine, borate cyanine, squarylium dye and dithiolene complex. The systems successfully polymerized at very low light intensity (400 mW).

The use of red-NIR dyes in dual photothermal/photochemical polymerization processes was also demonstrated: free radical thermal polymerization and photochemical polymerization, when an iodonium salt optionally with a phosphine-type reducing agent/oxygen scavenger were used as additives in the reaction mixture.

The Examples further illustrate the potentiality of having a tunable heat released: by changing the concentration of the dye, the power of the light delivered, the polymerizable component used or the dye, the temperature of the system (and ultimately the control of the polymerization rate) can readily be modulated.

While we have described a number of embodiments of this invention, it is apparent that the Examples may be altered to provide other embodiments that utilize the compositions and methods of this invention. Therefore, it will be appreciated that the scope of this invention is to be defined by the appended claims rather than by the specific embodiments that have been represented herein by way of example.

REFERENCES

[1] Dahlen, M. A. The Phthalocyanines A New Class of Synthetic Pigments and Dyes. Ind. Eng. Chem. 1939, 31 (7), 839-847 DOI: 10.1021/ie50355a012
[2] Torre, G. de la; Claessens, C. G.; Torres, T. Phthalocyanines: Old Dyes, New Materials. Putting Color in Nanotechnology. Chem. Commun. 2007, 0 (20), 2000-2015 DOI: 10.1039/B614234F.
[3] WO 94/22968
[4] EP0276501A1
[5] EP0249201A1
[6] WO 97/12945
[7] EP0008127A1
[8] Moad, G.; Solomon, D. H. *The Chemistry of Free Radical Polymerization*, Second Edition.; Eds.; Elsevier Science Ltd: Amsterdam, 2005.

[9] Gibson, I.; Rosen, D. W.; Stucker, B. *Photopolymerization Processes*; Springer US: Boston, Mass., 2010.

[10] J. P Fouassier, J. Lalevée, *Photoinitiators for polymer synthesis: scope, reactivity and efficiency*. Weinheim: Wiley-VCH.; 2012.

[11] Berezin, M. Y. *Nanotechnology for Biomedical Imaging and Diagnostics: From Nanoparticle Design to Clinical Applications*; John Wiley & Sons, 2014.

[12] A. H. Bonardi, F. Dumur, T. M. Grant, G. Noirbent, D. Gigmes, B. H. Lessard, J.-P. Fouassier, J. Lalevée, High Performance Near-Infrared (NIR) Photoinitiating Systems Operating under Low Light Intensity and in the Presence of Oxygen, Macromolecules, 2018, 51(4), 1314-1324.

[13] Lessard, B. H.; Grant, T. M.; White, R.; Thibau, E.; Lu, Z.-H.; Bender, T. P. The Position and Frequency of Fluorine Atoms Changes the Electron Donor/Acceptor Properties of Fluorophenoxy Silicon Phthalocyanines within Organic Photovoltaic Devices. *Journal of Materials Chemistry A* 2015, 3 (48), 24512-24524 DOI: 10.1039/C5TA07173A.

[14] Lalevée, J.; Blanchard, N.; Tehfe, M.-A.; Peter, M.; Morlet-Savary, F.; Gigmes, D.; Fouassier, J. P. Efficient Dual Radical/Cationic Photoinitiator under Visible Light: A New Concept. *Polymer Chemistry* 2011, 2 (9), 1986 DOI: 10.1039/c1py00140j.

[15] Lalevée, J.; Blanchard, N.; Tehfe, M.-A.; Peter, M.; Morlet-Savary, F.; Fouassier, J. P. A Novel Photopolymerization Initiating System Based on an Iridium Complex Photocatalyst. *Macromol. Rapid Commun.* 2011, 32 (12), 917-920 DOI: 10.1002/marc.201100098.

[16] Miao, Q.; Gao, J.; Wang, Z.; Yu, H.; Luo, Y.; Ma, T. Syntheses and Characterization of Several Nickel Bis (dithiolene) Complexes with Strong and Broad Near-IR Absorption. *Inorganica Chimica Acta* 2011, 376 (1), 619-627 DOI: 10.1016/j.ica.2011.07.046.

[17] Garreau-de Bonneval, B.; Moineau-Chane Ching, K. I.; Alary, F.; Bui, T.-T.; Valade, L. Neutral d8 Metal Bis-Dithiolene Complexes: Synthesis, Electronic Properties and Applications. *Coordination Chemistry Reviews* 2010, 254 (13-14), 1457-1467 DOI: 10.1016/j.ccr.2010.02.019.

[18] IUPAC. Compendium of Chemical Terminology, 2nd ed. (the "Gold Book").

[19] a) Ajayaghosh, A. Chemistry of Squaraine-Derived Materials: Near-IR Dyes, Low Band Gap Systems, and b) Cation Sensors. *Acc. Chem. Res.* 2005, 38, 449-459.

[20] Bures, F. Fundamental aspects of property tuning in push-pull molecules. *RSC Adv.* 2014, 4, 58826-58851.

[21] Alfred Treibs und Franz-Heinrich Kreuzer. Difluorboryl-Komplexe von Di-und Tripyrrylmethenen. Justus Liebigs Annalen der Chemie 1968, 718 (1): 208-223; BODIPY Dye Series Archived 2008 Feb. 26 at the Wayback Machine.

[22] K. L. Marshall, G. Painter, K. Lotito, A. G. Noto & P. Chang (2006) Transition Metal Dithiolene Near-IR Dyes and Their Applications in Liquid Crystal Devices, Molecular Crystals and Liquid Crystals, 454:1, 47/[449]-79/[481].

[23] Garra, P., Bonardi, A., Baralle, A., Al Mousawi, A., Bonardi, F., Dietlin, C., Morlet-Savary, F., Fouassier, J. and Lalevée, J., Monitoring photopolymerization reactions through thermal imaging: A unique tool for the real-time follow-up of thick samples, 3D printing, and composites. J. Polym. Sci. Part A: Polym. Chem., 2018, 56: 889-899.

[24] Hu, S.; Sarker, A. M.; Kaneko, Y.; Neckers, D. C. Reactivities of Chromophore-Containing Methyl Tri-N-Butylammonium Organoborate Salts as Free Radical Photoinitiators: Dependence on the Chromophore and Borate Counterion. *Macromolecules* 1998, 31 (19), 6476-6480 DOI: 10.1021/ma980616x

The invention claimed is:

1. A composition thermally curable on demand under the triggering action of red to near-infrared light-emitting diode (LED) irradiation of intensity<10 W/cm$^2$ comprising:

(a) <0.50 w/w of the total weight of the composition of at least one heat-generating dye that generates heat when exposed to red to near-infrared LED irradiation of intensity<10 W/cm$^2$;

(b) at least one thermal initiator; and (c) at least one polymerizable component comprising a C═C bond polymerizable by free radical polymerization;

wherein the at least one thermal initiator undergoes homolytic cleavage to generate two free radicals upon exposure to heat generated in the composition, without electron transfer from the dye.

2. The composition according to claim 1, wherein the at least one polymerizable component is selected from monomers, prepolymers, dimers, trimers or oligomers containing at least one C═C bond that is conjugated with an aryl moiety, a carboxyl group, or another double bond.

3. The composition according to claim 1, wherein the at least one heat-generating dye is selected from

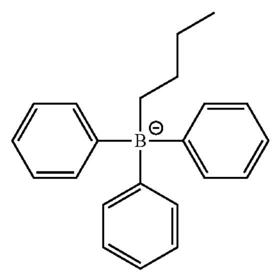

IR-140⊕ or

IR-780⊕ or

IR-813⊕ with

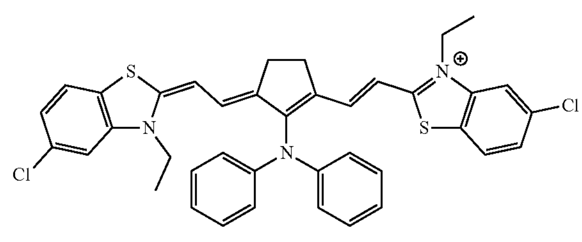

IR-140⊕

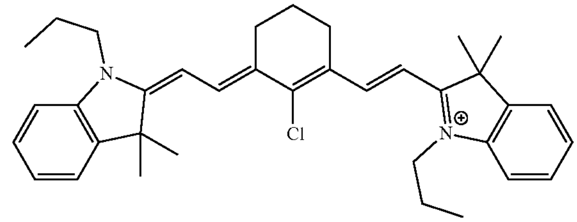

IR-780⊕

-continued

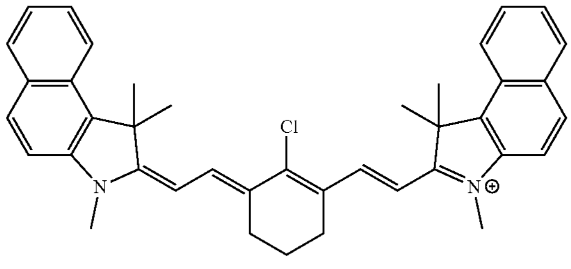

IR-813⊕

4. The composition according to claim 1, wherein the at least one thermal initiator is selected from:

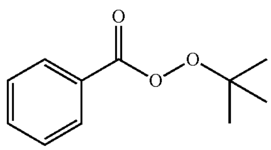

Luperox P

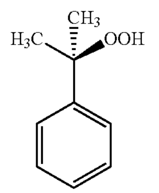

Cumene hydroperoxide

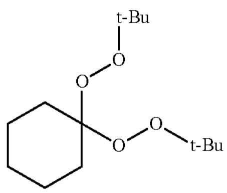

Luperox 331M80

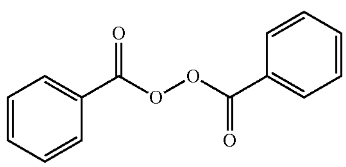

Benzoyl peroxide

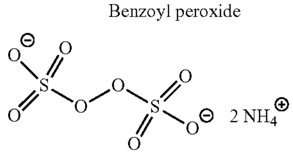

Ammonium persulfate

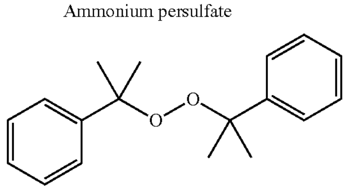

dicumylperoxide

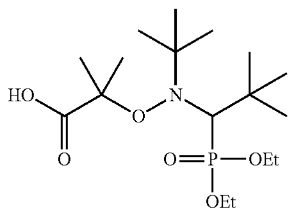

BlocBuilder MA

-continued

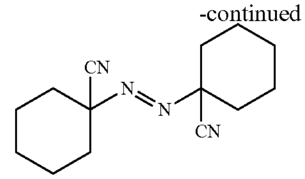

1,1′Azobis(cyclohexanecarbonitrile)

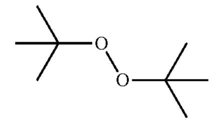

Tert-butylperoxide

5. A composition dually curable photochemically and thermally on demand under the triggering action of red to near-infrared light-emitting diode (LED) irradiation of intensity<10 W/cm$^2$ comprising:

(a) <0.50 w/w of the total weight of the composition, of at least one heat-generating dye that generates heat and is additionally an electron donor when exposed to red to near-infrared LED irradiation of intensity<10 W/cm$^2$;

(b) at least one thermal initiator;

(c) at least one polymerizable component comprising a C═C bond polymerizable by free radical polymerization;

(d) an onium salt, and optionally:

(e) a reducing agent suitable for regenerating the dye; and/or an oxygen scavenger;

wherein the at least one thermal initiator undergoes homolytic cleavage to generate two free radicals upon exposure to the heat generated in the composition, without accepting an electron from the dye.

6. The composition according to claim 5, wherein the onium salt is of formula $((R_A)_2I^+X_A^-$ or $(R_A)_3S^+X_A^-$; wherein each occurrence of $R_A$ independently represents a $C_{6-10}$ aryl or a $C_{1-10}$ alkyl moiety; wherein the aryl moiety is optionally, individually, further substituted with one or more linear or branched $C_{1-6}$ alkyl or $C_{6-10}$ aryl moieties; and wherein $X_A^-$ represents a counter ion.

7. The composition according to claim 5, wherein the onium salt is:

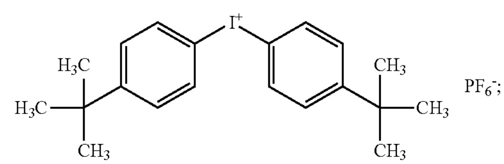

$Ar_2I/PF_6^-$

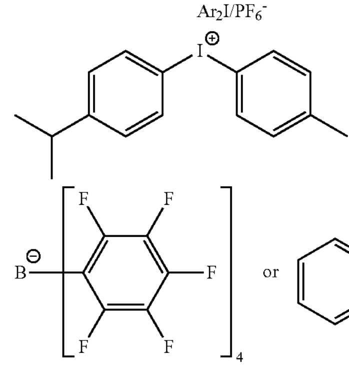

or

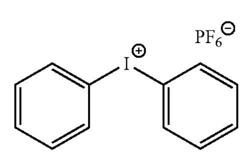

8. The composition according to claim 5, wherein the reducing agent c) and the oxygen scavenger d) are one and the same compound.

9. The composition according to claim 5, wherein the reducing agent is selected from:

4-(diphenylphosphino)benzoic acid (4-dppba), 2-diphenylphosphinobenzoic acid (2-dppba), bis(2-diphenylphosphinophenyl)-ether (2-dppe), triomethoxyphenylphosphine (triompp), DPBP bidentate phosphine (DPBP), 4-dimethylaminophenyldiphenylphosphine (4-dmapdp), (R,R) dach phenyl trost (trost), and triphenylphosphine (tpp)); and Ethyl 4-dimethylaminobenzoate (EDB), 4-(dimethylamino)phenylacetic acid (ADP), triphenylamine (TPA), N,N-dibutylaniline (DBA), N-Ethyl-N-isopropylaniline (EIPA), and 3-(dimethylamino)benzyl alcohol (3-dmaba).

10. A process for preparing an article by thermal amplification of free radical polymerization comprising the step of exposing to red to near-infrared radiation of intensity<10 W/cm$^2$ a composition comprising at least one polymerizable component comprising a C═C bond polymerizable by free radical polymerization, in the presence of:

<0.50 w/w of at least one heat-generating dye that generates heat when exposed to red to near-infrared LED irradiation of intensity<10 W/cm$^2$, and at least one thermal initiator selected from peroxides, hydroperoxides, alkoxyamines, and azo compounds.

11. The process according to claim 10, wherein at least one polymerizable component is an acrylate or methacrylate selected from HPMA, TMPTA, 1,4-BDMA, aliphatic, or an aromatic diurethane dimethacrylates that is UDMA, or mixtures thereof.

12. The process according to claim 10, further comprising a step of mixing or impregnating composite reinforcements with said composition prior to red to near-infrared LED irradiation.

13. The process according to claim 12, wherein the composite reinforcements are glass fibers, carbon fibers, aramid fibers, basalt fibers, silica fibers, polymer fibers, natural fibers, or a mixture thereof.

14. The process according to claim 10, wherein cross-linking/curing of the composition occurs throughout the whole thickness of the composition.

15. The process according to claim 10, carried out in the presence of oxygen.

16. An article obtained by a thermal amplification process according to claim 10.

17. The composition according to claim 1, at least one thermal initiator is selected from peroxides, hydroperoxides, alkoxyamines, and azo compounds.

18. The composition according to claim 2, wherein the at least one polymerizable component is selected from acrylic acid, methacrylic acid, itaconic acid, crotonic acid, isocrotonic acid, maleic acid, and esters and amides thereof; styrene, ethylene, propylene, N-vinyl acrylamide, and N-vinylpyrolidone.

19. The composition according to claim 2, wherein the at least one polymerizable component is selected from acrylates and methacrylates selected from HPMA, TMPTA, 1,4-BDMA; UDMA; and mixtures thereof.

20. A process for controlling the onset of thermal free radical polymerization of a composition comprising at least one polymerizable component comprising a C═C bond polymerizable by free radical polymerization, the process comprising exposing the composition to red to near-infrared radiation of intensity<10 W/cm$^2$ in the presence of <0.10% w/w of at least one heat-generating dye that generates heat when exposed to red to near-infrared LED irradiation of intensity<10 W/cm$^2$, in association with a thermal initiator selected from peroxides, hydroperoxides, alkoxyamines, and azo compounds, that generates a free radical upon exposure to the heat generated by the dye, without electron transfer from the dye.

21. The composition according to claim 1, wherein the at least one heat-generating dye is selected from any one or more of the following:

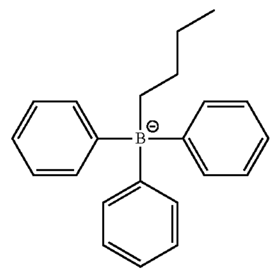

IR-140⊕
or
IR-780⊕
or
IR-813⊕ with

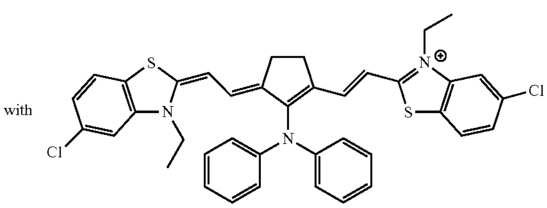

IR-140⊕

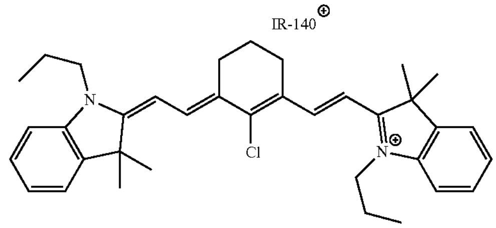

IR-780⊕

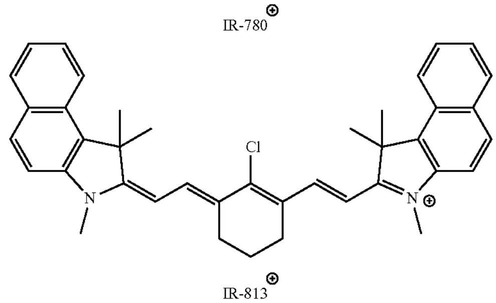

IR-813⊕

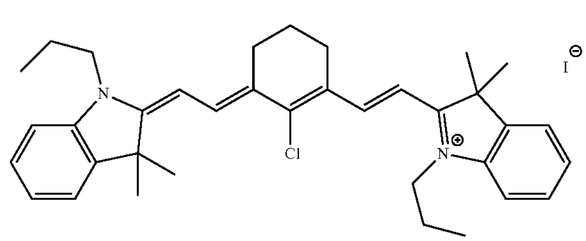

IR-780 iodide

-continued
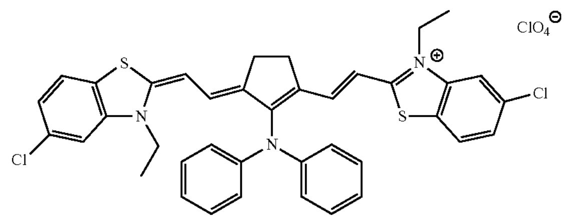
IR-140 perchlorate
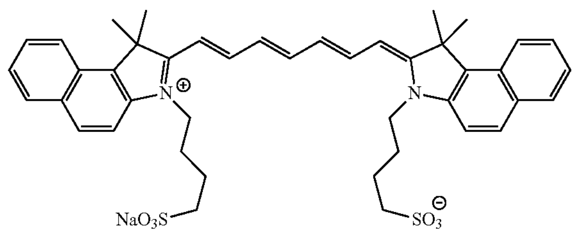
Indocyanine Green
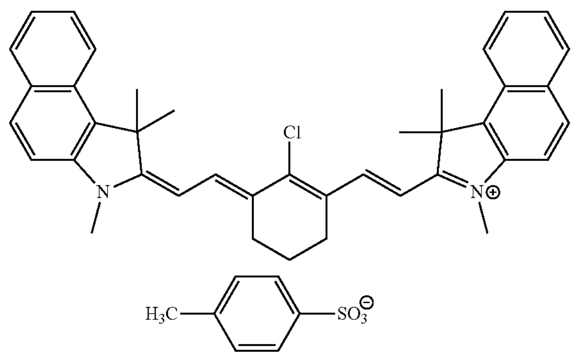
IR-813 p-toluenesulfonate
IR 783
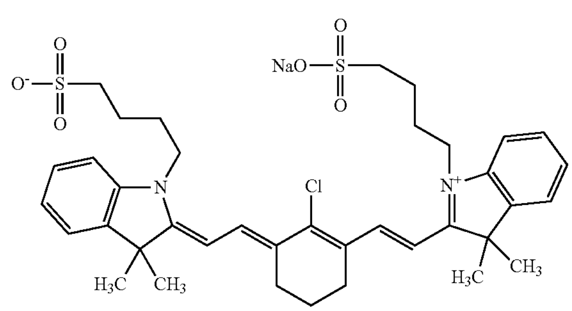
S0507
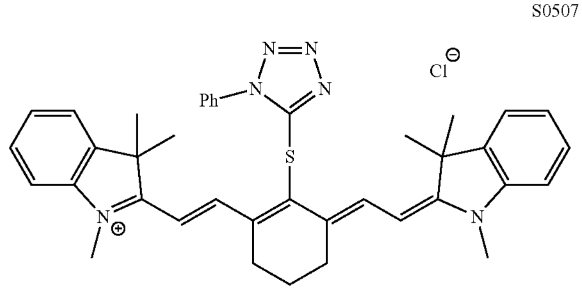
-continued
S2025
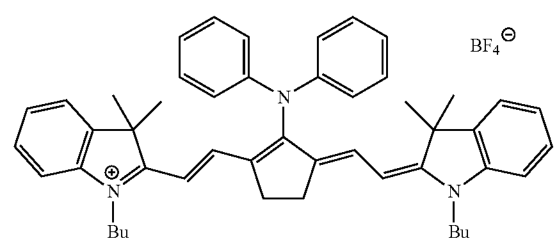
S0991
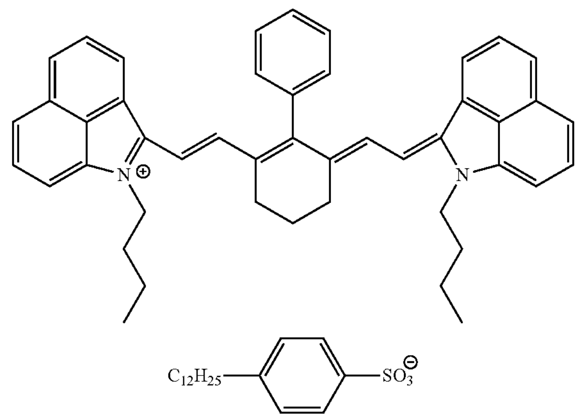
Ni1
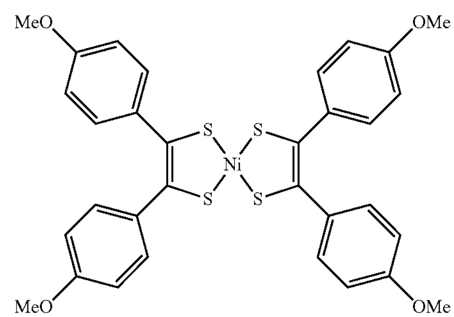
Ni2
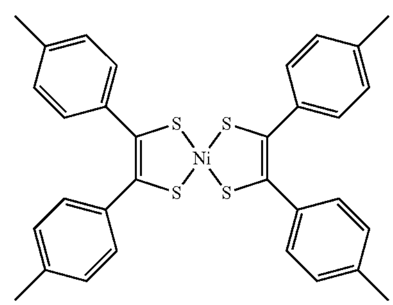
S0507
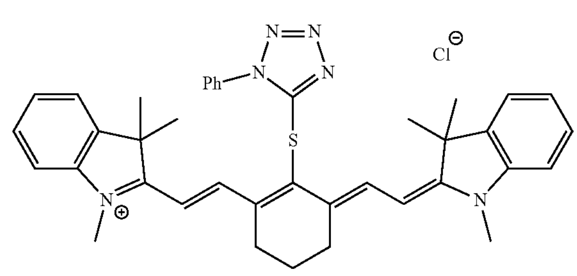

-continued
S2544
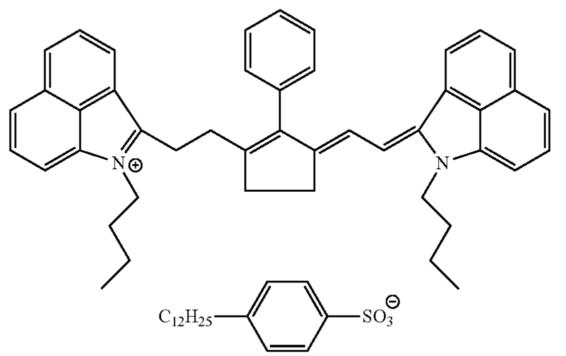
S2425
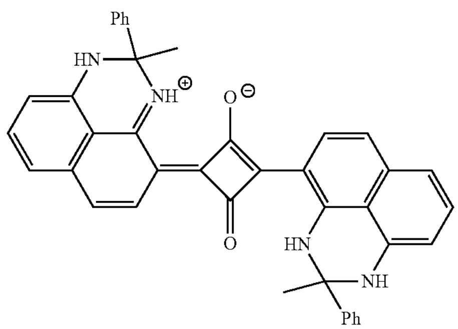
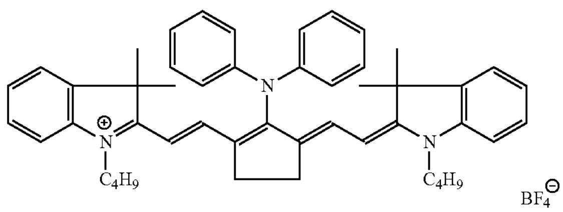
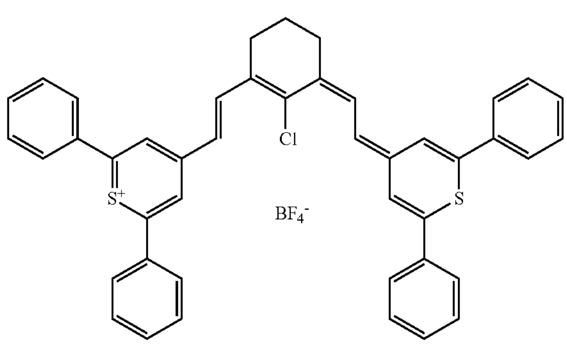
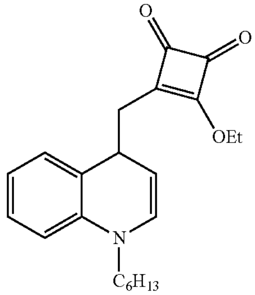
-continued
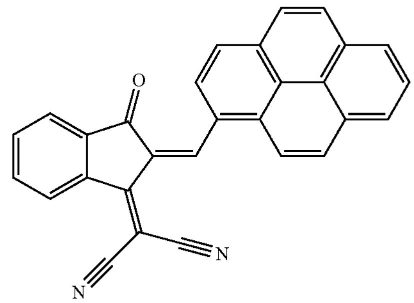
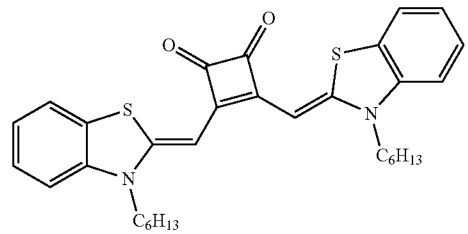
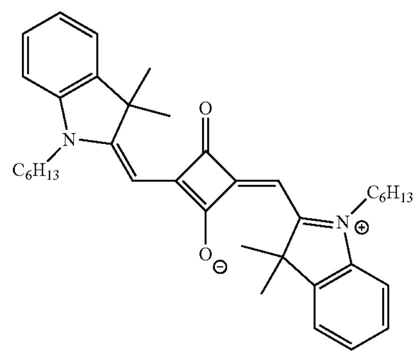
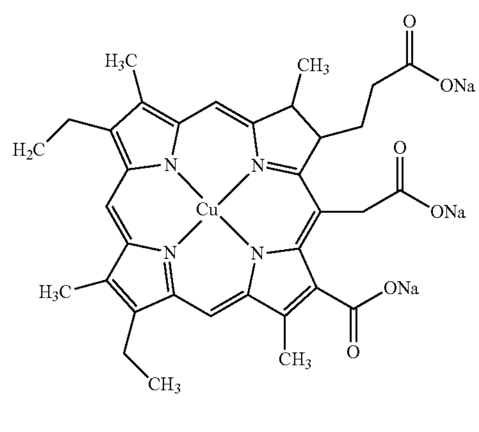
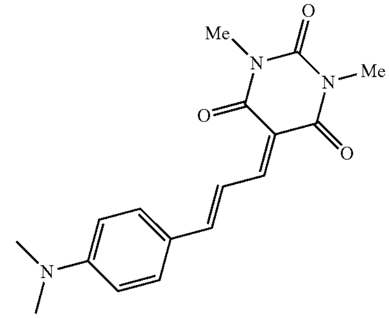

-continued
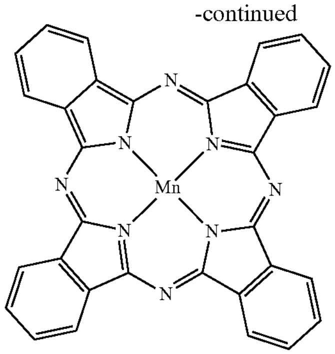
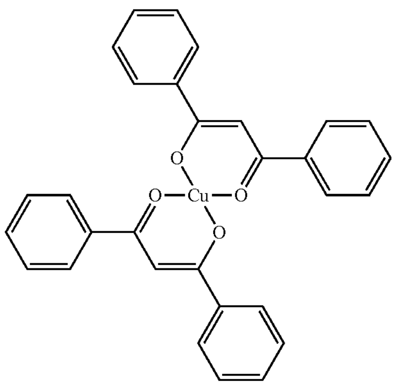
-continued
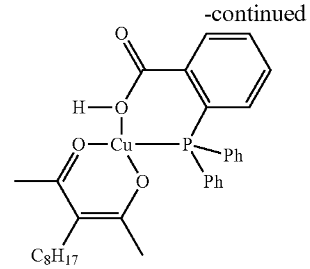
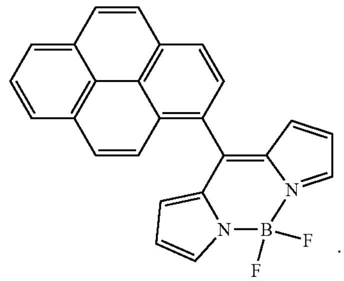
22. The process of claim 10, wherein the at least one thermal initiator is selected from alkoxyamines and azo compounds.
23. The process of claim 20, wherein at least one thermal initiator is selected from alkoxyamines, and azo compounds.
* * * * *